(12) United States Patent
Kim et al.

(10) Patent No.: US 8,524,560 B2
(45) Date of Patent: Sep. 3, 2013

(54) METHOD OF FABRICATING SEMICONDUCTOR DEVICE WITH VERTICAL CHANNEL TRANSISTOR

(71) Applicants: Daeik Kim, Yongin-si (KR);
HyeongSun Hong, Seongnam-si (KR);
Yoosang Hwang, Suwon-si (KR);
Hyun-Woo Chung, Seoul (KR)

(72) Inventors: Daeik Kim, Yongin-si (KR);
HyeongSun Hong, Seongnam-si (KR);
Yoosang Hwang, Suwon-si (KR);
Hyun-Woo Chung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/708,534

(22) Filed: Dec. 7, 2012

(65) Prior Publication Data

US 2013/0171783 A1    Jul. 4, 2013

Related U.S. Application Data

(62) Division of application No. 13/097,365, filed on Apr. 29, 2011, now Pat. No. 8,344,437.

(30) Foreign Application Priority Data

Oct. 8, 2010  (KR) ........................ 10-2010-0098120

(51) Int. Cl.
*H01L 21/336* (2006.01)
*H01L 21/44* (2006.01)

(52) U.S. Cl.
USPC ............ 438/270; 438/268; 438/294; 438/675

(58) Field of Classification Search
USPC .................................. 438/268, 270, 294, 675
See application file for complete search history.

(56) References Cited

U.S. PATENT DOCUMENTS

| | | | | |
|---|---|---|---|---|
| 5,907,170 | A * | 5/1999 | Forbes et al. ................. | 257/296 |
| 5,977,579 | A * | 11/1999 | Noble ........................... | 257/302 |
| 6,395,597 | B2 | 5/2002 | Noble | |
| 7,129,541 | B2 | 10/2006 | Kim et al. | |
| 7,489,003 | B2 | 2/2009 | Rhie | |
| 7,781,285 | B2 * | 8/2010 | Kim et al. ...................... | 438/242 |
| 2001/0010957 | A1 | 8/2001 | Forbes et al. | |
| 2002/0028541 | A1 | 3/2002 | Lee et al. | |

FOREIGN PATENT DOCUMENTS

| | | |
|---|---|---|
| JP | 2006-295180 | 10/2006 |
| KR | 10-2005-0028628 A | 3/2005 |
| KR | 10-0688576 B1 | 2/2007 |
| KR | 10-2009-0043999 A | 5/2009 |
| KR | 10-2009-0099400 A | 9/2009 |
| KR | 10-2009-0121475 A | 11/2009 |

\* cited by examiner

*Primary Examiner* — Luan C Thai
(74) *Attorney, Agent, or Firm* — Myers Bigel Sibley & Sajovec, P.A.

(57) ABSTRACT

A semiconductor memory device includes a semiconductor substrate, a semiconductor pillar extending from the semiconductor substrate, the semiconductor pillar comprising a first region, a second region, and a third region, the second region positioned between the first region and the third region, the third region positioned between the second region and the semiconductor substrate, immediately adjacent regions having different conductivity types, a first gate pattern disposed on the second region with a first insulating layer therebetween, and a second gate pattern disposed on the third region, wherein the second region is ohmically connected to the substrate by the second gate pattern.

10 Claims, 101 Drawing Sheets

METHOD OF FABRICATING SEMICONDUCTOR DEVICE WITH VERTICAL CHANNEL TRANSISTOR

CROSS-REFERENCE TO RELATED APPLICATION

This application is a divisional of U.S. application Ser. No. 13/097,365, filed Apr. 29, 2011 in the United States Patent and Trademark Office, and claims priority from Korean Patent Application No. 10-2010-0098120, filed on Oct. 8, 2010, the disclosure of which is incorporated herein in its entirety by reference. This application is further related to U.S. application Ser. No. 13/097,343, entitled SEMICONDUCTOR DEVICE WITH VERTICAL CHANNEL TRANSISTOR AND METHOD OF FABRICATING THE SAME, which also claims priority under 35 U.S.C. §119 to Korean Patent Application No. 10-2010-0098119, filed on Oct. 8, 2010. The entire contents of which all applications are hereby incorporated by reference in their entirety.

BACKGROUND

1. Technical Field

The present disclosure relates to a semiconductor device and a method of fabricating the same, and more particularly, to a semiconductor device with a vertical channel transistor and a method of fabricating the same.

2. Related Art

A vertical channel transistor has a source electrode and a drain electrode respectively disposed at an upper side and a lower side of a channel region. A two-dimensional metal oxide semiconductor field effect transistor (MOSFET) has a source electrode and a drain electrode respectively disposed at both sides of a channel region.

SUMMARY

According to an embodiment, a semiconductor memory device comprises a semiconductor substrate, a semiconductor pillar extending from the semiconductor substrate, the semiconductor pillar comprising a first region, a second region, and a third region, the second region positioned between the first region and the third region, the third region positioned between the second region and the semiconductor substrate, immediately adjacent regions having different conductivity types, a first gate pattern disposed on the second region with a first insulating layer therebetween, and a second gate pattern disposed on the third region, wherein the second region is ohmically connected to the substrate by the second gate pattern.

The semiconductor memory device may further comprise a capacitor
electrically connected to the first region, a word line electrically connected to the first gate pattern, and a bit line electrically connected to the third region, the bit line disposed between the word line and the substrate, the bit line extending in a first direction and the word line extending in a second direction that is substantially perpendicular to the first direction.

The first region and the third region may have a first conductivity type, and the second region and the substrate have a second conductivity type being different from the first conductivity type.

The first gate pattern and the second gate pattern may comprise at least one of a semiconductor material or metal.

The semiconductor memory device may further comprise a second
insulating layer disposed between the second gate pattern and the third region.

The semiconductor memory device may further comprise a third gate
pattern disposed on the third region opposite to the second gate pattern and disposed substantially coplanar with the first gate pattern with respect to the semiconductor pillar with a third insulating layer therebetween.

According to an embodiment, a semiconductor memory device comprises a semiconductor substrate, a semiconductor pillar extending from the semiconductor substrate, the semiconductor pillar comprising a first region, a second region, and a third region, the second region positioned between the first region and the third region, the third region positioned between the second region and the semiconductor substrate, immediately adjacent regions having different conductivity types, a first gate pattern disposed on the second region with a first insulating layer therebetween, a second gate pattern disposed on the third region with a second insulating layer therebetween, the second region being ohmically connected to the substrate by the second gate pattern, a third gate pattern disposed on the third region opposite to the second gate pattern and disposed substantially coplanar with the first gate pattern with respect to the semiconductor pillar with a third insulating layer therebetween, and a capacitor electrically connected to the first region, a word line electrically connected to the first gate pattern, and a bit line electrically connected to the third region.

The first region and the third region may have a first conductivity type, and the second region and the substrate have a second conductivity type being different from the first conductivity type.

The first gate pattern and the second gate pattern may comprise at least one of a semiconductor material or metal.

The bit line can be disposed between the word line and the semiconductor substrate, the bit line extending in a first direction and the word line extending in a second direction that is substantially perpendicular to the first direction.

According to an embodiment, a method of forming a semiconductor memory device comprises forming a first trench and a second trench having substantially a same configuration in a semiconductor substrate, the first and second trenches disposed next to each other and extending in a first direction, forming a first gate pattern in the first trench and a second gate pattern in the second trench, forming a third gate pattern on the first gate pattern and in the first trench, forming a third trench across the first trench in a second direction that is substantially perpendicular to the first direction, forming a bit line in the third trench, forming a fourth gate pattern on the second gate pattern, forming a plug insulation pattern on the fourth gate pattern and in the second trench, and forming a word line on the third gate pattern.

The method may further comprise forming a memory element on a
semiconductor pillar disposed between the first trench and the second trench, the semiconductor pillar having an active region between the third gate pattern and the fourth gate pattern.

The method may further comprise forming a first insulating layer
on a sidewall of the first trench prior to forming the first gate pattern.

The method may further comprise forming a second insulating layer on a lower sidewall of the second trench prior to forming the second gate pattern.

The method may further comprise forming a third insulating layer
on an upper sidewall of the second trench and on a top surface of the first gate pattern prior to forming the third gate pattern.

The fourth gate pattern can directly contact the active region of the semiconductor pillar.

The memory element comprises a capacitor.

The method may further comprise, prior to forming the bit line,
forming a lower insulation pattern in the third trench.

The method may further comprise, prior to forming the bit line,
performing an operation of doping in the semiconductor pillar under the active region.

The operation of doping can be performed using impurities having a conductivity type different from a conductivity type of the semiconductor substrate.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 5A to 20A are sectional views illustrating a method of fabricating a semiconductor device according to the embodiment of the inventive concept described with reference to FIG. 4;

FIGS. 5B to 20B are perspective views illustrating a method of fabricating a semiconductor device according to the embodiment of the inventive concept described with reference to FIG. 4;

FIGS. 25A to 33A are sectional views illustrating a method of fabricating a semiconductor device according to the embodiment of the inventive concept described with reference to FIG. 24;

FIGS. 25B to 33B are perspective views illustrating a method of fabricating a semiconductor device according to the embodiment of the inventive concept described with reference to FIG. 24;

FIGS. 35A to 47A are sectional views illustrating a method of fabricating a semiconductor device according to the embodiment of the inventive concept described with reference to FIG. 34;

FIGS. 35B to 47B are perspective views illustrating a method of fabricating a semiconductor device according to the embodiment of the inventive concept described with reference to FIG. 34;

DETAILED DESCRIPTION

Advantages and features of the inventive concept, and implementation methods thereof will be clarified through following embodiments described with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the specification, it will be understood that when a layer (or film) is referred to as being 'on' another layer or substrate, it can be directly on the other layer or substrate, or intervening layers may also be present.

Figure 1:
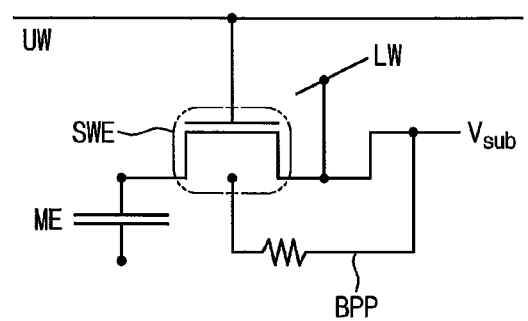
FIG. 1 is a circuit diagram schematically illustrating a semiconductor device according to an embodiment of the inventive concept.

FIG. 1 is a circuit diagram schematically illustrating a semiconductor device according to an embodiment of the inventive concept.

Referring to FIG. 1, a switching element SWE is provided to connect a memory element ME and a lower wiring LW in series. That is, one of source/drain electrodes of the switching element SWE is electrically connected to the memory element ME, and the other of source/drain electrodes of the switching element SWE is connected to the lower wiring LW. The switching element SWE may include a control electrode (or gate pattern) controlling the electrical connection between the source/drain electrodes, and the control electrode or gate pattern is electrically connected to an upper wiring UW crossing the lower wiring LW. In an embodiment, the switching element SWE may be an n-channel metal-oxide field-effect transistor (NMOSFET). However, according to an embodiment, the switching element SWE may be a p-channel MOSFET (PMOSFET).

According to an embodiment, the memory element ME may be a capacitor constituting a DRAM memory device. According to an embodiment, the memory element ME may be a ferroelectric capacitor, a magnetic tunnel junction (MJT), a variable resistance element, or a memory element based on charge storing mechanism. The switching element SWE may be used as a switching device for controlling the electrical connection to such memory elements.

According to an embodiment of the inventive concept, the channel region of the switching element SWE may be electrically connected to an external terminal to which a predetermined external voltage Vsub is supplied through a bypass pattern BPP.

Figure 2A:
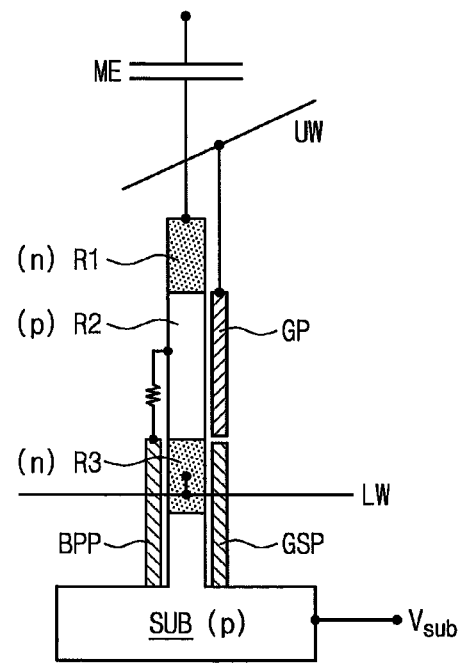
FIGS. 2A and 2B are diagrams illustrating semiconductor devices according to an embodiment of the inventive concept.
Figure 2B:
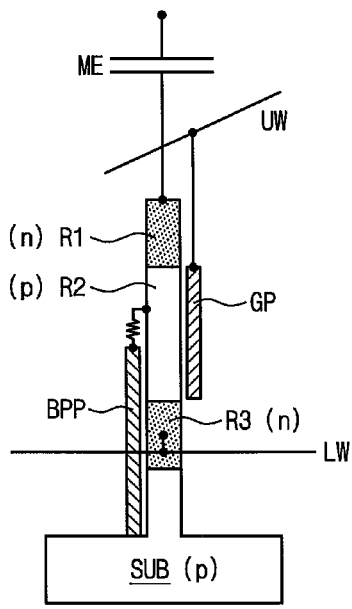

FIGS. 2A and 2B are diagrams illustrating semiconductor devices according to embodiments of the inventive concept.

Referring to FIGS. 2A and 2B, the switching element SWE described with reference to FIG. 1 may be a MOS-type vertical channel transistor. That is, the switching element SWE includes source/drain regions and a channel region therebetween. The source/drain regions and the channel region may extend upward from the top surface of a substrate SUB, and be formed in an active pattern having a pillar shape.

The active pattern may be formed of a material having semiconductor characteristics, and may include a first region R1 on the substrate SUB, a second region R2 between the substrate SUB and the first region R1, and a third region R3 between the substrate SUB and the second region R2. That is, the third, second and first regions R3, R2 and R1 are disposed to sequentially and directly contact the substrate SUB. The first and third regions R1 and R3 may have a different conductive type from the substrate SUB. The second region R2 may have the same conductive type as the substrate SUB or may be an intrinsic semiconductor. Therefore, according to an embodiment, if the substrate SUB is a p-type semiconductor, the first and third regions R1 and R3 have an n-type conductivity, and the second region R2 may have a p-type conductivity or be an intrinsic semiconductor. The first and third regions R1 and R3 may be used as the source/drain regions, and the second region R2 may be used as the channel region.

In the periphery of the active pattern, a gate pattern GP and a bypass pattern BPP may be disposed to face sidewalls of the second and third regions R2 and R3, respectively. The gate pattern GP and the bypass pattern BPP are spaced apart from the sidewall of the active pattern, and thus form respective MOS capacitors together with the second and third regions R2 and R3. According to an embodiment of the inventive concept, the gate pattern GP may be ohmically connected to an upper wiring UW, and the bypass pattern BPP may be ohmically connected to the substrate SUB and the second region R2.

The ohmic connection between the bypass pattern BPP and the substrate SUB and the ohmic connection between the bypass pattern BPP and the second region R2 may be realized by forming the bypass pattern BPP using a semiconductor material of the same conductive type as the substrate SUB. According to an embodiment, for an ohmic connection, the bypass pattern BPP may include at least one of metal nitrides, metal silicides, or metals.

Figure 3:
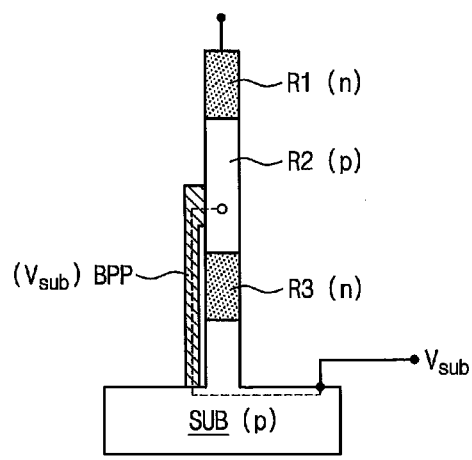
FIG. 3 is a schematic diagram illustrating a semiconductor device according to an embodiment of the inventive concept.

Referring to FIG. 3, since the second region R2 is ohmically connected to the substrate SUB by the bypass pattern BPP, the channel region (i.e., second region R2) of the switching element SWE may have the same potential as the switching element SWE through the bypass pattern BPP. This prevents the floating body effect. The floating body effect increases a threshold voltage and deteriorates dynamic reference properties of a memory semiconductor device.

According to an embodiment, a gate supporting pattern GSP may be further provided under the gate pattern GP to vertically separate the gate pattern GP and the substrate SUB from each other or structurally support the gate pattern GP. According to an embodiment, the gate supporting pattern GSP may be a conductive material connected to the substrate SUB, and formed of the same material as a portion of the bypass pattern BPP. According to an embodiment, the gate supporting pattern GSP may comprise an insulation material.

According to an embodiment of the inventive concept, the memory element ME is connected to the first region R1, and the lower wiring LW may be connected to the third region R3. The lower wiring LW may be disposed to cross the upper wiring UW, and may cross the active pattern and the bypass pattern BPP.

Figure 4:
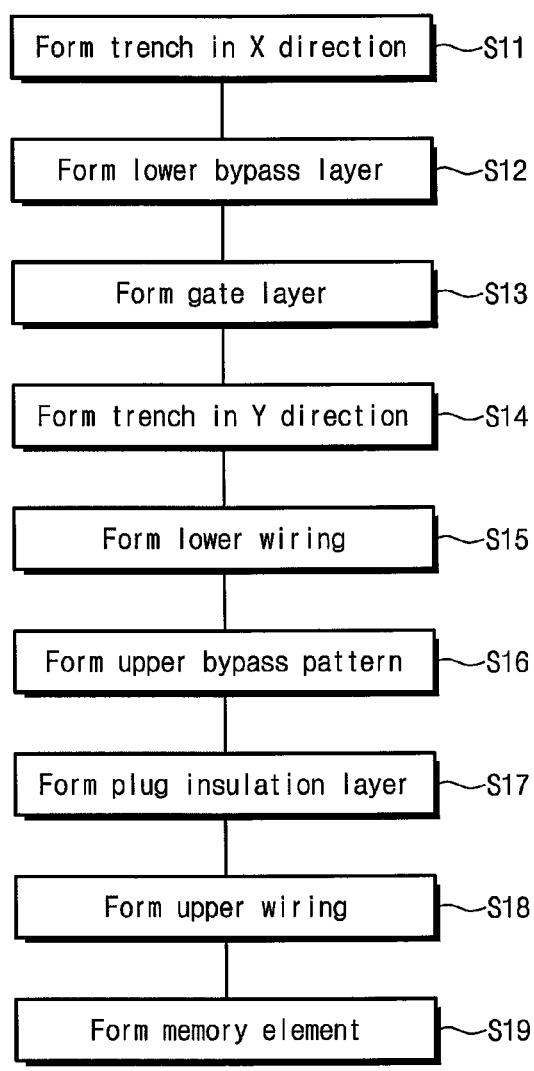
FIG. 4 is a flowchart illustrating a method of fabricating a semiconductor device according to an embodiment of the inventive concept.

FIG. 4 is a flowchart illustrating a method of fabricating a semiconductor device according to an embodiment of the inventive concept. FIGS. 5A to 20A are sectional views illustrating a method of fabricating a semiconductor device according to the embodiment of the inventive concept described with reference to FIG. 4. FIGS. 5B to 20B are perspective views illustrating a method of fabricating a semiconductor device according to the embodiment of the inventive concept described with reference to FIG. 4.

Referring to FIG. 4, first trenches TRC1 are formed by patterning a substrate SUB in operation S11, and thereafter a lower bypass layer LBL is formed in the first trenches TRC1 in operation S12.

Figure 5A:
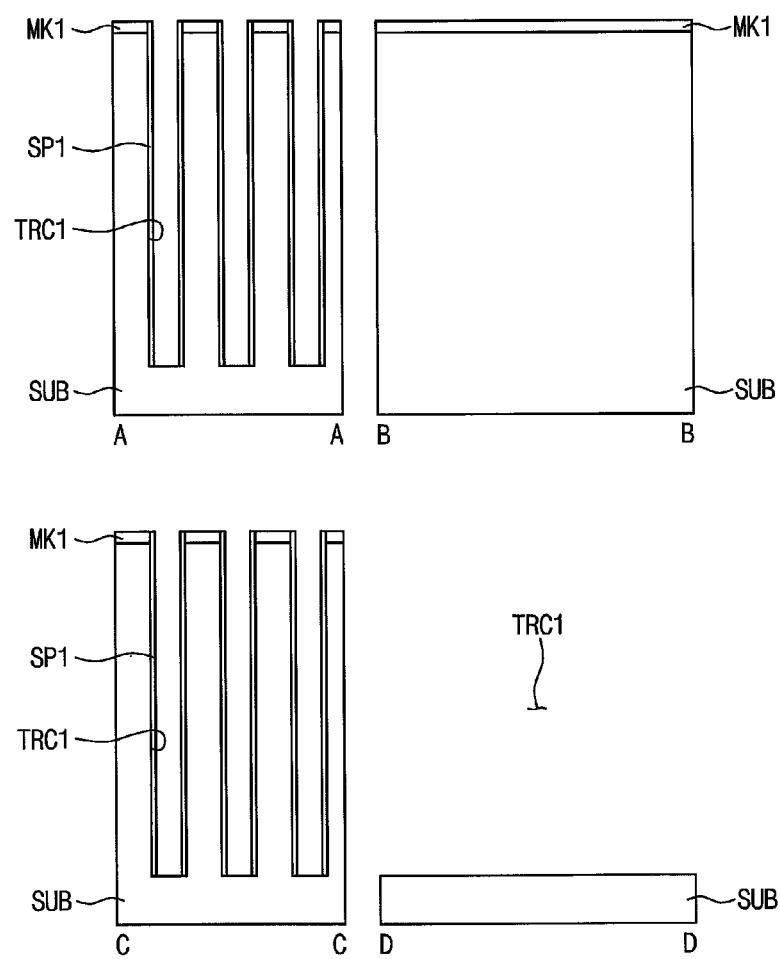
Figure 5B:
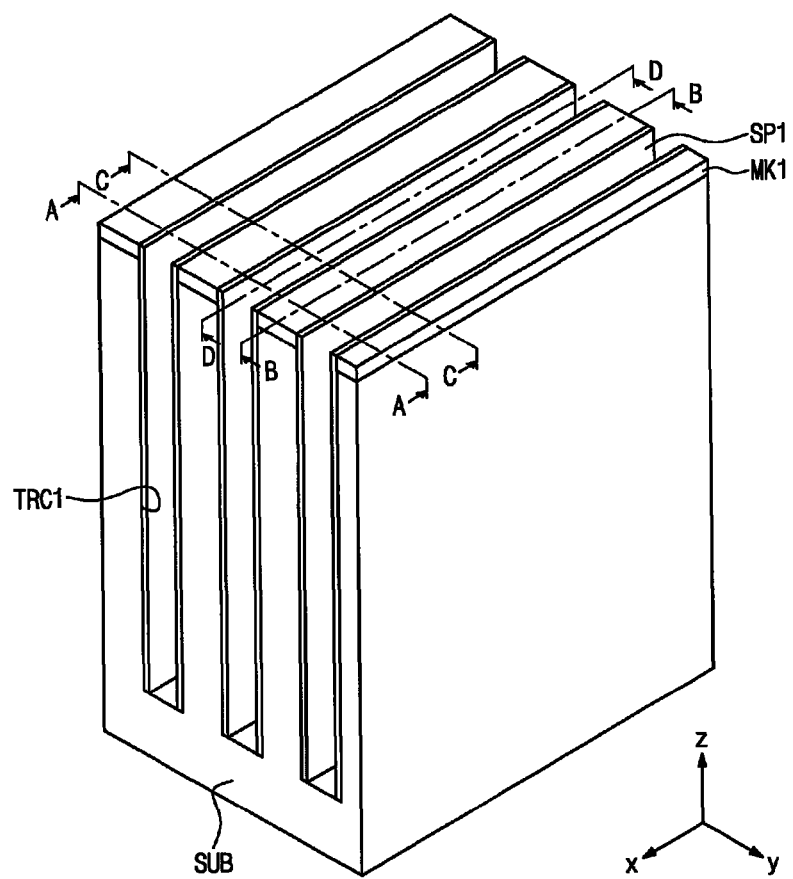

The first trenches TRC1 may be formed parallel with a first direction (hereinafter, referred to as "x-direction"). Referring to FIGS. 5A and 5B, the operation S11 may include forming first mask patterns MK1 having a major axis parallel to the x-direction, and etching the substrate SUB using the first mask patterns MK1 as an etch mask.

Figure 6A:
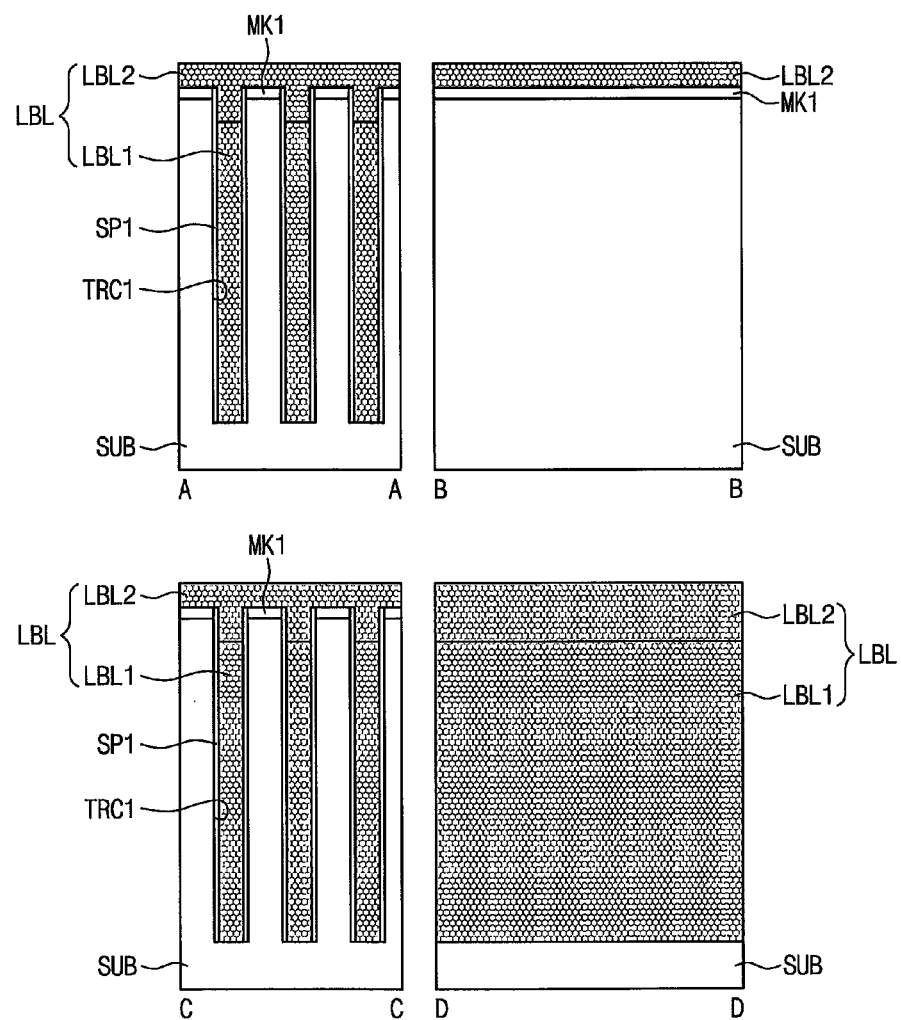
Figure 6B:
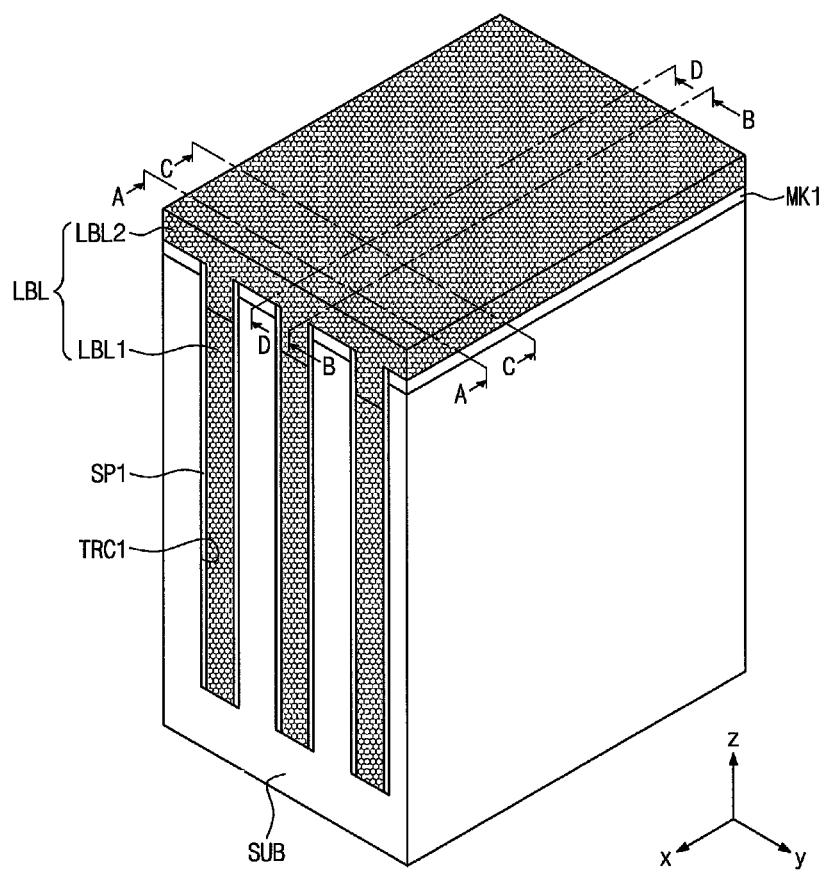

Referring to FIGS. 6A and 6B, the lower bypass layer LBL may be formed in such a way that the lower bypass layer LBL is directly connected to the substrate SUB at the bottom of the first trench TRC1 and separated from a sidewall of the first trench TRC1. According to an embodiment, a first spacer SP1 comprising an insulation material may be formed between sidewalls of the lower bypass layer LBL and the first trench TRC1. In an embodiment, the operation S12 may include forming the first spacer SP1 exposing the bottom surface of the first trench TRC1, on the sidewall of the first trench TRC1, and forming the lower bypass layer LBL filling the first trench TRC1, on the resultant structure.

The lower bypass layer LBL may be formed of a conductive material that may be ohmically connected to the substrate SUB. For example, the lower bypass layer LBL may be formed of a semiconductor material having the same conductive type as the substrate SUB. According to an embodiment, the lower bypass layer LBL may be formed of a material having lower resistivity than the substrate SUB. For example, the lower bypass layer LBL may include at least one of a semiconductor material having the same conductive type as the substrate SUB and having higher impurity concentration than the substrate SUB, a barrier metal layer (such as, for example, metal nitride), or metallic materials (such as, for example, metal and metal silicide).

According to an embodiment, the operation of forming the lower bypass layer LBL may include at least two layer-forming operations. For example, as illustrated in FIGS. 6A and 6B, the lower bypass layer LBL may include a first lower bypass layer LBL1 and a second lower bypass layer LBL2 which fill lower and upper regions of the first trench TRC1 in sequence. According to an embodiment, the first lower bypass layer LBL1 may be an epitaxial layer obtained through crystal growth using the bottom surface of the first trench TRC1 exposed by the first spacer SP1 as a seed, and the second lower bypass layer LBL2 may be a deposition layer formed using a deposition process. When the second lower bypass layer LBL2 is formed, the flatness of the resultant structure is improved to allow a subsequent process to be easily performed. According to an embodiment, the operation of forming the second lower bypass layer LBL2 may be omitted. That is, the lower bypass layer LBL may be an epitaxial layer or deposition layer formed through a single layer-forming process.

Figure 7A:
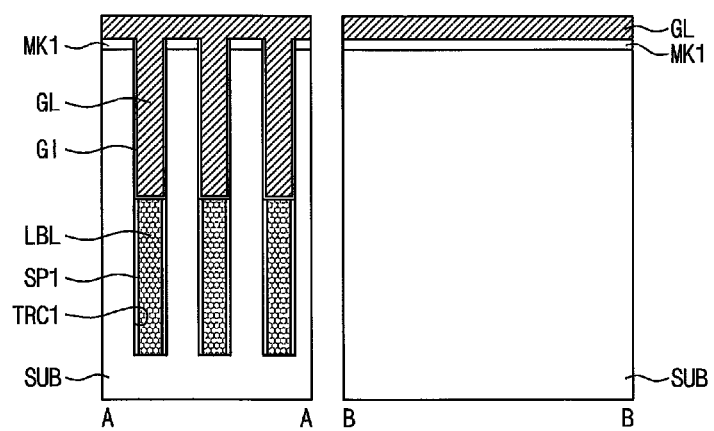
Figure 7A:
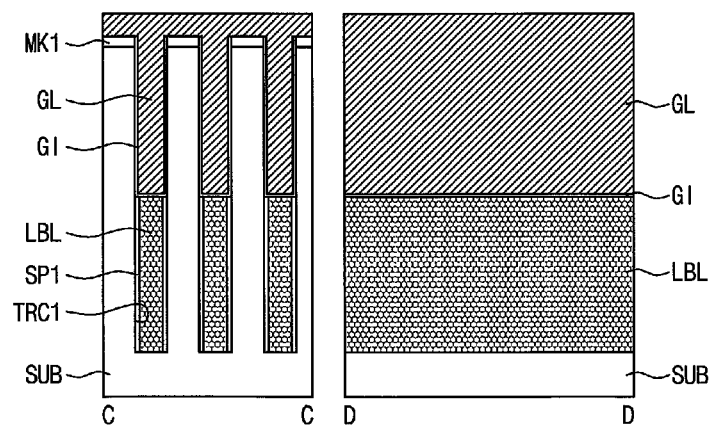
Figure 7B:
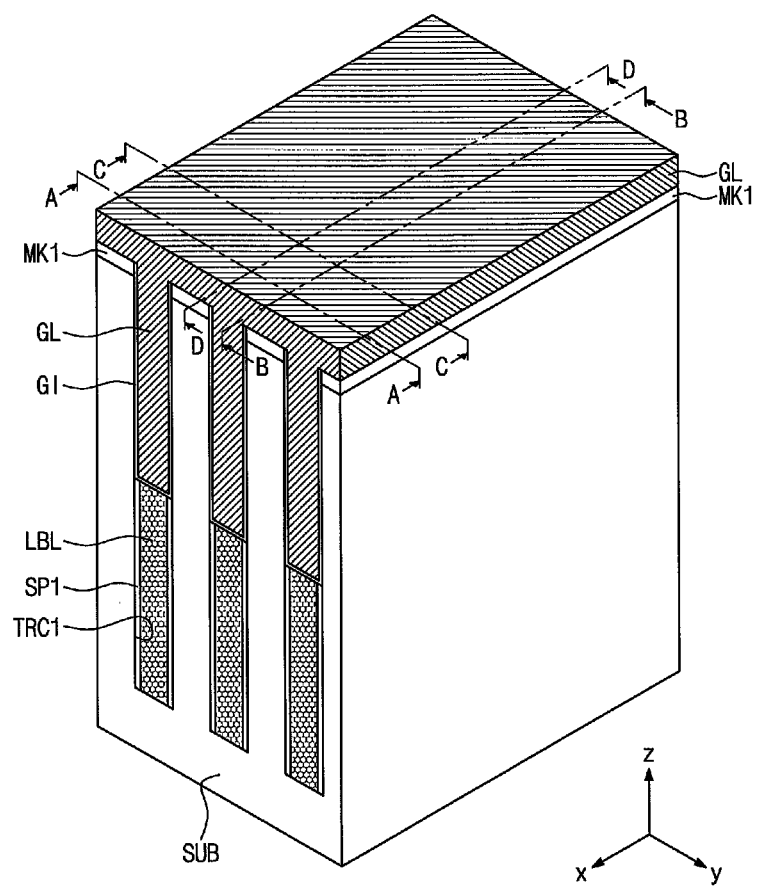

Referring to FIG. 4, a gate layer GL is formed in the upper region of the first trench TRC1 in operation S13. The operation S13 may include etching the lower bypass layer LBL and the first spacer SP1 to expose an upper sidewall of the first trench TRC1 again, and then sequentially forming a gate insulator GI and the gate layer GL on the resultant structure, as illustrated in FIGS. 7A and 7B.

The exposing of the upper sidewall of the first trench TRC1 may include blanket-etching the lower bypass layer LBL to expose an inner sidewall of the first spacer SP1, and removing the exposed portion of the first spacer SP1. The blanket-etching of the lower bypass layer LBL may be performed using isotropic or anisotropic etching having an etch selectivity with respect to the first spacer SP1. This etching process may be performed such that the top surface of the lower bypass layer LBL is lower than the bottom surface of the first mask pattern MK1. Accordingly, as described above, the inner sidewall of the first spacer SP1 may be exposed again in the upper region of the first trench TRC1. The removing of the first spacer SP1 may be performed using isotropic or anisotropic etching having an etch selectivity with respect to the substrate SUB and the lower bypass layer LBL.

The gate insulator GI may be formed on an upper inner wall of the first trench TRC1 exposed by removing the first spacer SP1. The gate insulator GI may be formed on the top surface of the lower bypass layer LBL. The gate insulator GI may be interposed between the lower bypass layer LBL and the gate layer GL. The forming of the gate insulator GI may include thermally oxidizing the exposed surface of the substrate SUB or the lower bypass layer LBL. For example, if the substrate SUB and/or the lower bypass layer LBL is/are formed of silicon, the gate insulator GI may be a silicon oxide layer formed through thermal oxidation. According to an embodiment, the gate insulator GI may be a thin film formed using chemical vapor deposition (CVD) or atomic layer deposition (ALD) technique, and may include a silicon oxide layer or a high dielectric layer having a dielectric constant greater than a silicon oxide layer.

The gate layer GL may include at least one of conductive materials. For example, the gate layer GL may include at least one of a doped silicon layer, metal nitrides, or metallic materials. The gate layer GL may be formed to fill the first trench TRC1 with the gate insulator GI formed, using one of CVD or physical vapor deposition (PVD) techniques. In this case, the gate layer GL may remain on the first mask pattern MK1. According to an embodiment of the inventive concept, after the gate layer GL is formed, blanket-etching of the gate layer GL and/or the first mask pattern MK1 may be further performed to expose the top surface of the first mask pattern MK1 or the substrate SUB.

Figure 22:
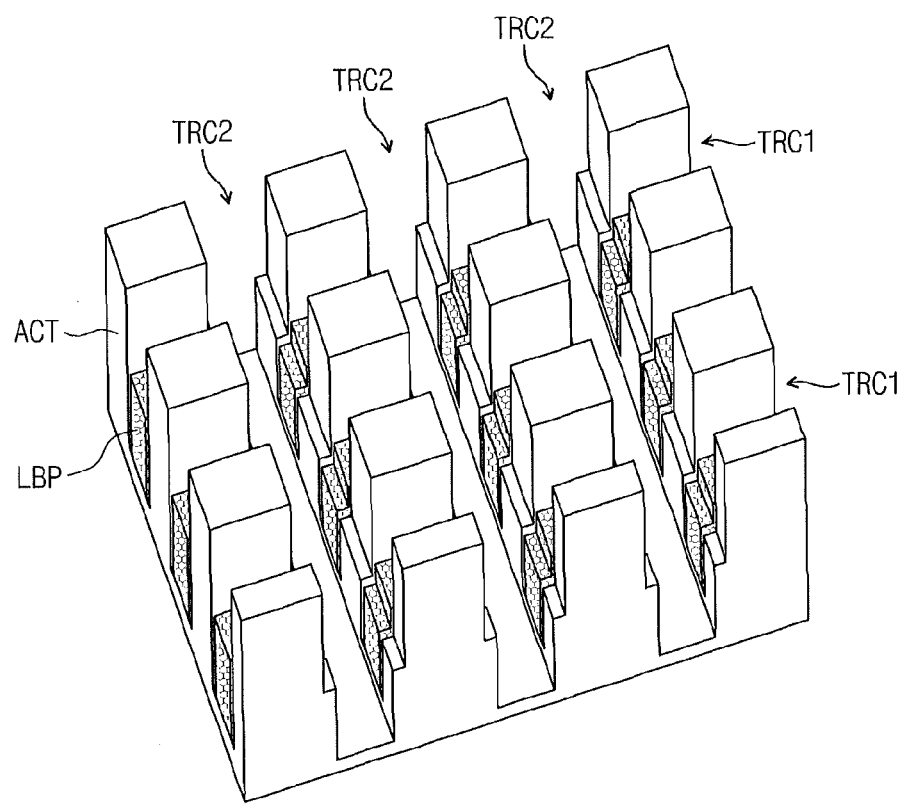

Referring to FIG. 4, in operation S14, the substrate SUB is patterned again to thereby form second trenches TRC2 crossing the first trenches TRC1. Since the second trenches TRC2 cross the first trenches TRC1, the first and second trenches TRC1 and TRC2 define active patterns ACT arranged 2-dimensionally on the substrate SUB, as illustrated in FIG. 22. The active patterns ACT are formed through double patterning, and thus a section of the active pattern ACT projected onto the top surface of the substrate SUB may have a rectangular shape.

Figure 8A:
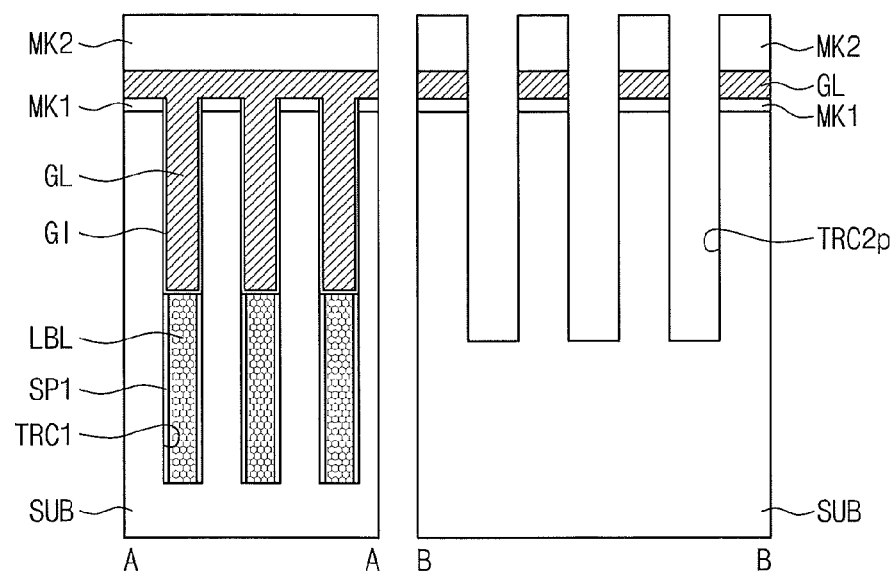
Figure 8A:
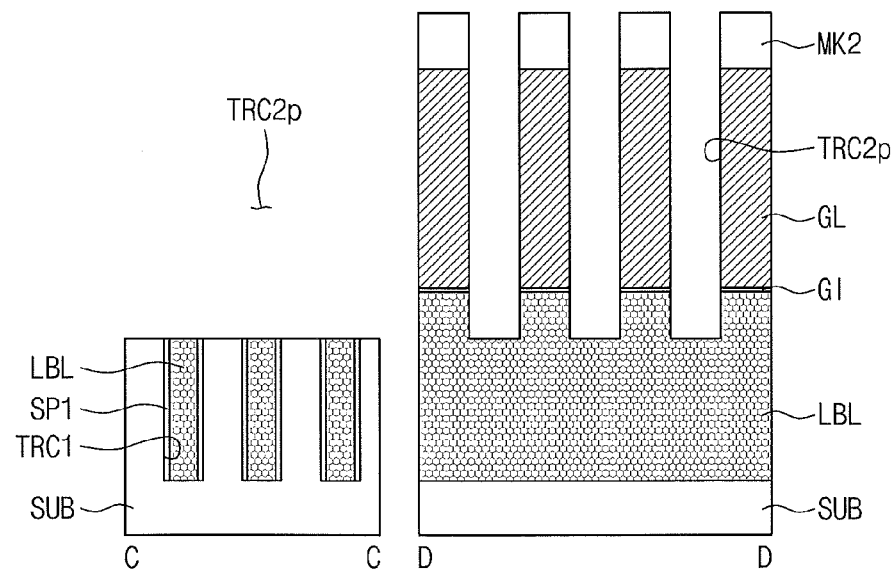
Figure 8B:
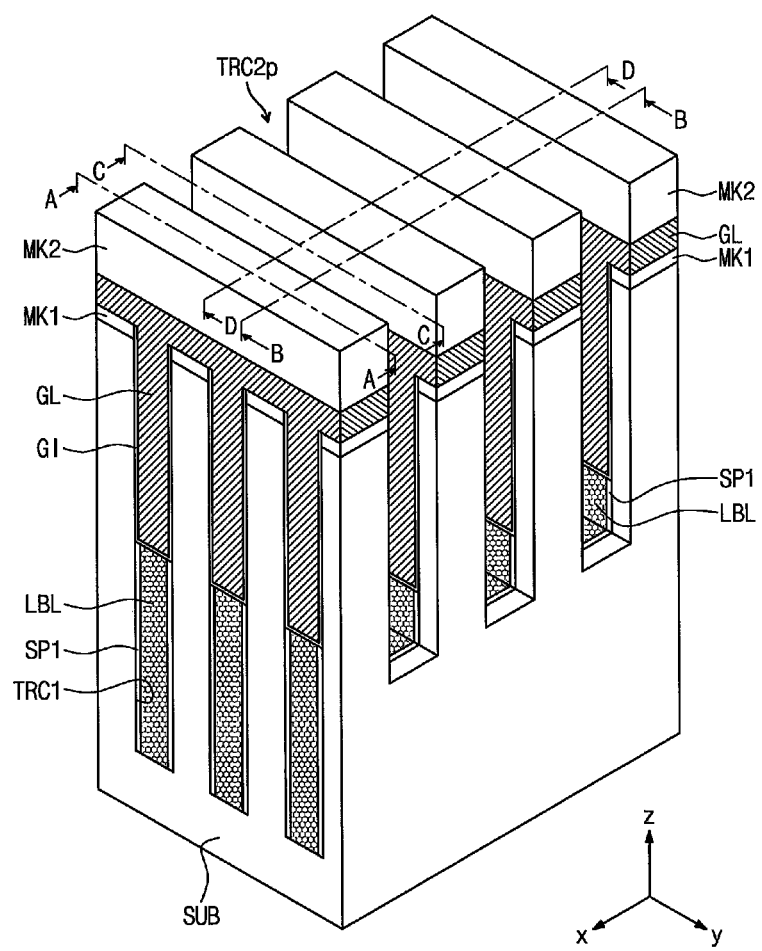
Figure 9A:
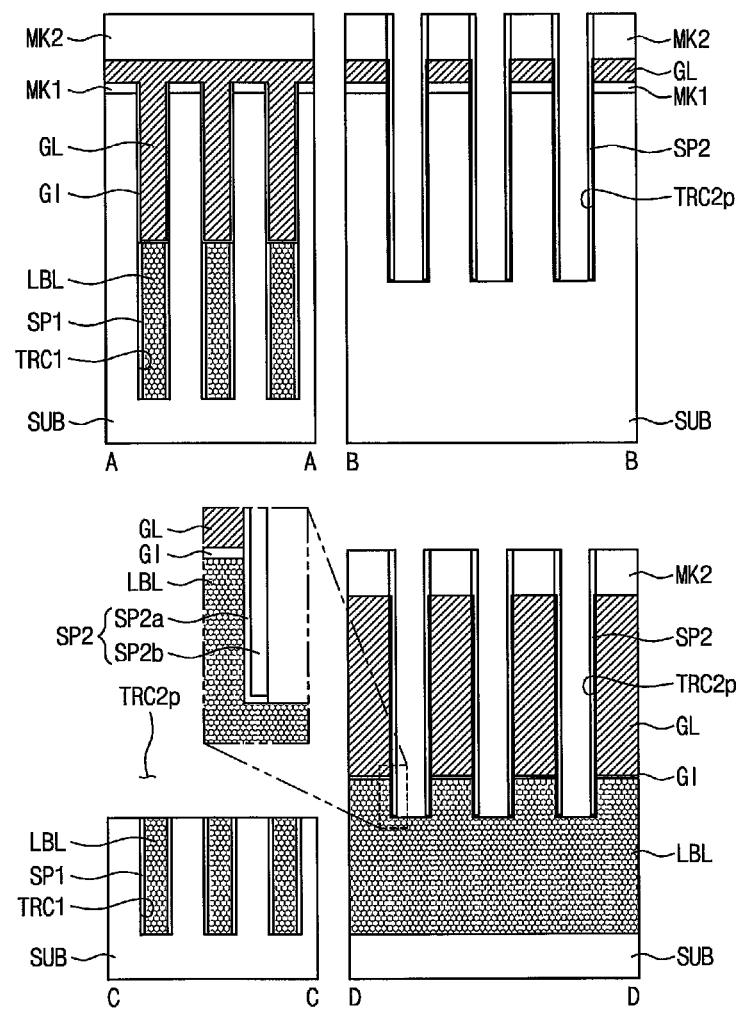
Figure 9B:
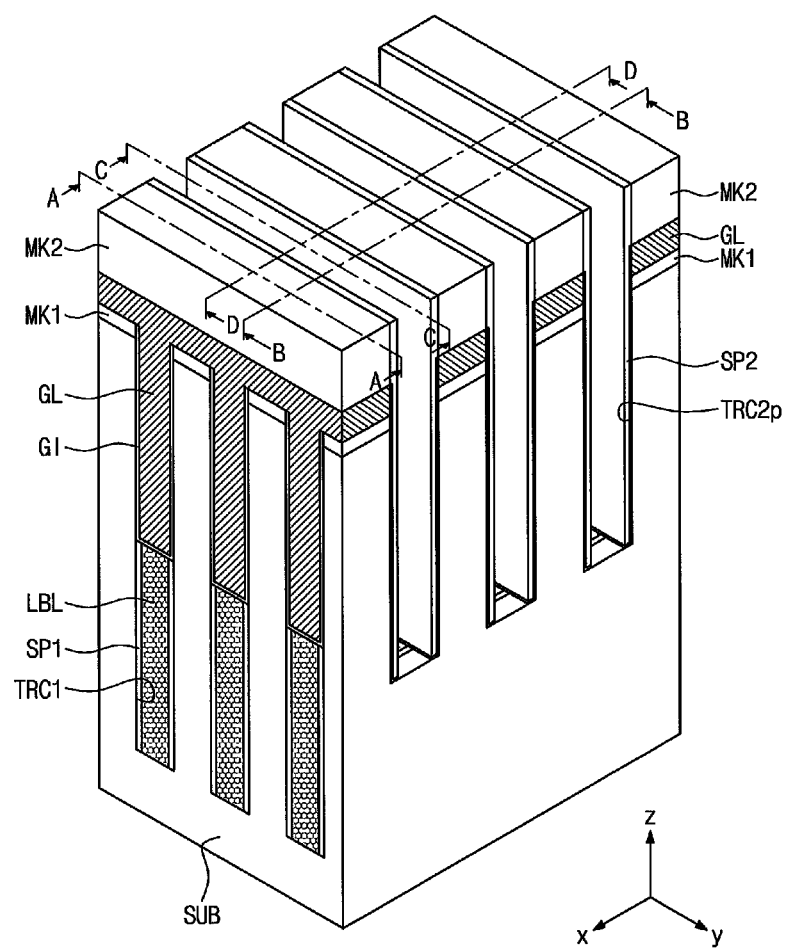
Figure 10A:
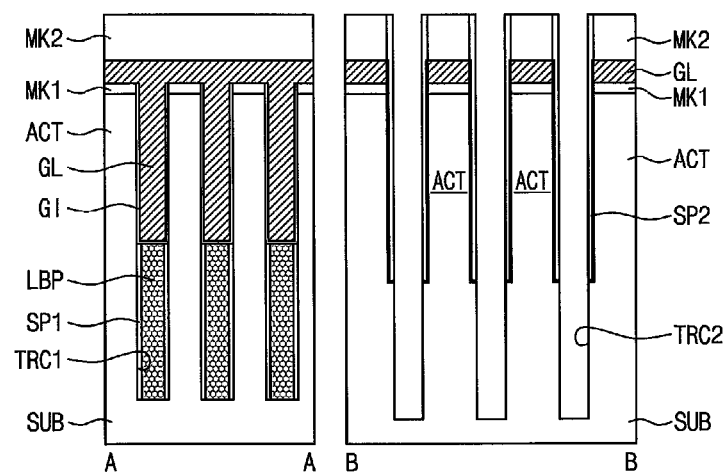
Figure 10A:
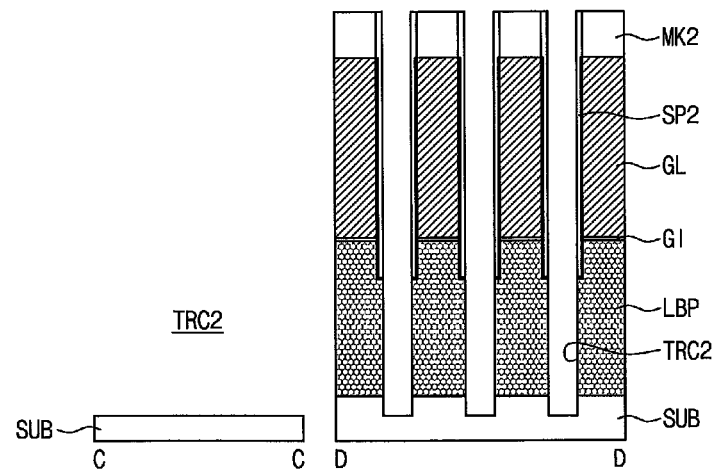
Figure 10B:
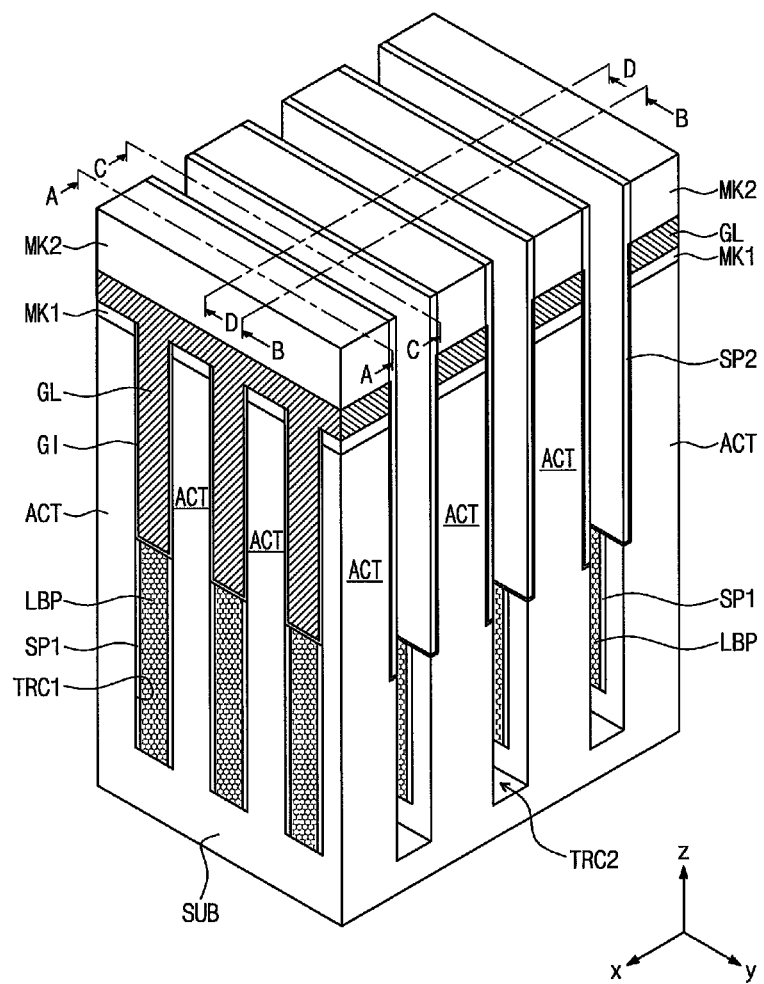

According to an embodiment of the inventive concept, the operation S14 of forming the second trenches TRC2 may include forming preliminary trenches TRC2p crossing the first trenches TRC1 as illustrated in FIGS. 8A and 8B, forming second spacers SP2 on inner sidewalls of the preliminary trenches TRC2p as illustrated in FIGS. 9A and 9B, and forming second trenches TRC2 by extending the preliminary trenches TRC2p downward as illustrated in FIGS. 10A and 10B.

Figure 21:
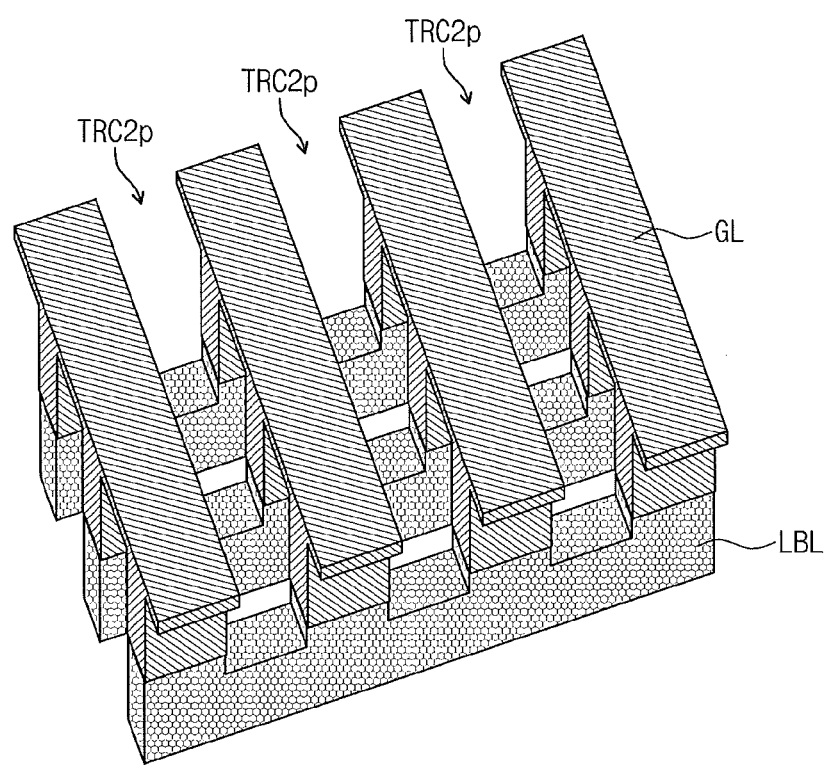
FIGS. 21 to 23 are perspective views of a semiconductor device according to the embodiment of the inventive concept described with reference to FIG. 4.

Referring to FIGS. 8A and 8B, the forming of the preliminary trenches TRC2p may include forming second mask patterns MK2 having a major axis crossing the first trenches TRC1 on the resultant structure where the gate layer GL is formed, and patterning the substrate SUB and the gate layer GL using the second mask patterns MK2 as an etch mask. Accordingly, as illustrated in FIG. 21, the gate layers GL are horizontally separated by the preliminary trenches TRC2p, and thus cross the lower bypass layer LBL disposed in the first trenches TRC1. During this process, the first mask patterns MK1 and the gate insulator GI may be etched at the same time. That is, the first mask patterns MK1 and the gate insulator GI are separated by the preliminary trenches TRC2p, and may thus be arranged 2-dimensionally on the substrate SUB like the active patterns ACT. According to an embodiment, the bottom surfaces of the preliminary trenches TRC2p may be lower than the undersurface of the gate layer GL.

Referring to FIGS. 9A and 9B, the second spacers SP2 are formed on the sidewall of the preliminary trench TRC2p. The second spacers SP2 may expose the bottom surface of the preliminary trench TRC2p while crossing the first trenches TRC1 like the preliminary trenches TRC2p. According to an embodiment, the second spacer SP2 may include a mask spacer SP2b comprising a material (e.g., silicon nitride) having an etch selectivity with respect to silicon oxide. The second spacer SP2 may include a buffer spacer SP2a interposed between the mask spacer SP2b and the preliminary trenches TRC2p. The buffer spacer SP2a may be formed of silicon oxide, and may be an L-shaped spacer having a part extending horizontally and disposed under the mask spacer SP2b.

Referring to FIGS. 10A and 10B, the exposed bottom surface of the preliminary trench TRC2p is etched using the second mask pattern MK2 and the second spacer SP2 as an etch mask. Accordingly, the second trenches TRC2 having a narrower width than the preliminary trench TRC2p are formed.

According to an embodiment, as illustrated in the section taken along line D-D of FIG. 10A, the bottom surface of the second trench TRC2 may be lower than the bottom surface of the lower bypass layer LBL. In an embodiment, the lower bypass layer LBL may be horizontally separated by the second trenches TRC2, and thus be arranged 2-dimensionally in the first trenches TRC1, as illustrated in FIG. 22. According to an embodiment of the inventive concept, the bottom surface of the second trench TRC2 is disposed higher than the bottom surface of the lower bypass layer LBL, and consequently the lower bypass layer LBL may not be completely separated by the second trenches TRC2.

Figure 23:
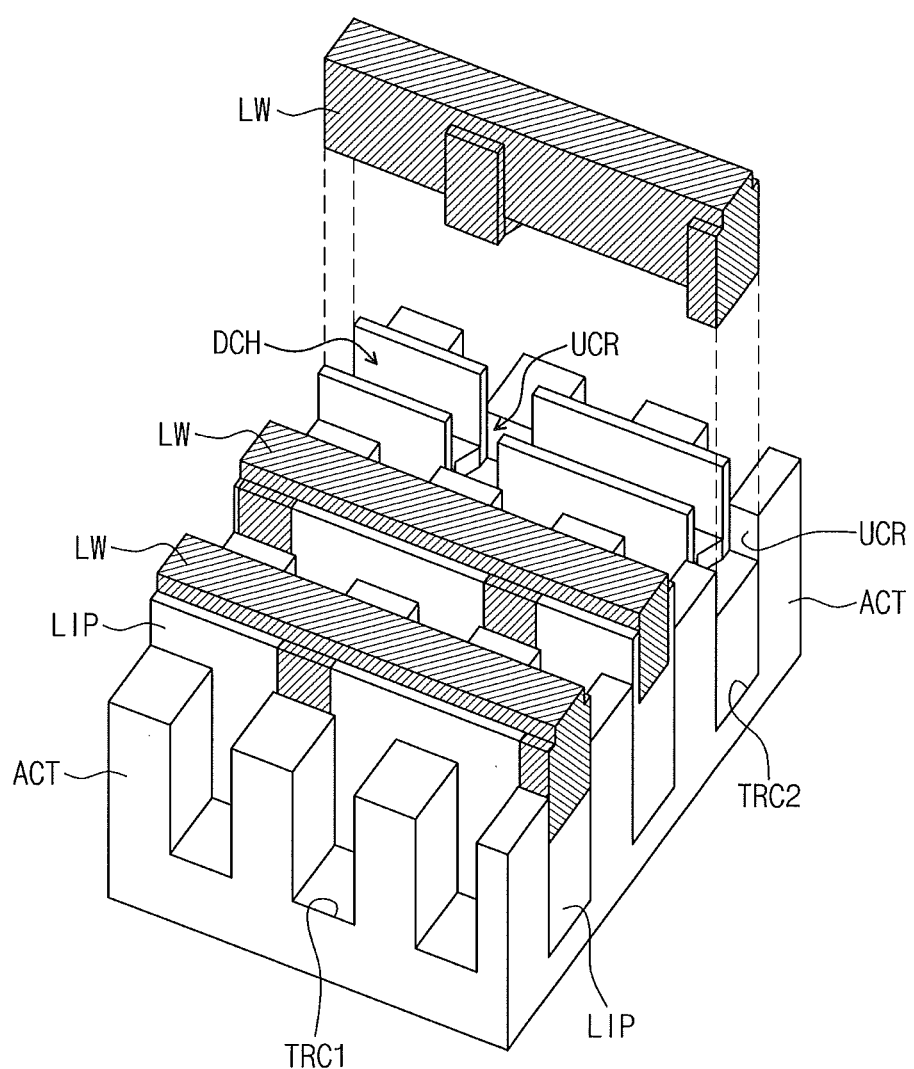

Referring to FIG. 4 again, in operation S15, lower wirings LW contacting the sidewall of the active pattern ACT are formed in a lower region of the second trench TRC2. The operation S15 may include forming a lower insulation pattern LIP filing the lower region of the second trench TRC2, patterning the lower insulation pattern LIP to form ditches DCH crossing the first trenches TRC1 and undercut regions UCR exposing the sidewalls of the active patterns ACT, and forming the lower wirings filling the ditches DCH and the undercut regions UCR. FIG. 23 is an exploded perspective view exemplarily illustrating configuration and shape of the ditches DCH, the undercut regions UCR, and the lower wirings LW.

Figure 11A:
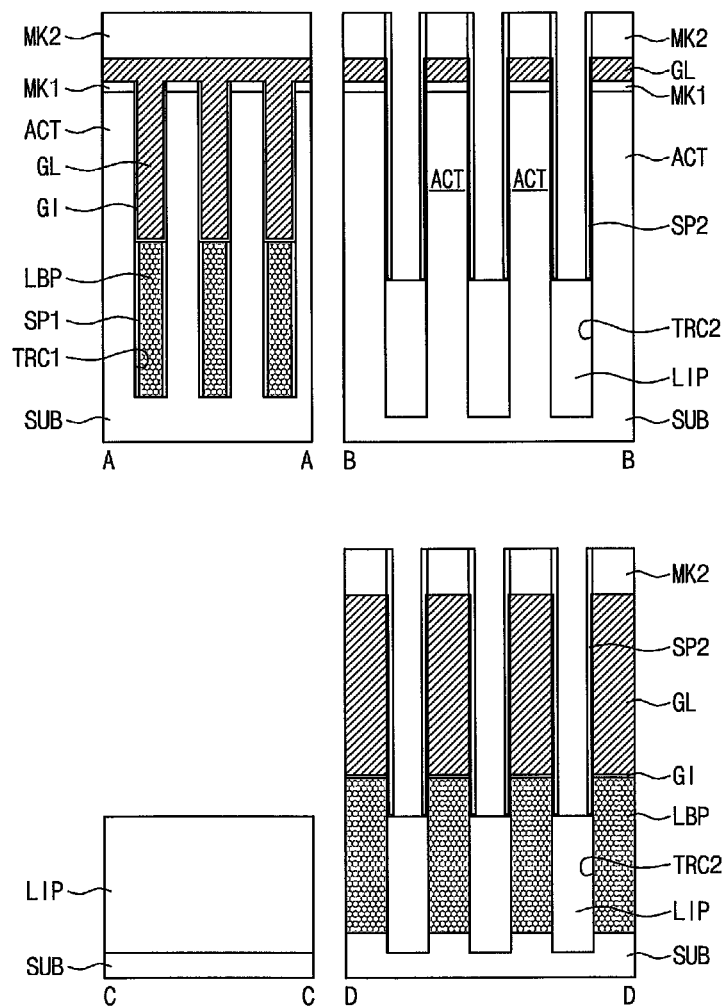
Figure 11B:
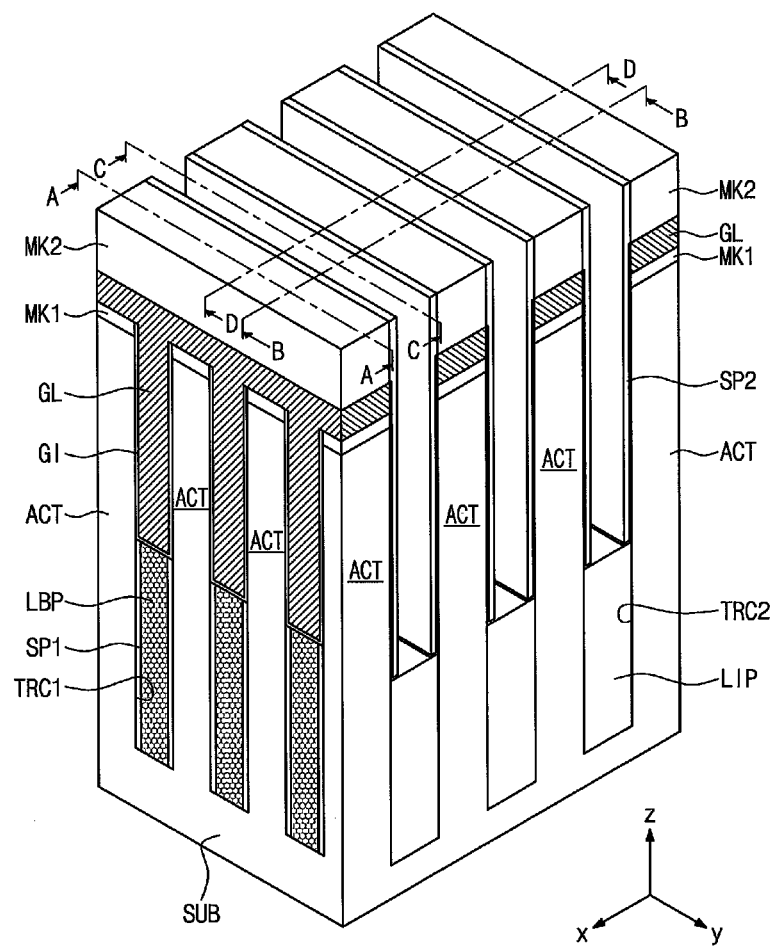

According to an embodiment, the lower insulation pattern LIP may be formed by thermally oxidizing the sidewalls of the active patterns ACT and the sidewalls of the lower bypass patterns LPB which are exposed by the second trenches TRC2. In this case, as illustrated in FIGS. 11A and 11B, the lower insulation pattern LIP is formed through the oxidation of atoms constituting the active patterns ACT, and accordingly the width of the lower insulation pattern LIP may be greater than the space between the second spacers SP2. That is, the lower insulation pattern LIP may be formed under the second spacer SP2. According to an embodiment, the lower insulation pattern LIP may be formed to have a width larger than the width (i.e., width of the preliminary trench TRC2$p$) shown in FIGS. 11A and 11B. According to an embodiment, the lower insulation pattern LIP may be formed through a deposition process which is performed in addition to the thermal oxidation process.

Figure 12A:
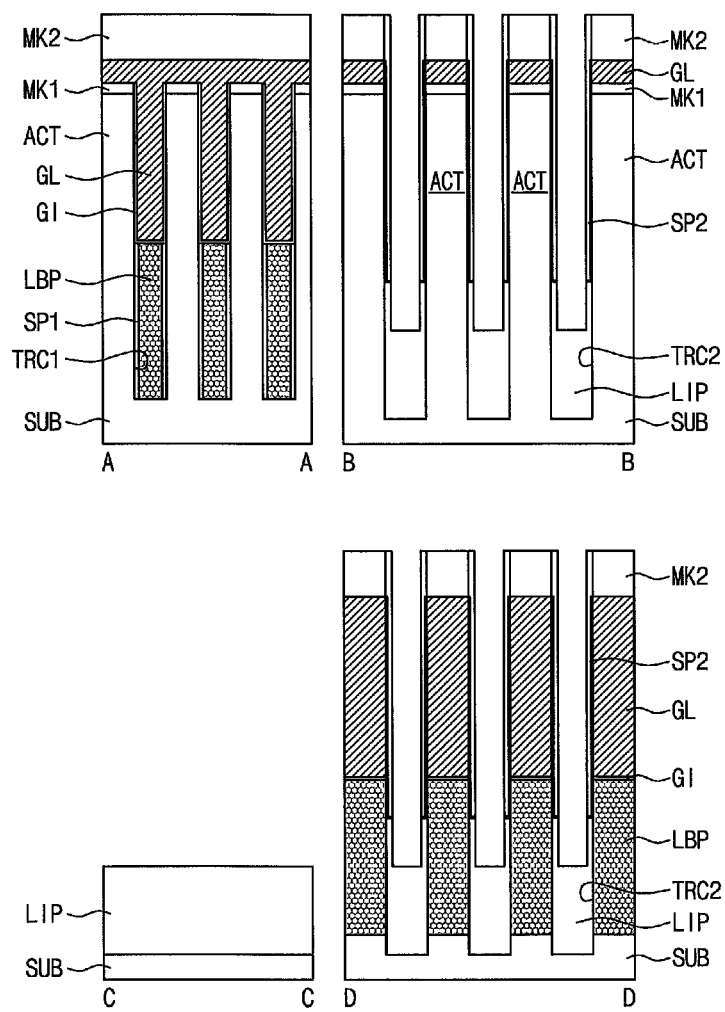
Figure 12B:
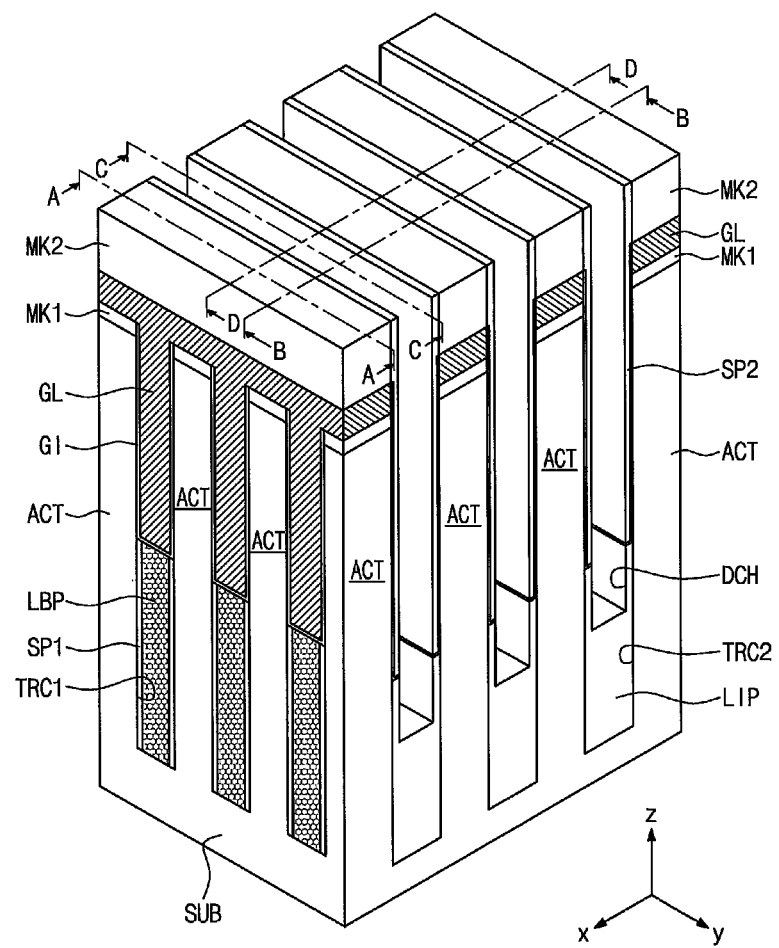

The ditches DCH may be formed by anisotropically etching the top surface of the lower insulation pattern LIP using the second spacers SP2 as an etch mask. Accordingly, as illustrated in FIGS. 12A and 12B, the ditch DCH is formed in the second trench TRC2 such that the ditch DCH is spaced from the sidewalls of the active patterns ACT. That is, a portion of the lower insulation pattern LIP which is not etched during the anisotropic etching may remain under the second spacer SP2, and the ditches DCH and the active patterns ACT adjacent to the ditches DCH may be separated by the remaining part of the lower insulation pattern LIP.

Figure 13A:
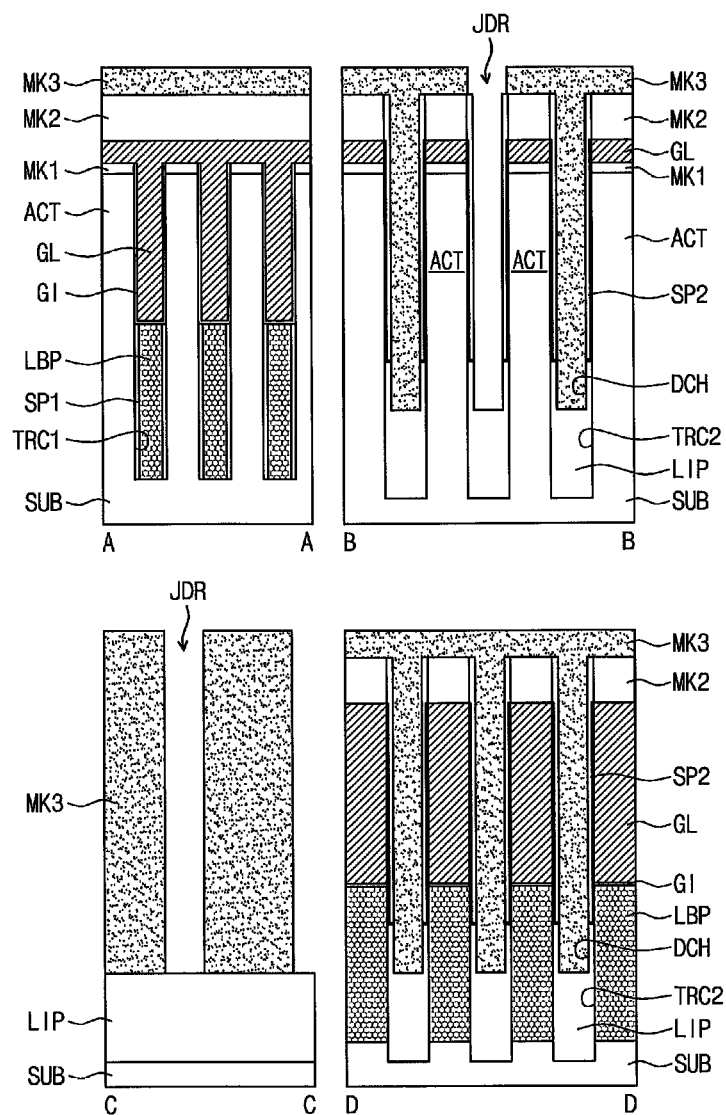
Figure 13B:
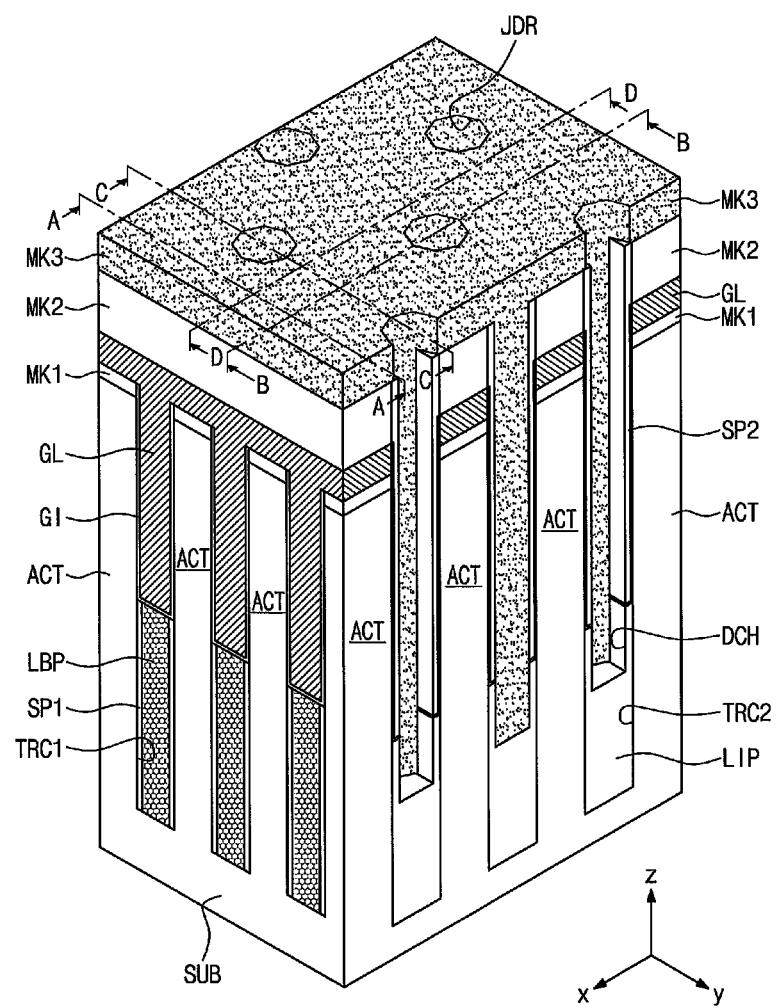
Figure 14A:
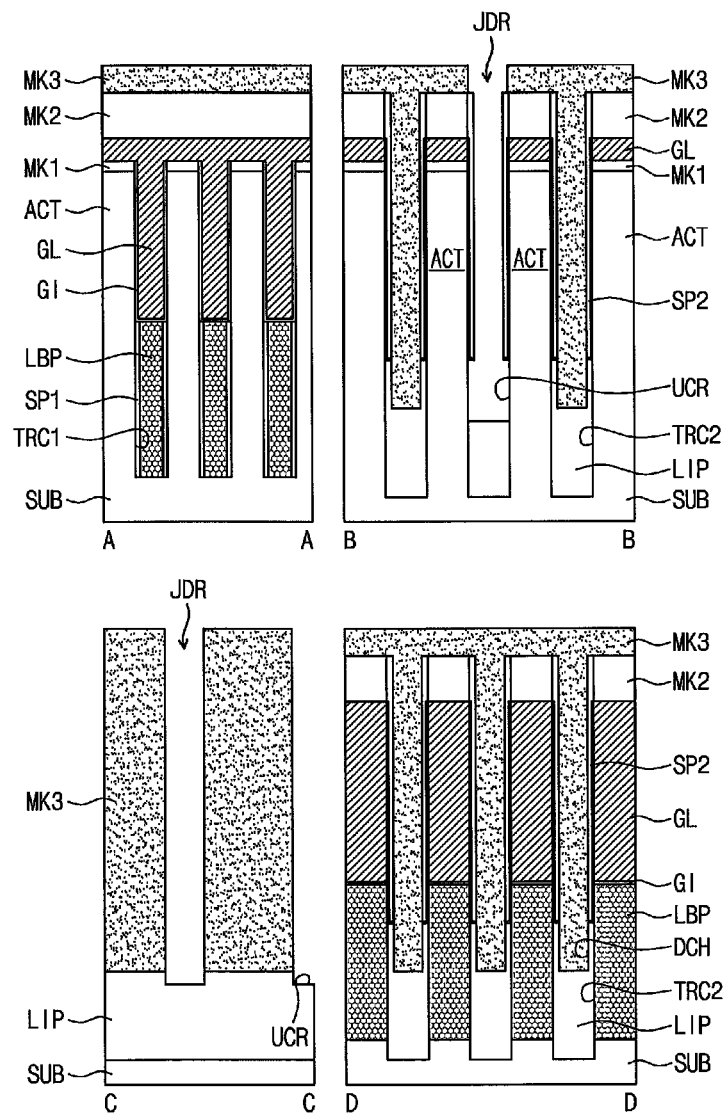
Figure 14B:
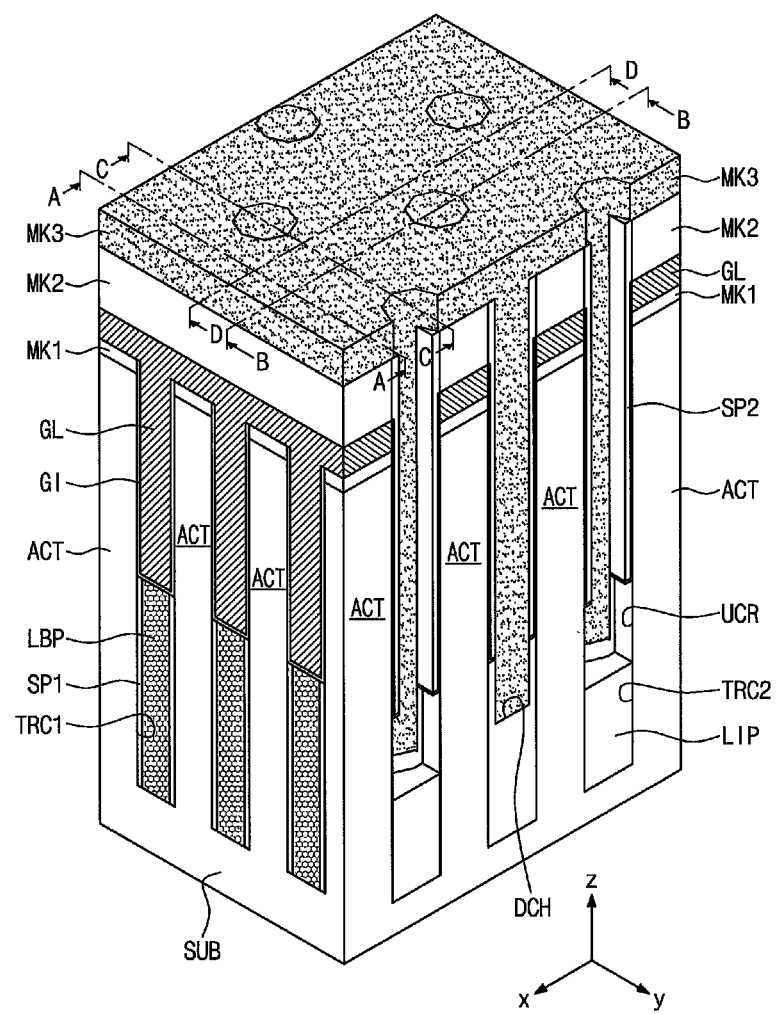

The undercut regions UCR may be formed by forming a third mask pattern MK3 as illustrated in FIGS. 13A and 13B, and patterning the lower insulation pattern LIP using the third mask pattern MK3 as a mask as illustrated in FIGS. 14A and 14B. In an embodiment, the third mask pattern MK3 may be formed to define hole-shaped junction defining regions JDR partially exposing the ditches DCH. According to an embodiment of the inventive concept, the third mask pattern MK3 may be a photoresist pattern formed through photolithography. The undercut regions UCR are formed by isotropically expanding the ditches DCH exposed by the junction defining regions JDR, and expose the sidewalls of the active patterns ACT adjacent to the junction defining regions JDR. As a result of the isotropic expansion, as illustrated in the section taken along line C-C of FIG. 14A, the undercut region UCR may be formed to have the bottom surface lower than the ditch DCH.

The junction defining regions JDR and the undercut regions UCR may be 2-dimensionally formed on the substrate SUB. According to an embodiment of the inventive concept, the center points of the junction defining regions JDR and the undercut regions UCR may be positioned inside regions that are included in the second trench TRC2 but not included in the first trenches TRC1. That is, the center points of the junction defining regions JDR and the undercut regions UCR may be positioned in recess regions of the substrate SUB, which are newly formed by the second trenches TRC2. However, according to an embodiment, other parts of the junction defining regions JDR and the undercut regions UCR, (which deviate from the center point), may extend up to a region included in the first trench TRC1. That is, widths of the junction defining regions JDR and the undercut regions UCR, which are measured along the major axis direction (hereinafter, referred to as y-direction) of the second trench TRC2 may be greater than the width of the active pattern ACT.

In an embodiment, a distance between the junction defining regions JDR or a distance between the undercut regions UCR, which is measured along the y-direction inside one of the second trenches TRC2, may be greater than a pitch (i.e., sum of width and space) of the active pattern ACT. For example, a distance between the center points of the undercut regions UCR may be twice the pitch of the active pattern ACT inside one of the second trenches TRC2. Inside one of the second trenches TRC2, the undercut regions UCR may locally be formed between even-numbered active patterns ACT, but not be formed between odd-numbered active patterns ACT.

In an embodiment, the undercut regions UCR disposed in one of the pair of the second trenches TRC2 expose the sidewalls of the even-numbered active patterns ACT, and the undercut regions UCR disposed in the other one of the pair of second trenches TRC2 expose the sidewalls of the odd-numbered active patterns ACT. The number of the junction defining regions JDR or undercut regions UCR may be half of the number of the active patterns ACT.

Figure 15A:
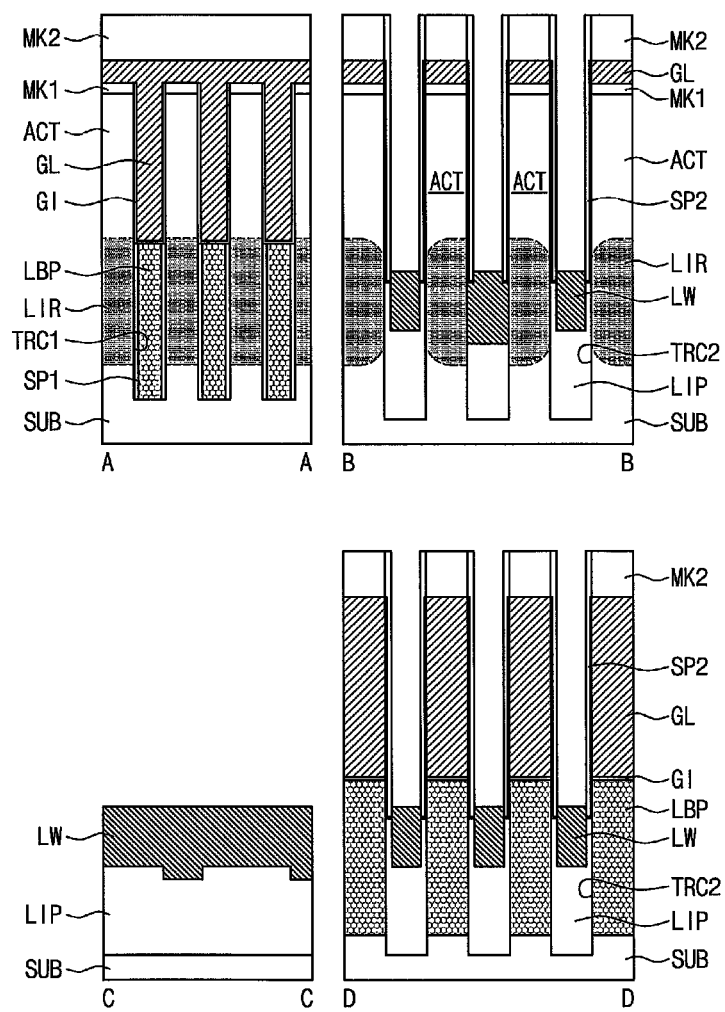
Figure 15B:
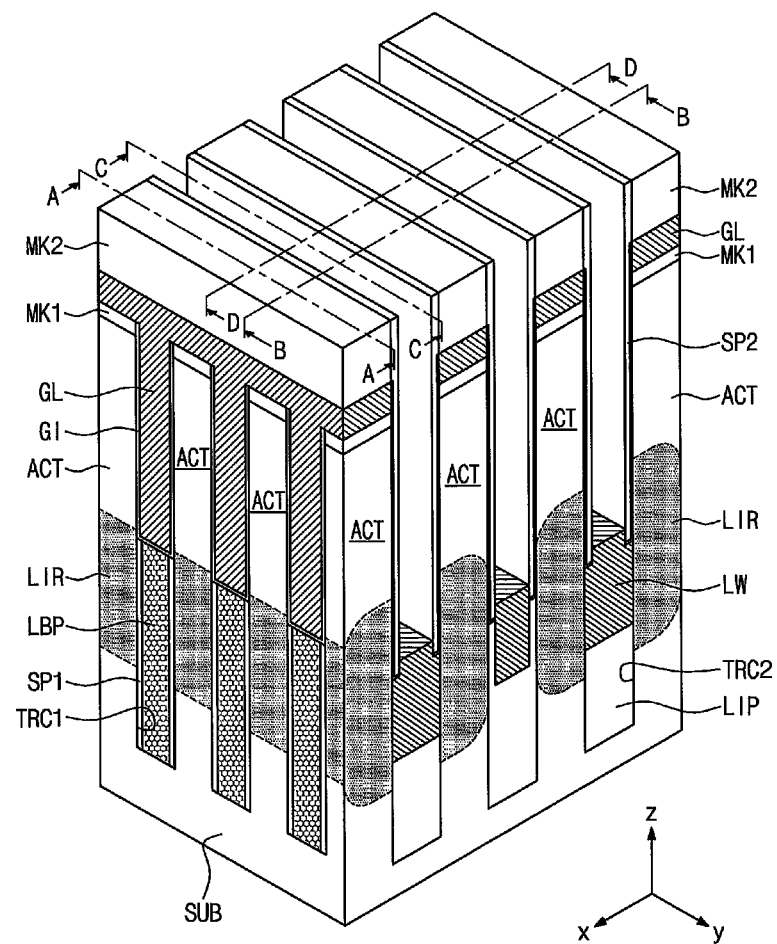

As illustrated in FIGS. 15A and 15B, prior to forming of the lower wiring LW, an impurity doping process may be further performed to dope lower regions of the active patterns ACT adjacent to the undercut regions UCR with impurities of a different conductive type from the substrate SUB, through the undercut regions UCR. As a result of the impurity doping process, lower impurity regions LIR may be formed in the lower regions of the active patterns ACT.

According to an embodiment of the inventive concept, the lower impurity regions LIR may horizontally extend from one sidewall of the active region adjacent to the undercut region UCR to another sidewall facing the one sidewall. Accordingly, the lower impurity region LIR, and upper and lower regions disposed thereover and thereunder, respectively, may form a p-n-p structure or an n-p-n structure. The upper region of the active pattern ACT may be electrically isolated from the substrate SUB or the lower region of the active pattern ACT by the lower impurity region LIR. The lower impurity region LIR may form the third region R3 described with reference to FIG. 1.

The lower impurity region LIR may vertically extend from the undercut region UCR to the vicinity of the undersurface of the gate layer GL. When the impurities diffuse isotropically in the active pattern ACT, the lower impurity region LIR may have a round section doping profile, as illustrated in FIG. 15A. The distance between the top surface of the active pattern ACT and the lower impurity region LIR may be longer at a sidewall facing a sidewall adjacent to the undercut region UCT than at the sidewall adjacent to the undercut region UCT.

The lower wirings LW may be formed to fill the ditches DCH and the undercut regions UCR. As such, the lower wirings LW may be connected to the active patterns ACT or lower impurity regions LIR through the undercut regions UCR. The lower wirings LW may include a conductive material such as a metal layer. For example, the lower wiring LW may include at least one of barrier metal layers and a metal layer to be in ohmic contact with the lower impurity region LIR.

Referring to FIG. 4, upper bypass patterns UBP are formed on some of the lower bypass patterns LBP in operation S16, and thereafter plug insulation patterns PIP are formed on the upper bypass patterns UBP in operation S17.

Figure 16A:
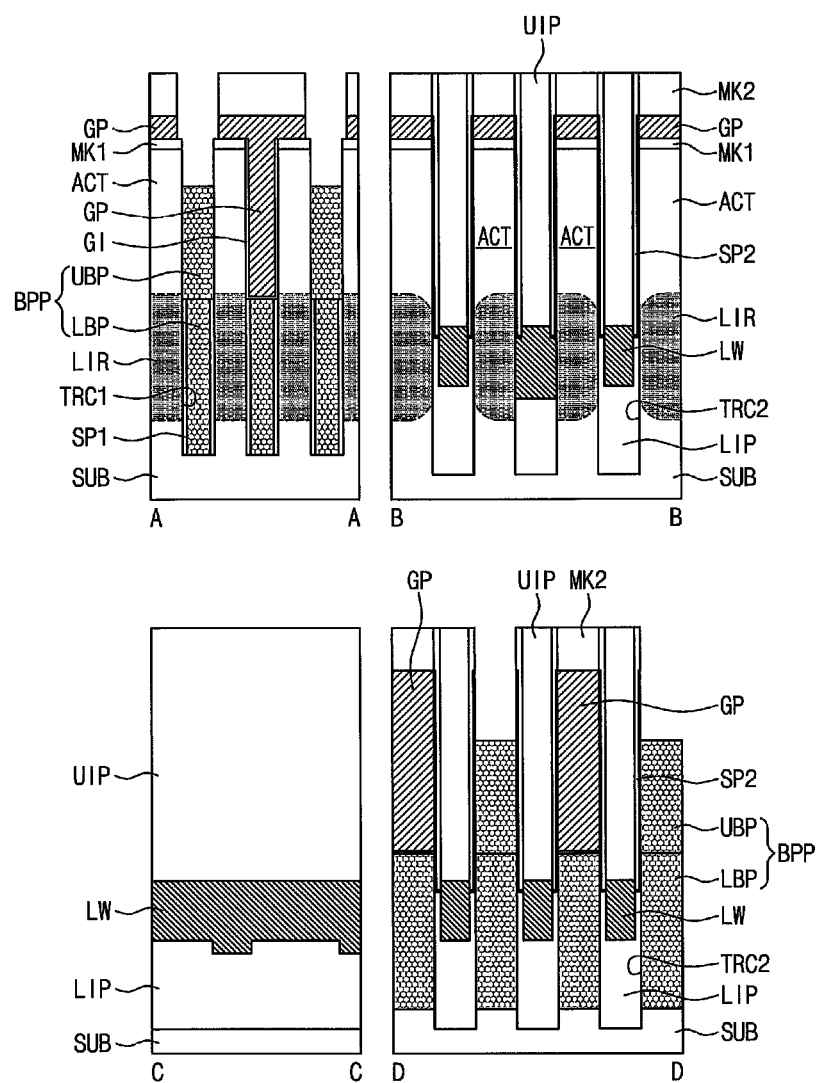
Figure 16B:
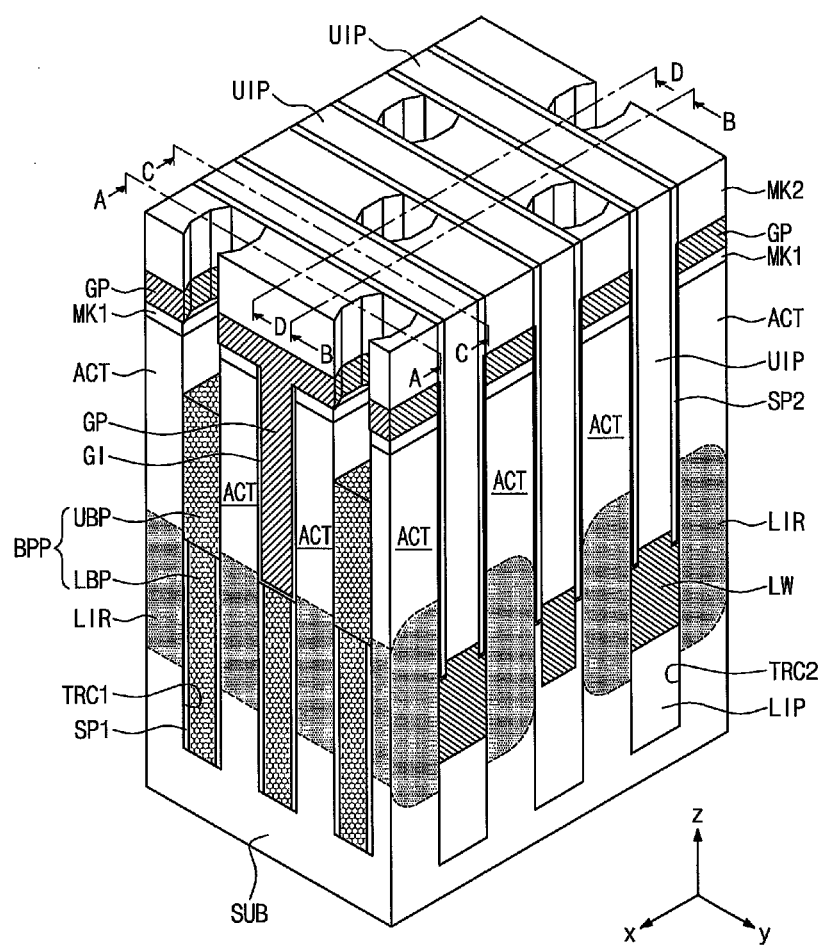

The upper bypass patterns UBP may be formed by patterning the gate layer GL to form holes in the first trenches TRC1, forming an upper bypass layer filling the holes, and etching the upper bypass layer until upper sidewalls of the holes are exposed. The holes are formed to expose the top surface of the lower bypass pattern LPB disposed thereunder, and expose the sidewall of the active pattern ACT adjacent thereto. Thus, as illustrated in FIGS. 16A and 16B, the upper bypass layer or upper bypass patterns UBP are in direct contact with the exposed sidewall of the active pattern ACT and the top surface of the lower bypass pattern LBP.

Figure 17A:
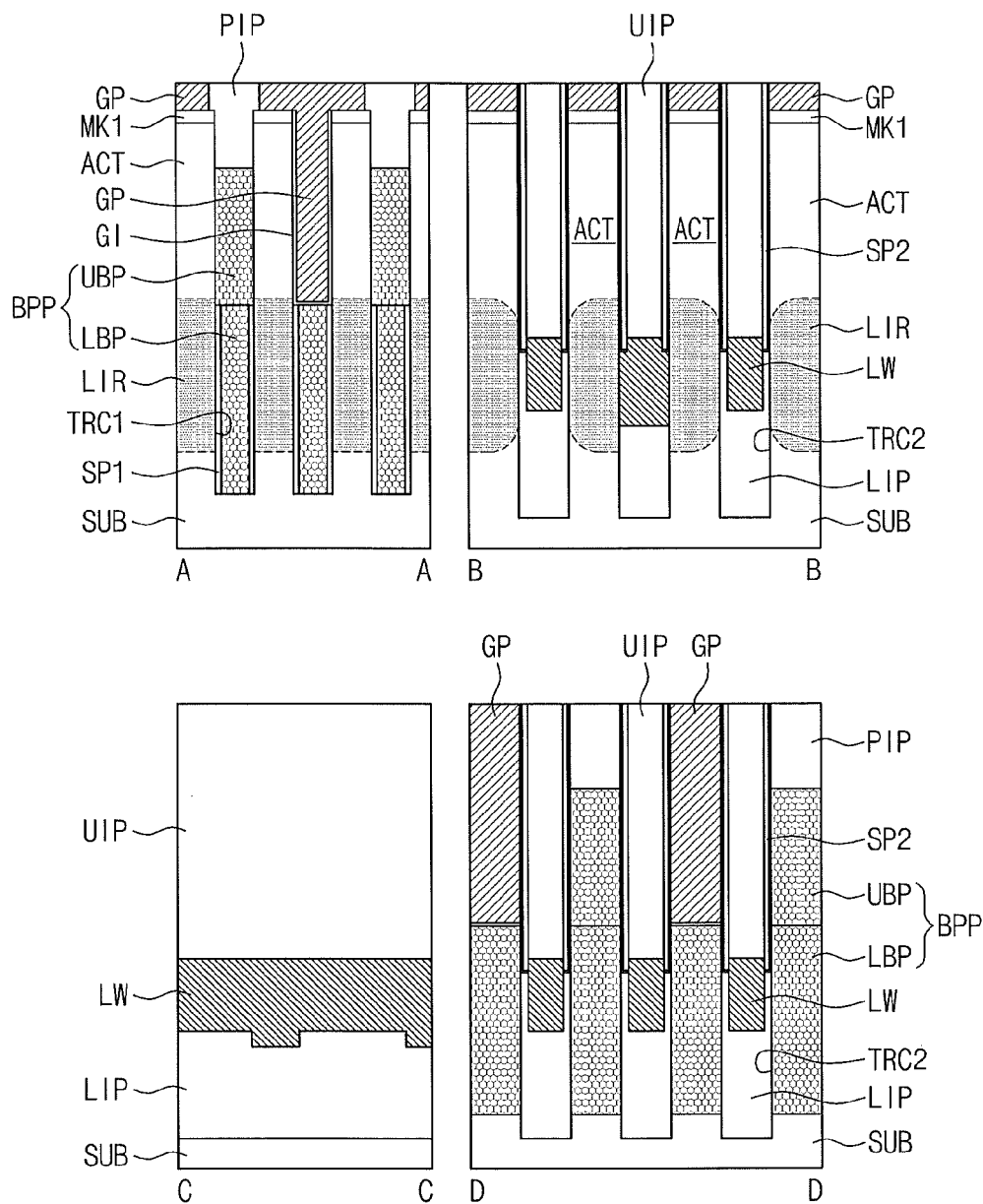
Figure 17B:
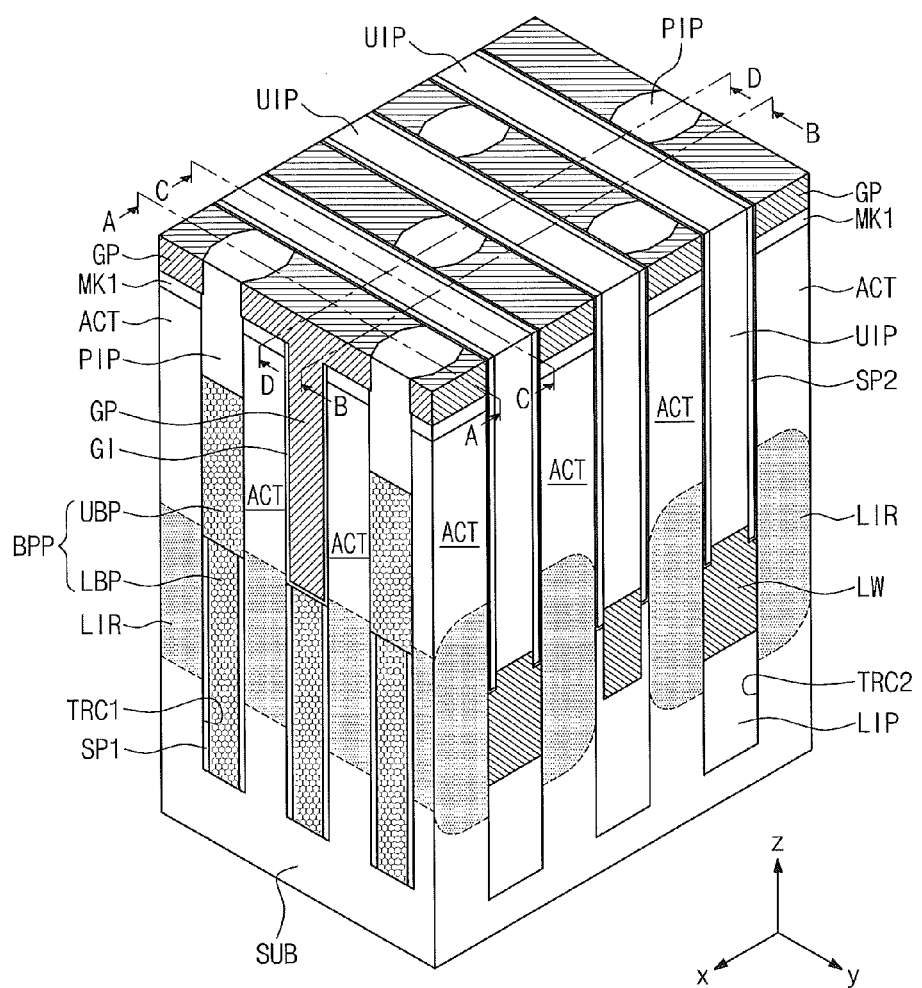

The plug insulation patterns PIP may be formed to fill the holes formed in the upper bypass pattern UBP, as illustrated in FIGS. 17A and 17B. The forming of the plug insulation pattern PIP may include forming a plug insulation layer filling the holes, and planarization-etching the plug insulation layer. As a result of the planarization-etching, the top surface of the gate pattern GP may be exposed according to an embodiment of the inventive concept.

Prior to forming of the upper bypass pattern UBP, upper insulation patterns UIP may be further formed to fill the second trenches TRC2 where the under wirings LW are formed. According to an embodiment of the inventive concept, the plug insulation pattern PIP and the upper insulation pattern UIP may be a silicon oxide layer. During the operations S16 and S17, the gate layer GL is divided in the y-direction by the holes or plug insulation patterns PIP, thereby forming the gate patterns GP.

The center points of the upper bypass patterns UBP and the plug insulation patterns PIP may be positioned in regions which are included in the first trenches TRC1 but not included in the second trenches TRC2. A distance between the center points of the plug insulation patterns PIP, which is measured along the y-direction may be twice the pitch of the active pattern ACT. That is, among spaces formed between the active patterns ACT (hereinafter, referred to as 'first group') having the same x-coordinate and arranged in the y-direction, the upper bypass patterns UBP and the plug insulation patterns PIP are disposed in the odd-numbered spaces, and the gate patterns GP remain in the even-numbered spaces.

The active patterns ACT adjacent to the first group, which have the same x-coordinate and are arranged in the y-direction, may form a second group. In this case, among spaces formed between the active patterns ACT of the second group, the gate patterns GP remain in the odd-numbered spaces and the upper bypass patterns UBP and the plug insulation patterns PIP are disposed in the even-numbered spaces. That is, the upper bypass patterns UBP and the gate patterns GP may be disposed in a checkerboard form, and the upper bypass patterns UBP and the gate patterns GP do not overlap each other. FIGS. 16B and 17B illustrate such a relative arrangement among the upper bypass patterns UBP, the plug insulation patterns PIP and the gate patterns GP.

Referring to FIG. 4, in operation S18, upper wirings UW connected to the gate patterns GP are formed. The upper wirings UW may be formed to connect the gate patterns GP while crossing the lower wirings LW or the second trenches TRC2.

Figure 18A:
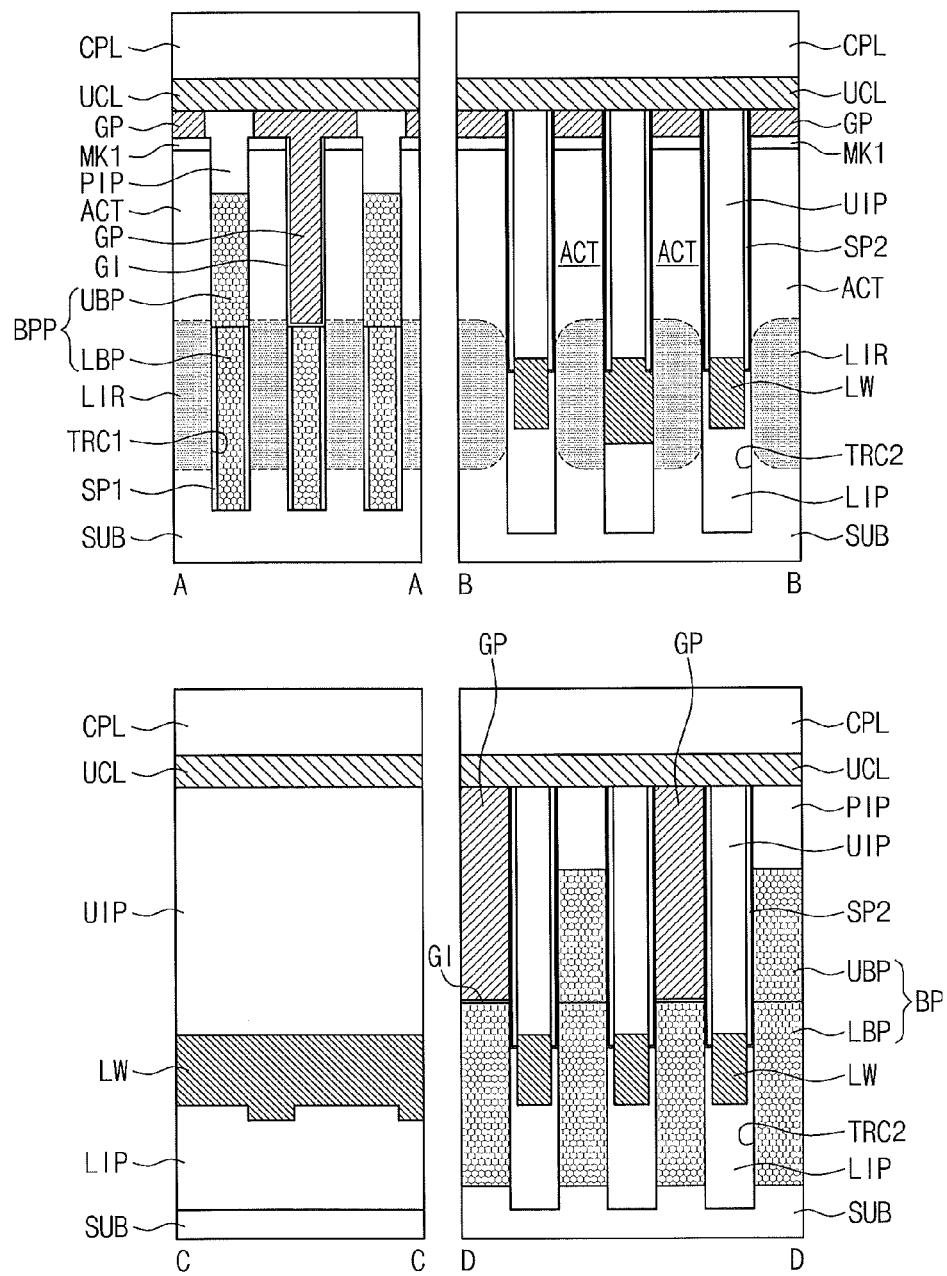
Figure 18B:
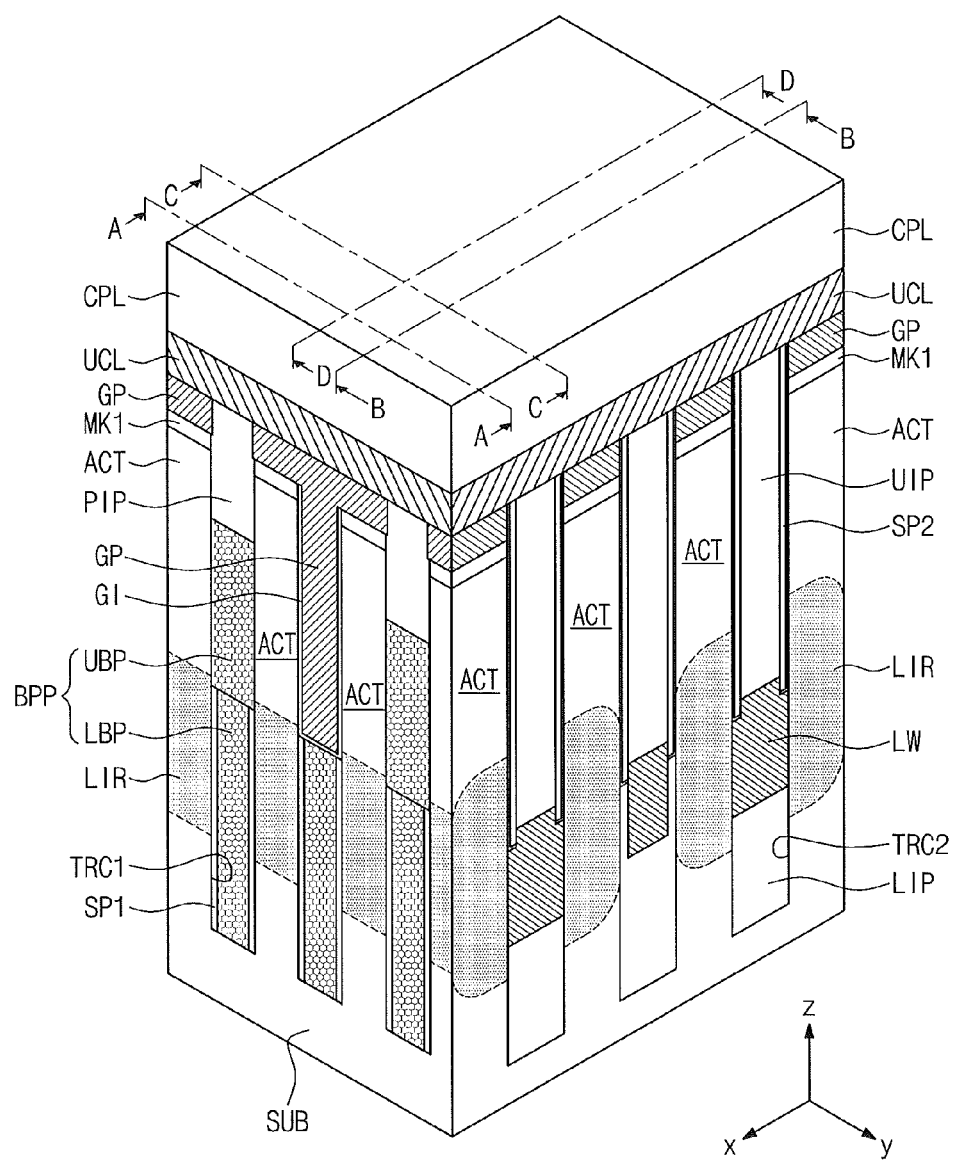
Figure 19A:
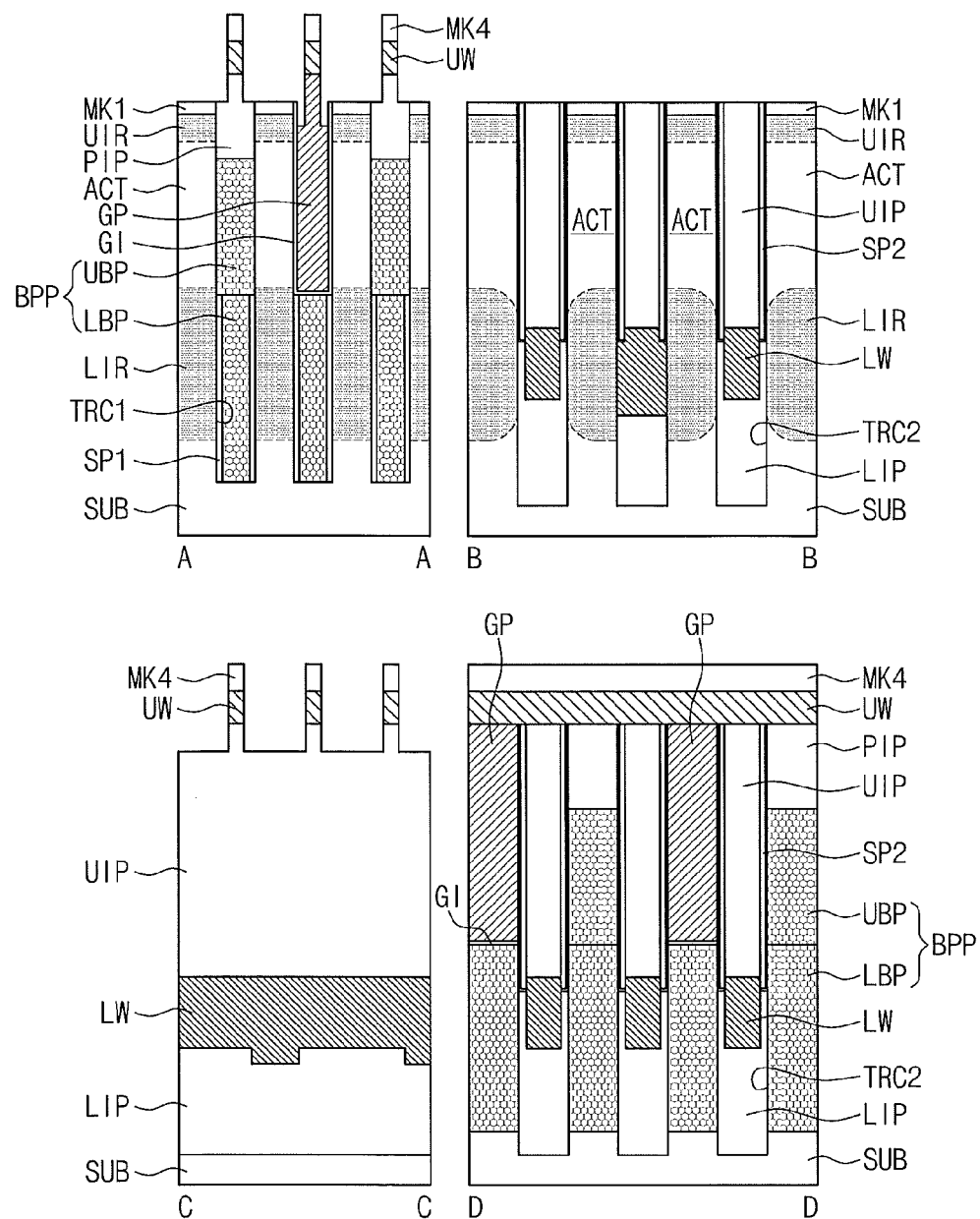
Figure 19B:
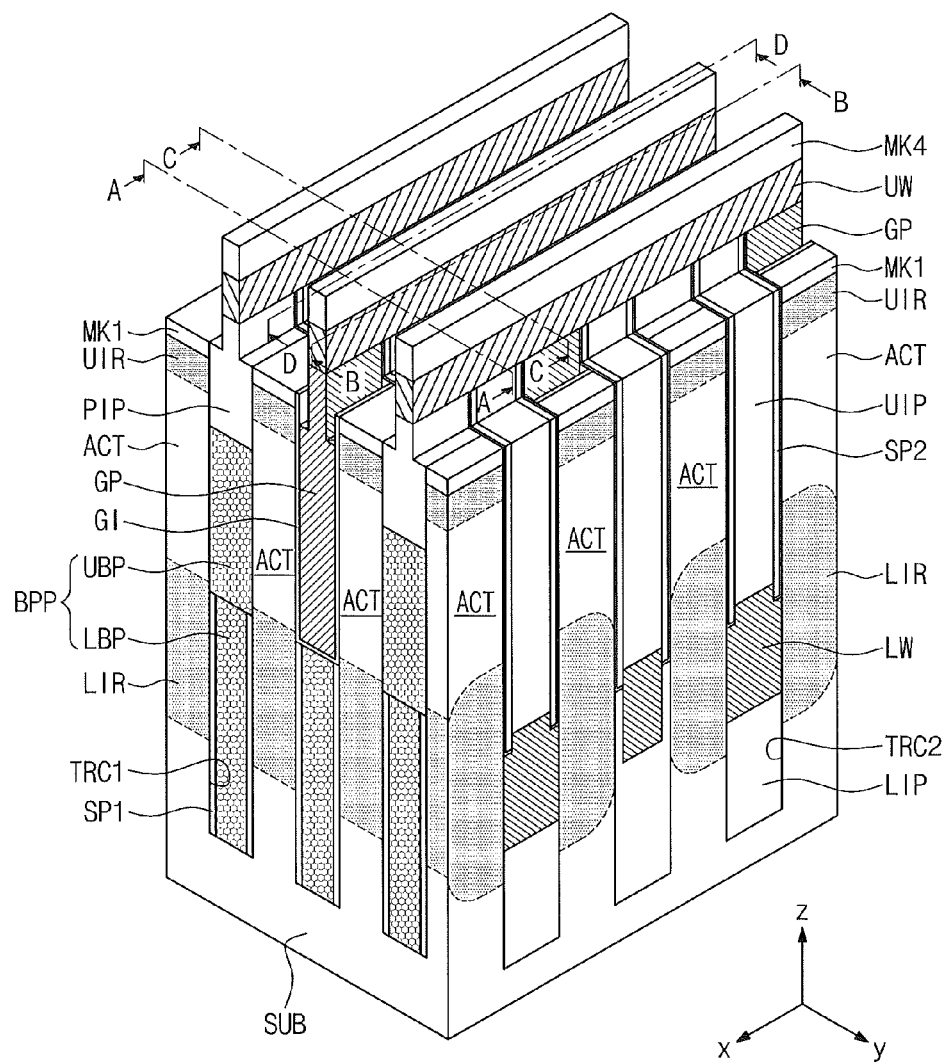

The forming of the upper wirings UW may include sequentially forming an upper conductive layer UCL and a capping layer CPL on the resultant structure with the plug insulation patterns PIP formed, as illustrated in FIGS. 18A and 18B, and patterning the upper conductive layer UCL and the capping layer CPL to form the upper wiring and a fourth mask pattern MK4 which are stacked in sequence, as illustrated in FIGS. 19A and 19B. The upper conductive layer UCL may include at least one of metallic materials, metal nitrides, or silicide materials. The capping layer CPL or the fourth mask pattern MK4 may be formed of a material (e.g., silicon nitride) that may be used as an etch mask during the patterning of the upper conductive layer UCL.

According to embodiments, the upper wiring UW may be formed to have a width smaller than the active pattern ACT. Accordingly, the top surface of the gate pattern GP is recessed at both sides of the four mask pattern MK4, and thus may be lower than the top surface of the active pattern ACT. Accordingly, a portion of the gate pattern GP extending over the active pattern ACT may be removed. In an embodiment, the first mask pattern MK1 may be removed to expose the top surface of the active pattern ACT during the forming of the upper wiring UW.

According to an embodiment of the inventive concept, after the upper wiring UW is formed, upper impurity regions UIR may be formed by doping an upper region of the active pattern ACT with impurities having different conductive type from the substrate SUB, as illustrated in FIGS. 19A and 19B. The upper impurity regions UIR may be formed by an ion implantation process using the fourth mask pattern MK4 as an ion mask.

The upper impurity region UIR may form the first region R1 described with reference to FIG. 1, and a portion of the active pattern ACT positioned between the upper impurity region UIR and the lower impurity region LIR may form a second region R2 described with reference to FIG. 1. According to an embodiment of the inventive concept, the upper bypass pattern UBP may be in contact with the sidewall of the active pattern ACT in the second region R2. The top surface of the upper bypass pattern UBP may be formed lower than an interface between the first and second regions R1 and R2.

Referring to FIG. 4, in operation S19, memory elements ME connected to the impurity regions UIR are formed. The operation S19 may include forming a third spacer SP3 covering sidewalls of the fourth mask pattern MK4 and upper wirings UW, and forming plugs PLG connected to the upper impurity regions UIR and the memory elements ME connected to the plugs PLG.

Figure 20A:
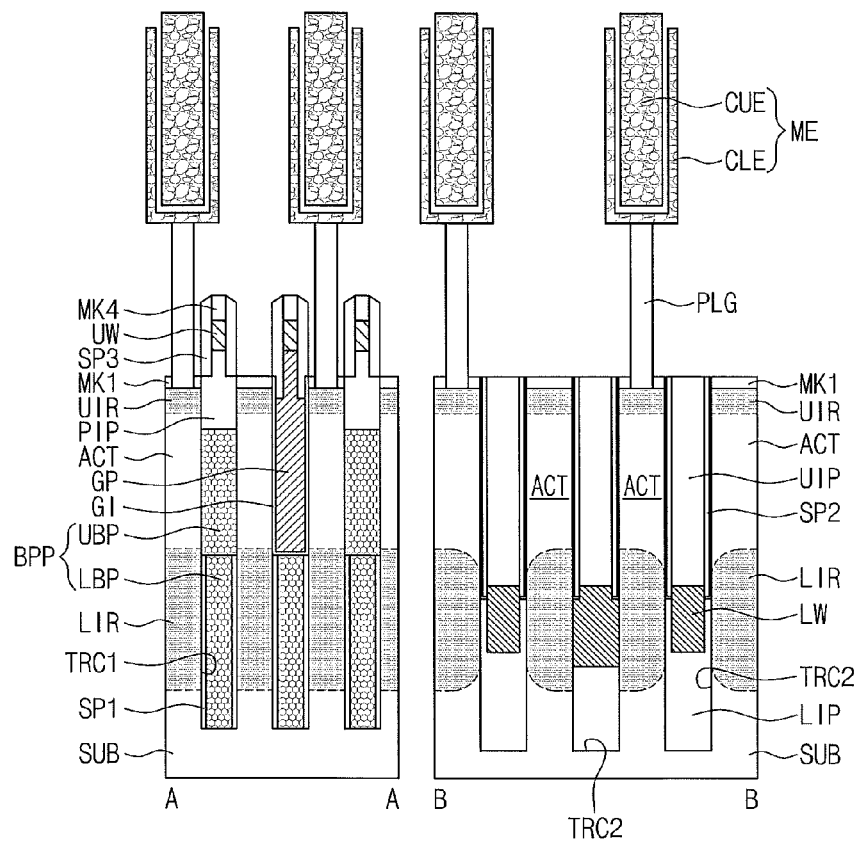
Figure 20A:
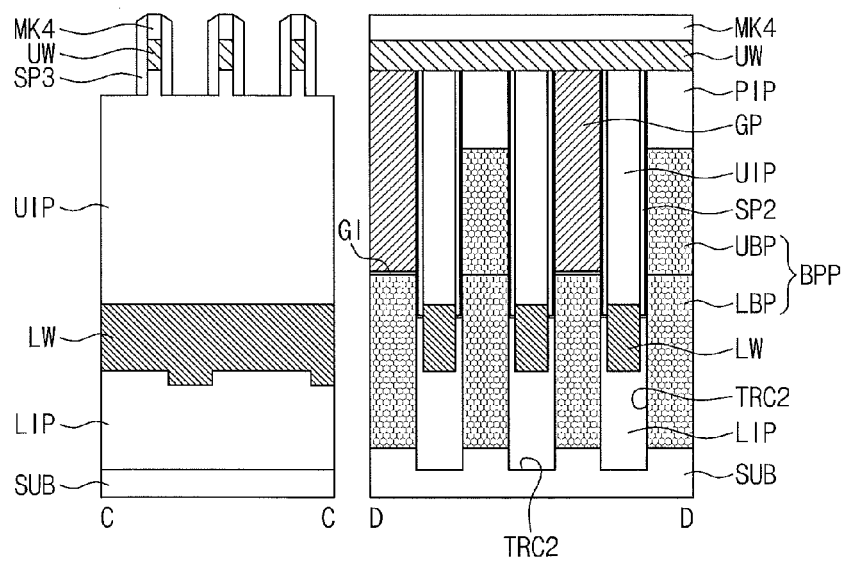
Figure 20B:
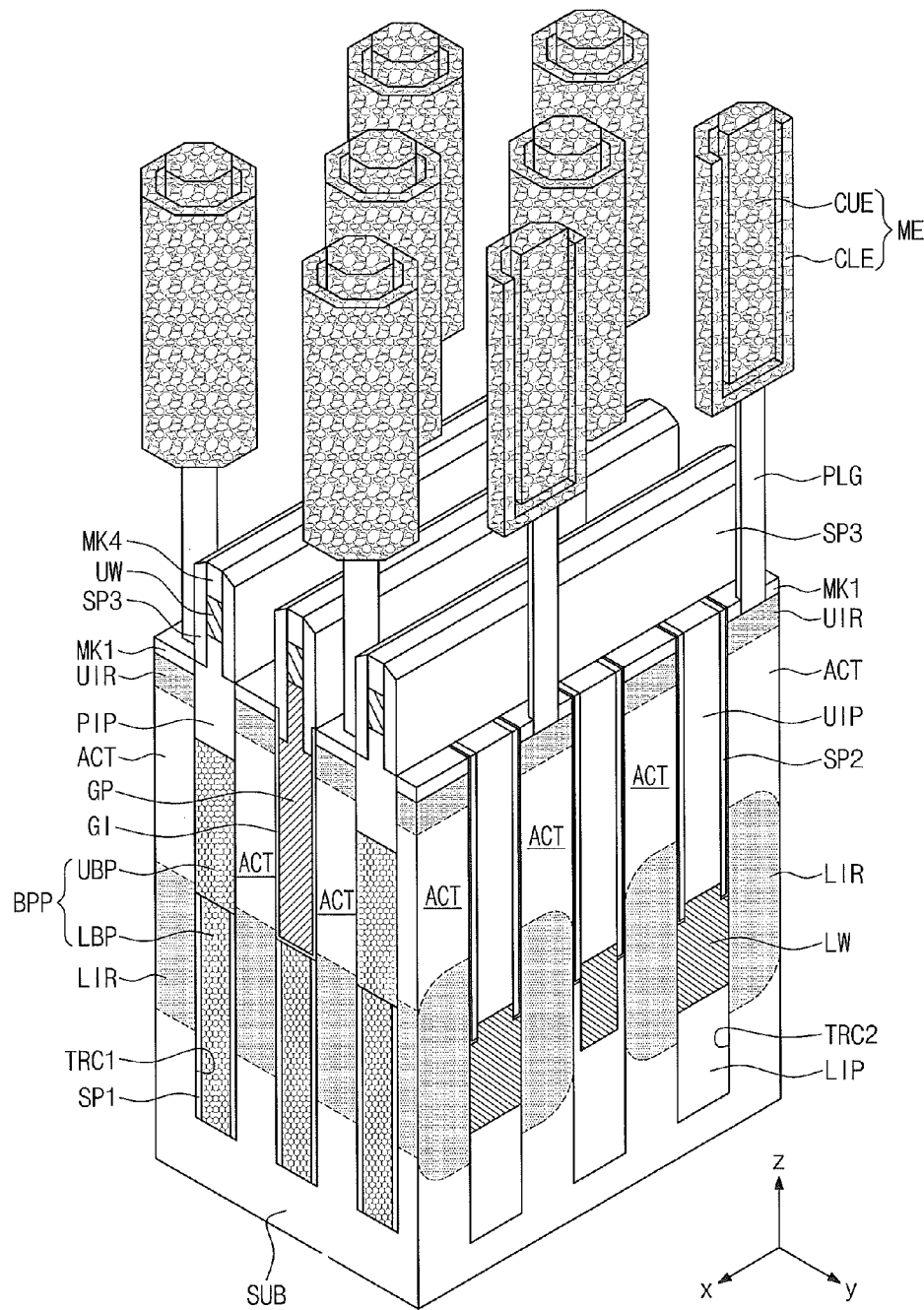

As illustrated in FIGS. 20A and 20B, the memory element ME may be a capacitor including a capacitor lower electrode CLE connected to the upper impurity region UIR through the plug PLG, and a capacitor upper electrode CUE facing the capacitor lower electrode CLE. According to an embodiment, the memory element ME may be a capacitor, a ferroelectric capacitor, a magnetic tunnel junction (MJT), a variable resistance element, or a memory element based on charge storing mechanism. According to an embodiment, the upper impurity regions UIR may be formed after the third spacer SP3 is formed.

Figure 62:
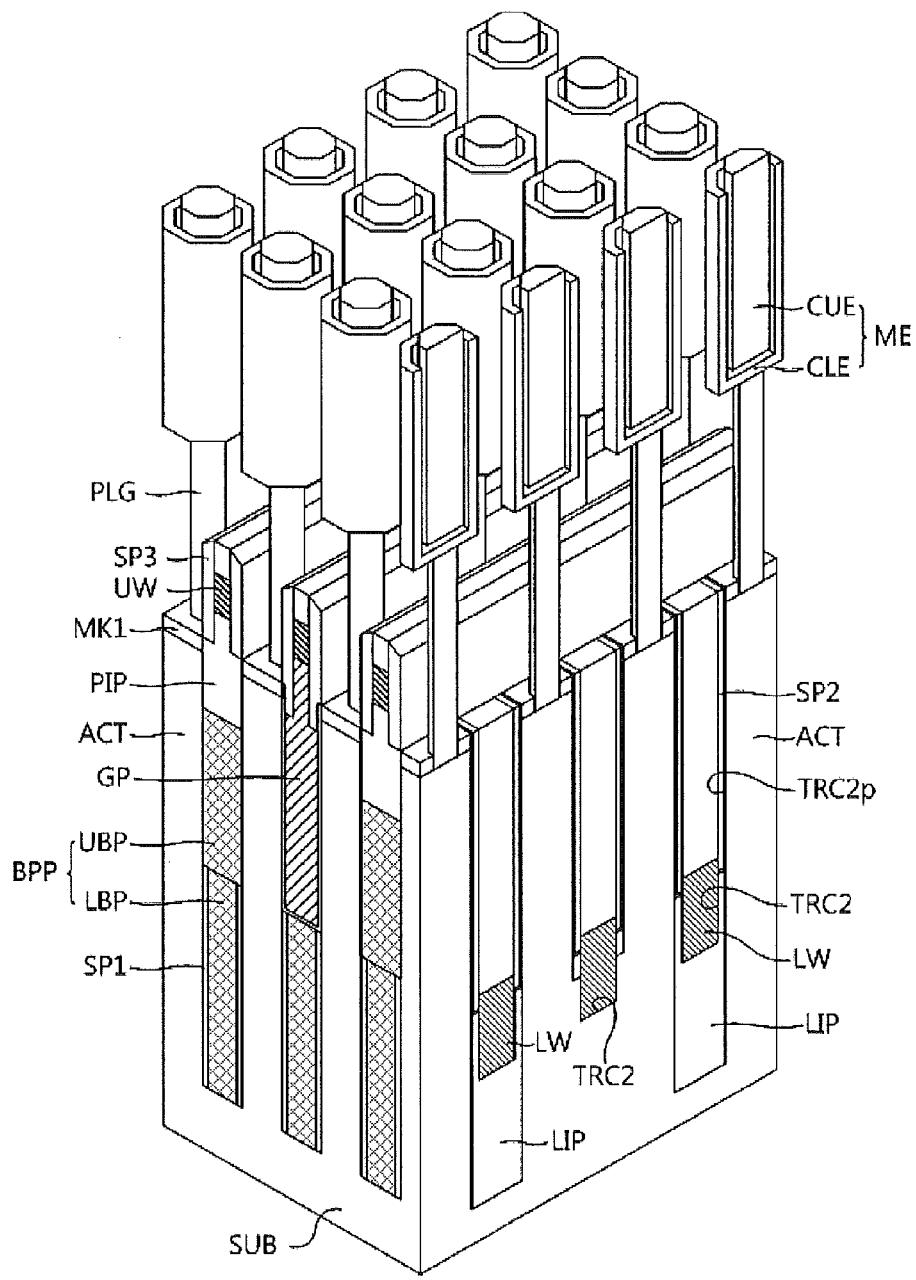

According to an embodiment of the inventive concept, the plugs PLG may be respectively formed over the active patterns ACT, as illustrated in FIG. 62. That is, the number of the plugs PLG or memory elements ME may be equal to the number of the active patterns ACT included in the same area.

Figure 24:
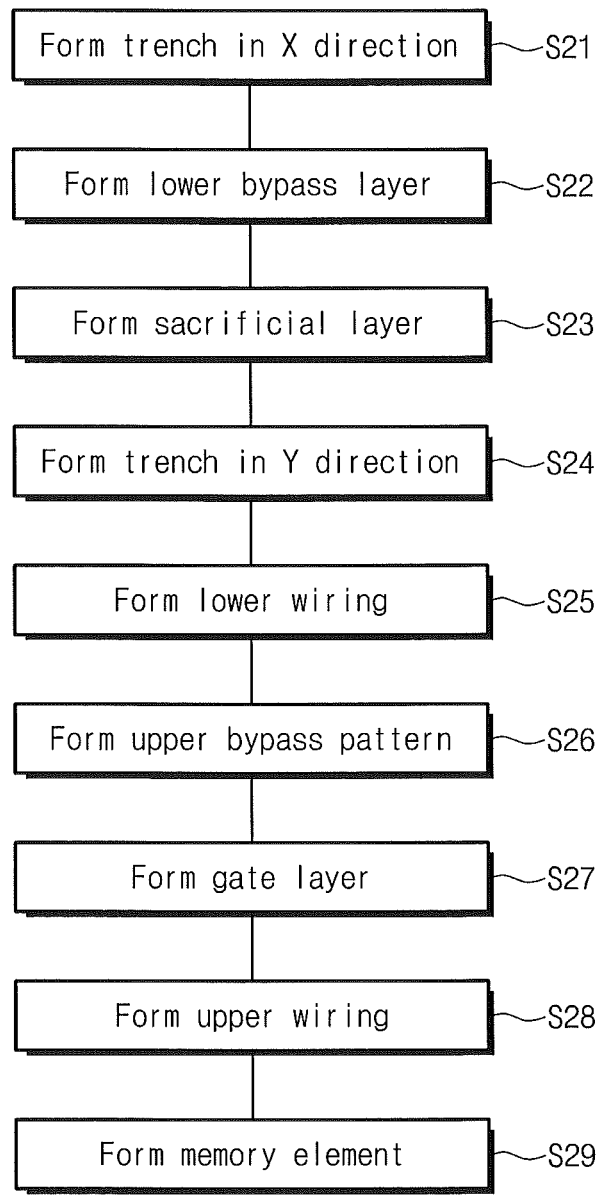
FIG. 24 is a flowchart illustrating a method of fabricating a semiconductor device according to an embodiment of the inventive concept.

FIG. 24 is a flowchart illustrating a method of fabricating a semiconductor device according to an embodiment of the inventive concept. FIGS. 25A to 33A are sectional views illustrating a method of fabricating a semiconductor device according to the embodiment of the inventive concept described with reference to FIG. 24. FIGS. 25B to 33B are perspective views illustrating a method of fabricating a semiconductor device according to the embodiment of the inventive concept described with reference to FIG. 24.

The embodiment described with reference to FIG. 24 gate patterns are formed through a damascene process. Except for differences in the fabrication method caused by such a difference, the current embodiment may be implemented based on or by modifying the fabrication method of the embodiment described with reference to FIG. 4.

Referring to FIG. 24, first trenches TRC1 having a major axis in the x-direction are formed by patterning a substrate SUB in operation S21, and thereafter a lower bypass layer LBL is formed to fill lower regions of the first trenches TRC1 in operation S22. The first trenches TRC1 and the lower bypass layer LBL may be formed using the substantially same method described with reference to FIGS. 5A to 7A. Accordingly, first mask patterns MK1 defining the first trenches TRC1 may be formed on the substrate SUB, and first spacers SP1 may be formed between the first trench TRC1 and sidewalls of the lower bypass layer LBL.

Figure 25A:
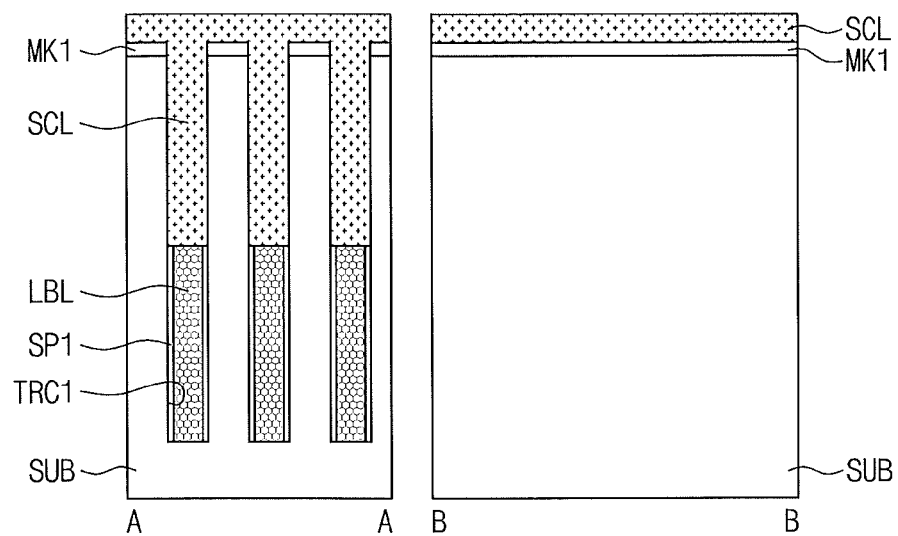
Figure 25A:
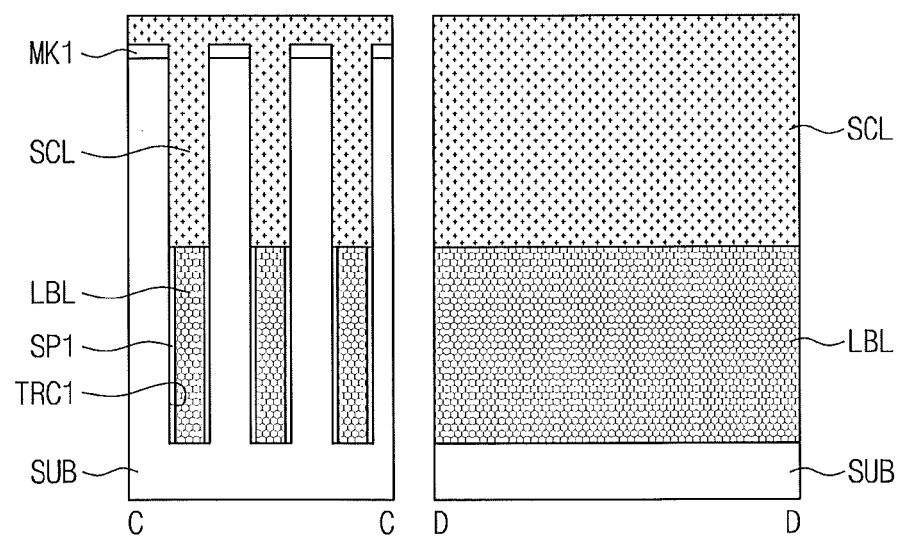
Figure 25B:
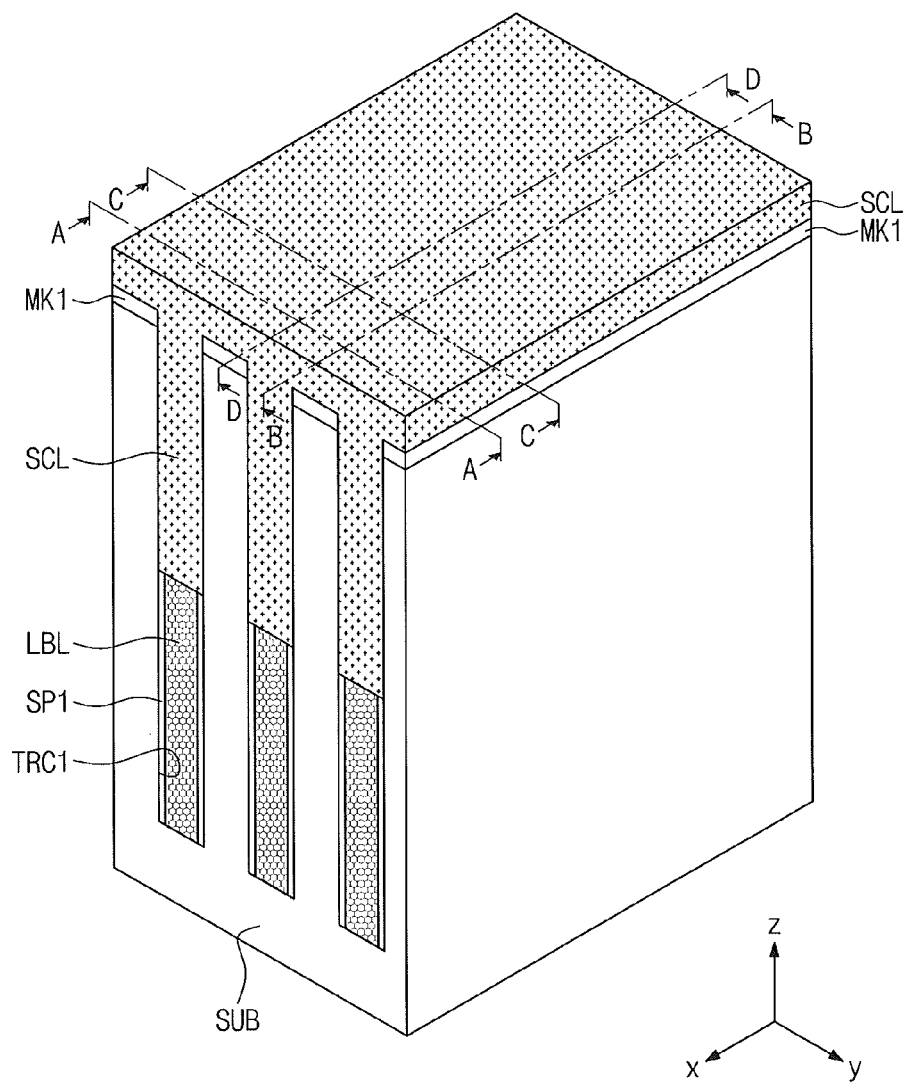

Thereafter, as illustrated in FIGS. 25A and 25B, a sacrificial layer SCL is formed to fill upper regions of the first trenches TRC1 in operation S23. The sacrificial layer SCL may be formed of one of insulation materials. For example, the sacrificial layer SCL may be a silicon oxide layer or silicon nitride layer. According to an embodiment, prior to forming of the sacrificial layer SCL, a process of forming a thermal oxidation layer covering the sidewall of the first trench TRC1 may be further performed. In this case, the thermal oxidation layer may be interposed between the sacrificial layer SCL and the first trench TRC1. In an embodiment, the operation of forming the thermal oxidation layer may be omitted.

Figure 26A:
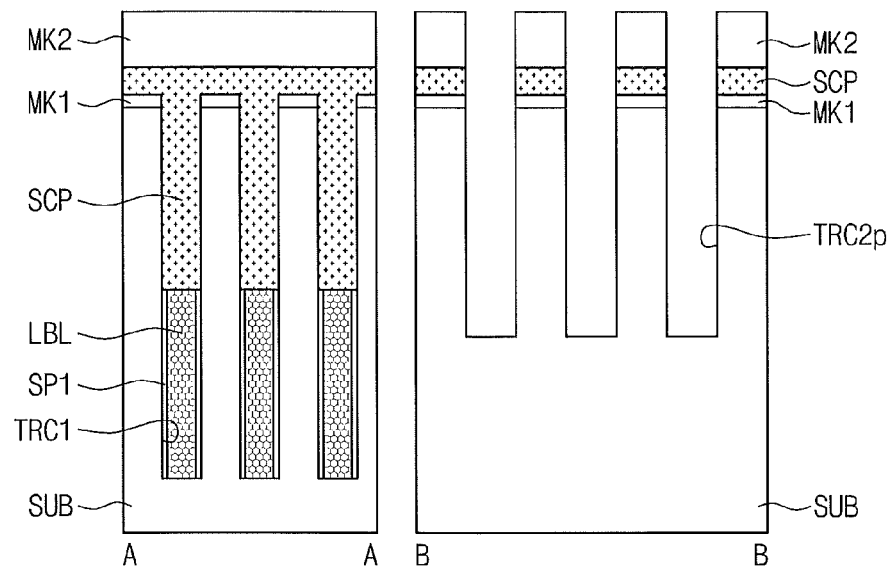
Figure 26A:
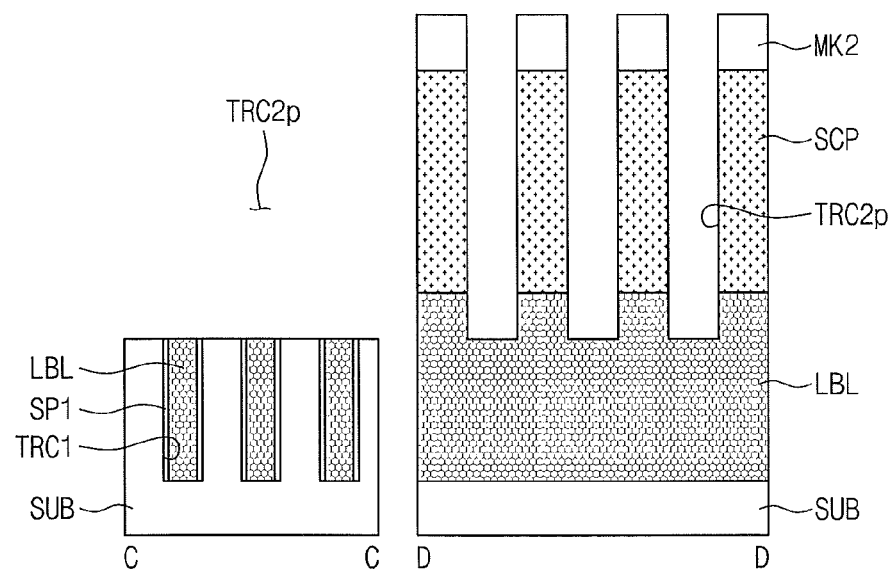
Figure 26B:
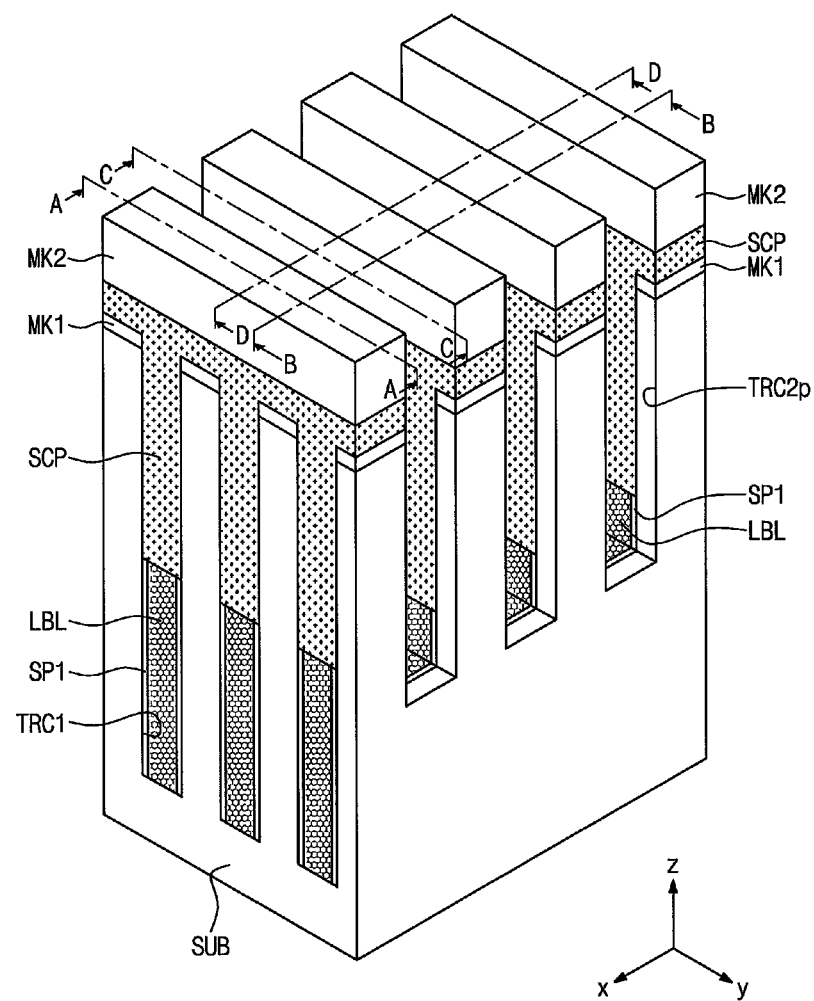
Figure 27A:
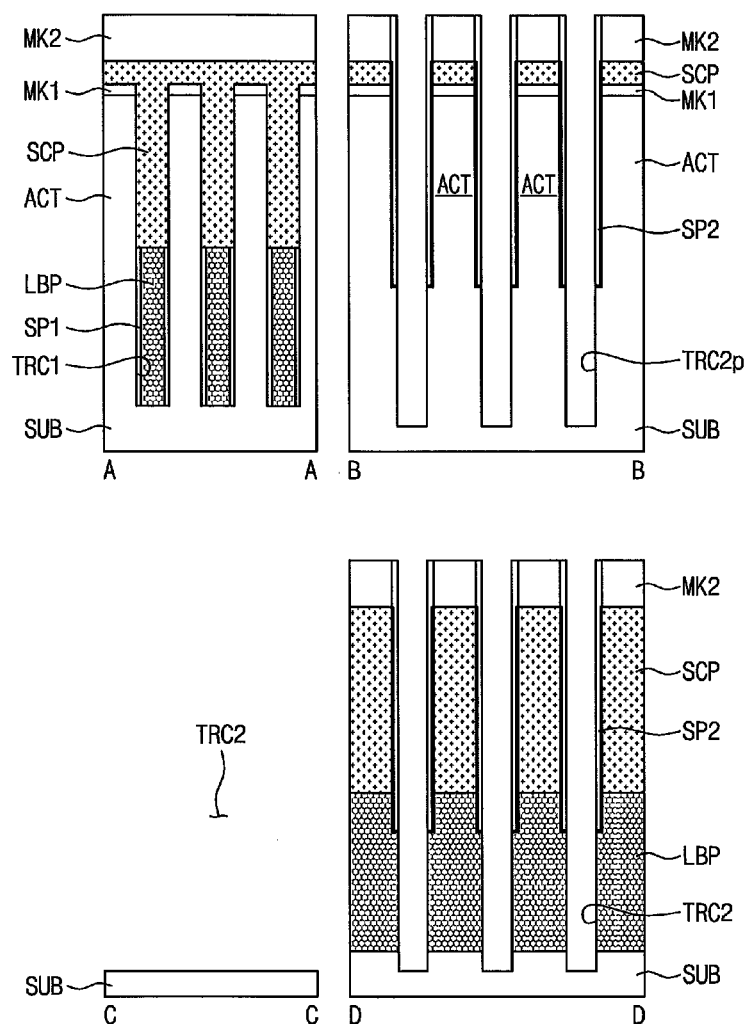
Figure 27B:
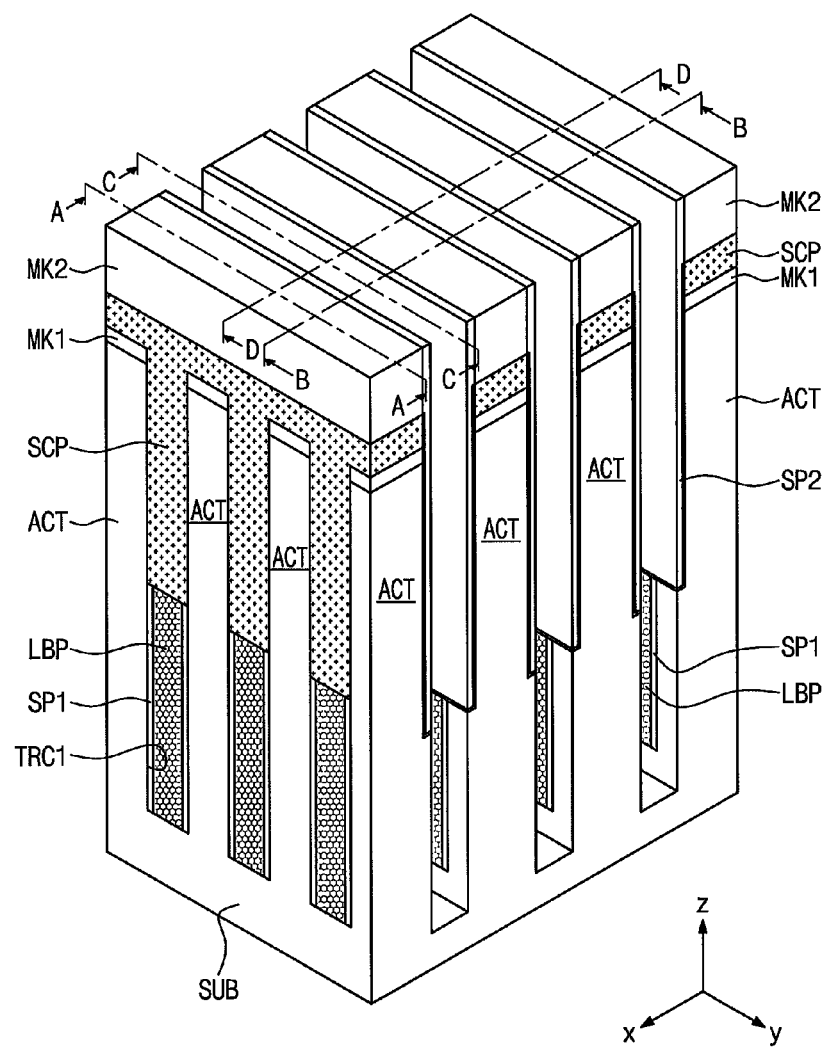

Afterwards, second mask patterns MK2 having a major axis crossing the first trenches TRC1 are formed, and then the sacrificial layer SCL, the substrate SUB and the lower bypass layer LBL are patterned using the second mask pattern as an etch mask. Accordingly, in operation S24, second trenches TRC2 are formed, which define the sacrificial layer SCP, the active patterns ACT and the lower bypass patterns LBP, as illustrated in FIGS. 27A and 27B. In an embodiment, the operation S24 may further include forming preliminary trenches TRC2$p$ as illustrated in FIGS. 26A and 26B, and forming second spacers SP2 on sidewalls of the preliminary trenches TRC2$p$ as illustrated in FIGS. 27A and 27B. A series of operations of forming the second trenches TRC2 may be formed using the fabrication method described with reference to FIGS. 8A to 10A.

Figure 28A:
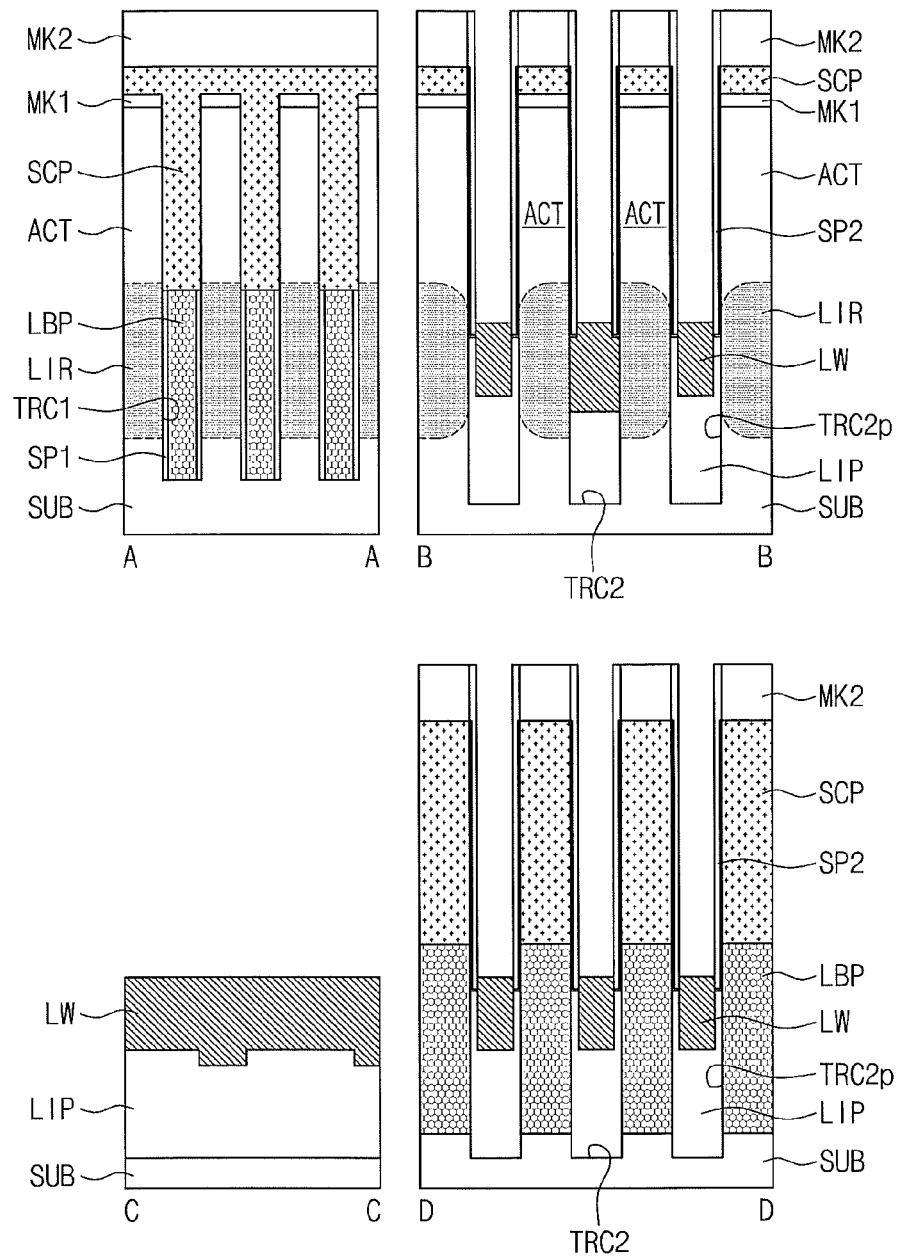
Figure 28B:
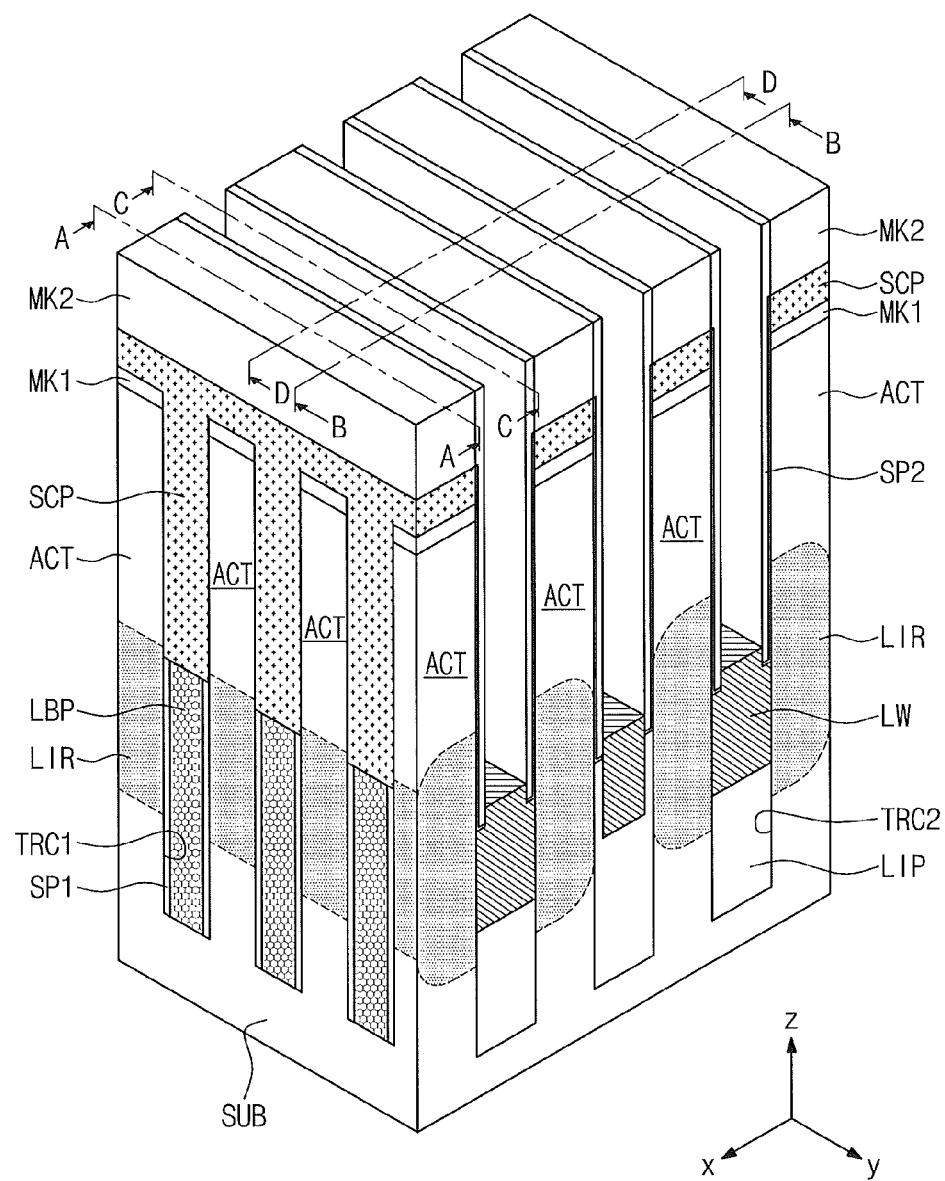

In operation S25, lower wirings LW are formed in the second trench TRC2. The operation S25 may be performed in the same manner as the embodiment described with reference to FIGS. 11A to 15A. In an embodiment, as illustrated in FIGS. 28A and 28B, lower insulation patterns LIP, which are used as a template for forming the lower wiring LW, may be formed under the lower wiring LW, and lower impurity regions LIR connected by the lower wirings LW may be formed in the lower regions of the active patterns ACT.

Figure 29A:
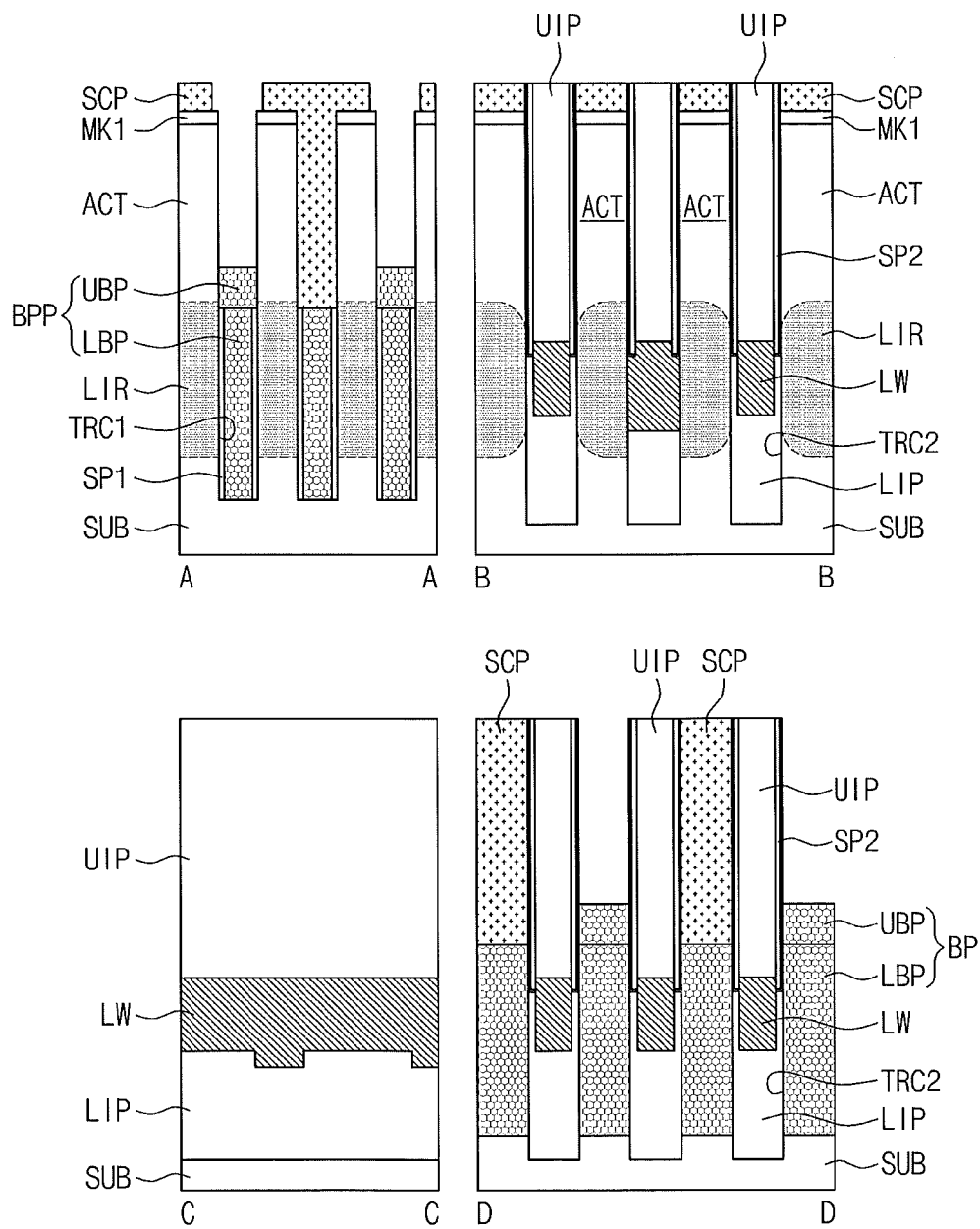

Upper insulation patterns UIP disposed on the lower wirings LW to fill the upper regions of the second trenches TRC2 are formed. Next, the sacrificial pattern SCP is patterned to form holes exposing top surfaces of some of the lower bypass patterns LBP, and thereafter, as illustrated in FIGS. 29A and 29B, upper bypass patterns UBP are formed in the holes in operation S26.

The holes are formed to expose the top surface of the lower bypass pattern LBP and the sidewall of the active pattern ACT adjacent thereto. Accordingly, as illustrated in FIGS. 29A and 29B, the upper bypass patterns UBP are in direct contact with the exposed sidewall of the active pattern ACT and the top surface of the lower bypass pattern LBP. The upper bypass patterns UBP may be in contact with the exposed sidewall of the active pattern ACT at a position higher than the lower impurity region LIR. In an embodiment, the thickness of the upper bypass pattern UBP (i.e., height difference between the top surface and the undersurface) may be variously changed.

Figure 29B:
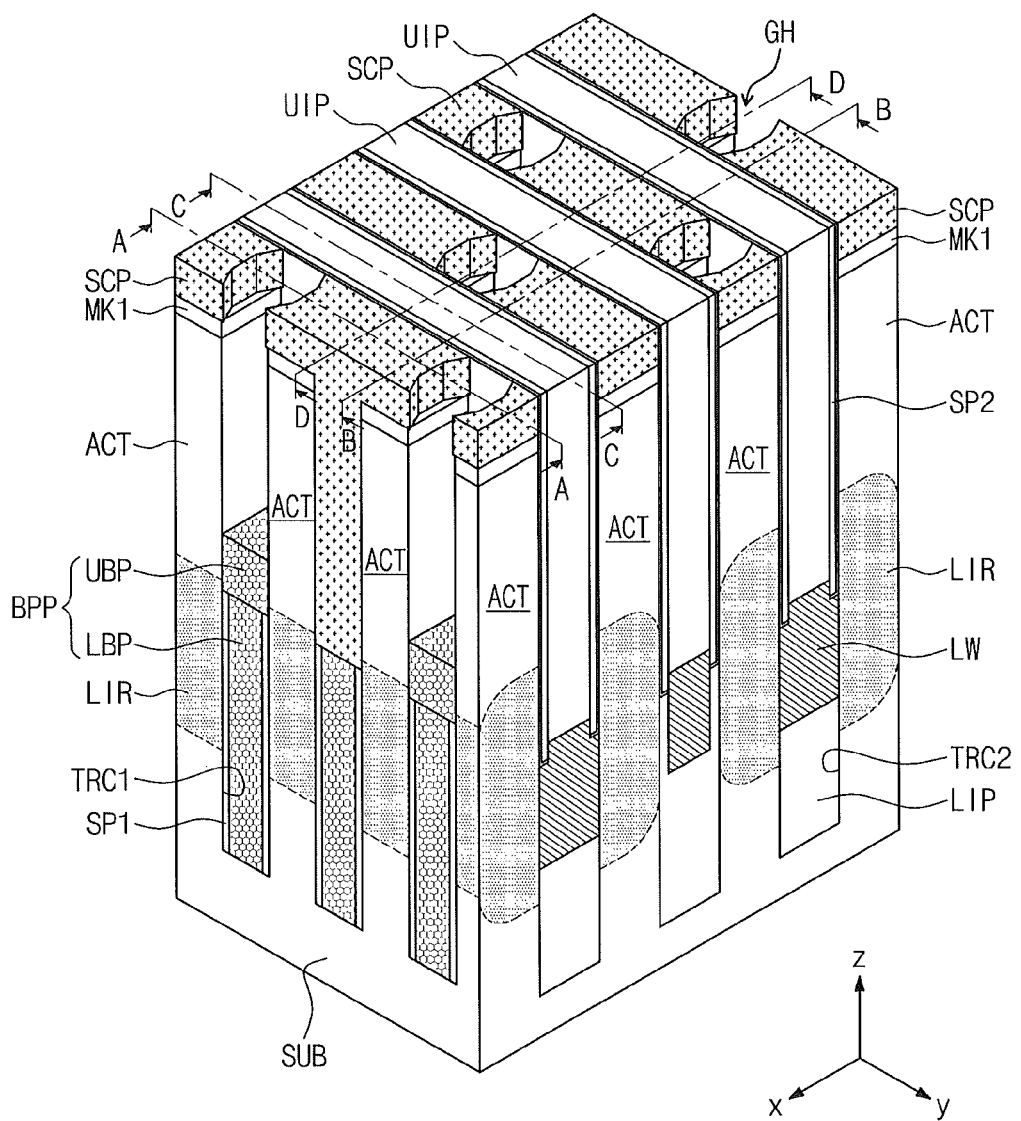

As illustrated in FIG. 29B, the holes may be formed at positions where the holes or plug insulation patterns PIP of the embodiment described with reference to FIG. 4 are formed. That is, the center points of the holes may be positioned in areas included in the first trenches TRC1 but not included in the second trenches TRC2.

Figure 30A:
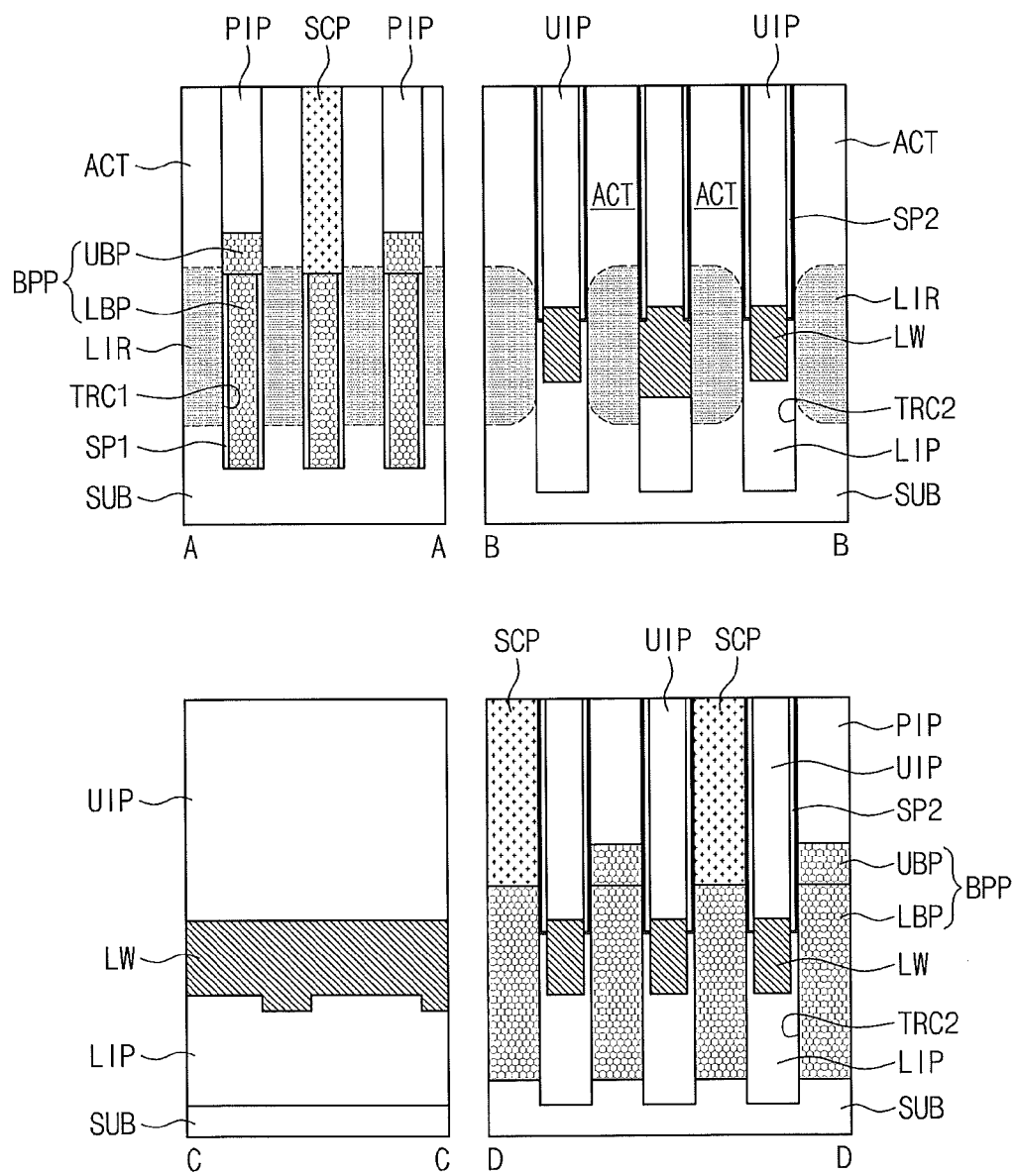
Figure 30B:
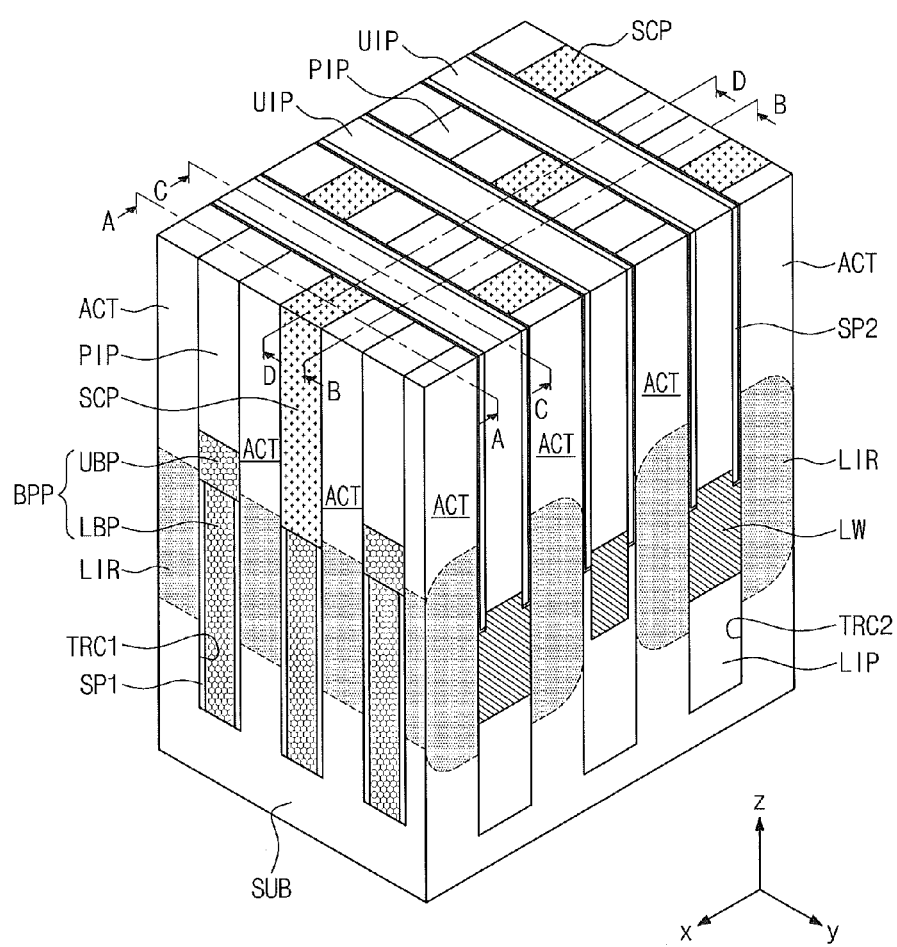

Subsequently, as illustrated in FIGS. 30A and 30B, plug insulation patterns PIP are formed to fill the respective holes with the upper bypass patterns UBP formed. The forming of the plug insulation patterns PIP may include forming a plug insulation layer filling the holes, and planarization-etching the plug insulation layer until the top surface of the sacrificial patterns SCP is exposed. Although the planarization etching may be performed until the top surface of the active pattern ACT is exposed, the inventive concept is not limited thereto. As a result of the planarization etching, the localized plug insulation patterns PIP are formed on the respective upper bypass patterns UBP.

The sacrificial patterns SCP may be formed of a material which can restrain the upper insulation patterns UIP from being etched and also be selectively removed. That is, the sacrificial patterns SCP have an etch selectivity. According to an embodiment, to realize the etch selectivity, the plug insulation patterns PIP and the upper insulation pattern UIP may be formed of the substantially same material (e.g., a silicon oxide layer or low-dielectric layers), and the sacrificial pattern SCP may be formed of another material (e.g., silicon nitride layer) differing from the material for the plug insulation patterns PIP and upper insulation pattern UIP.

Figure 31A:
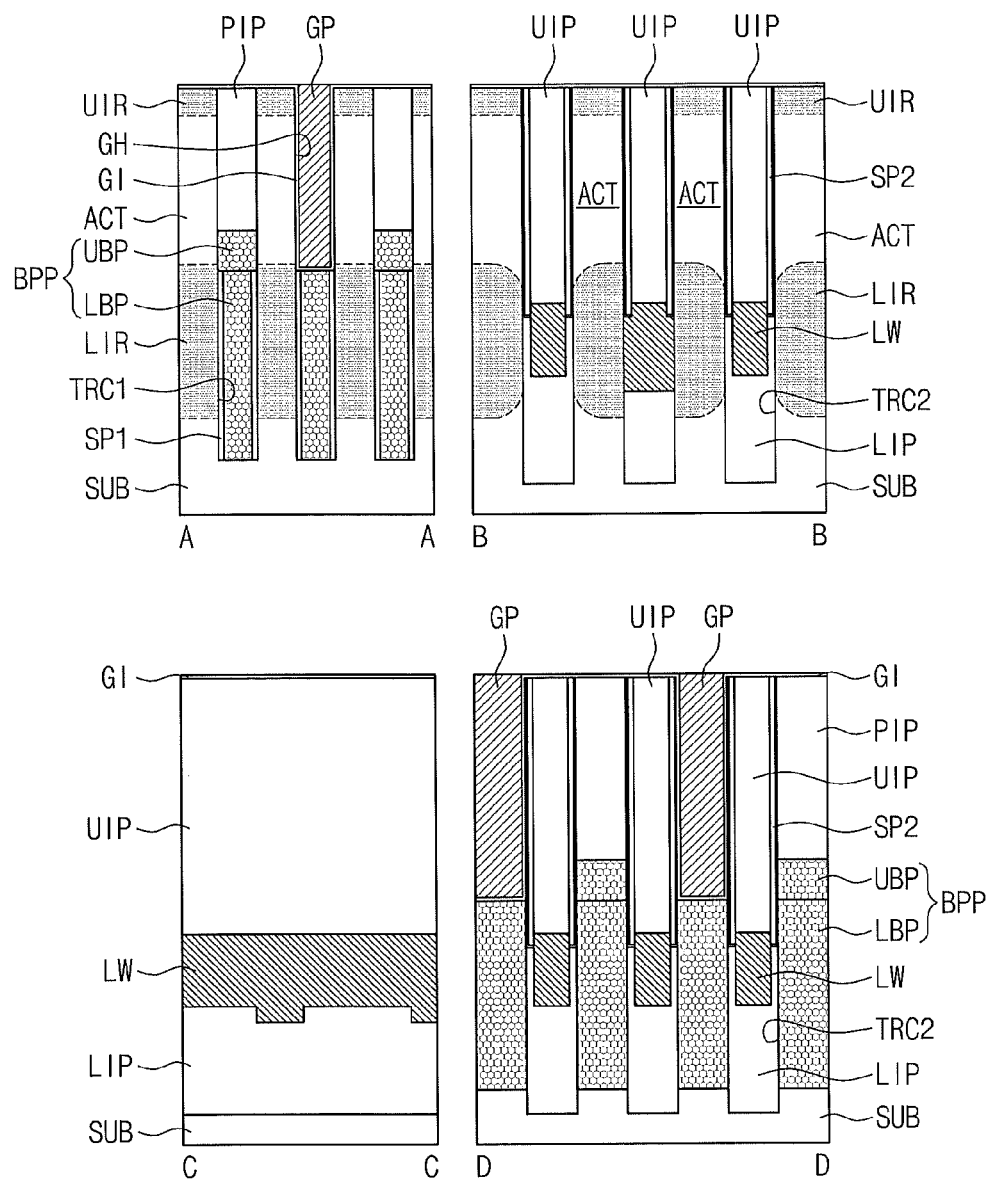
Figure 31B:
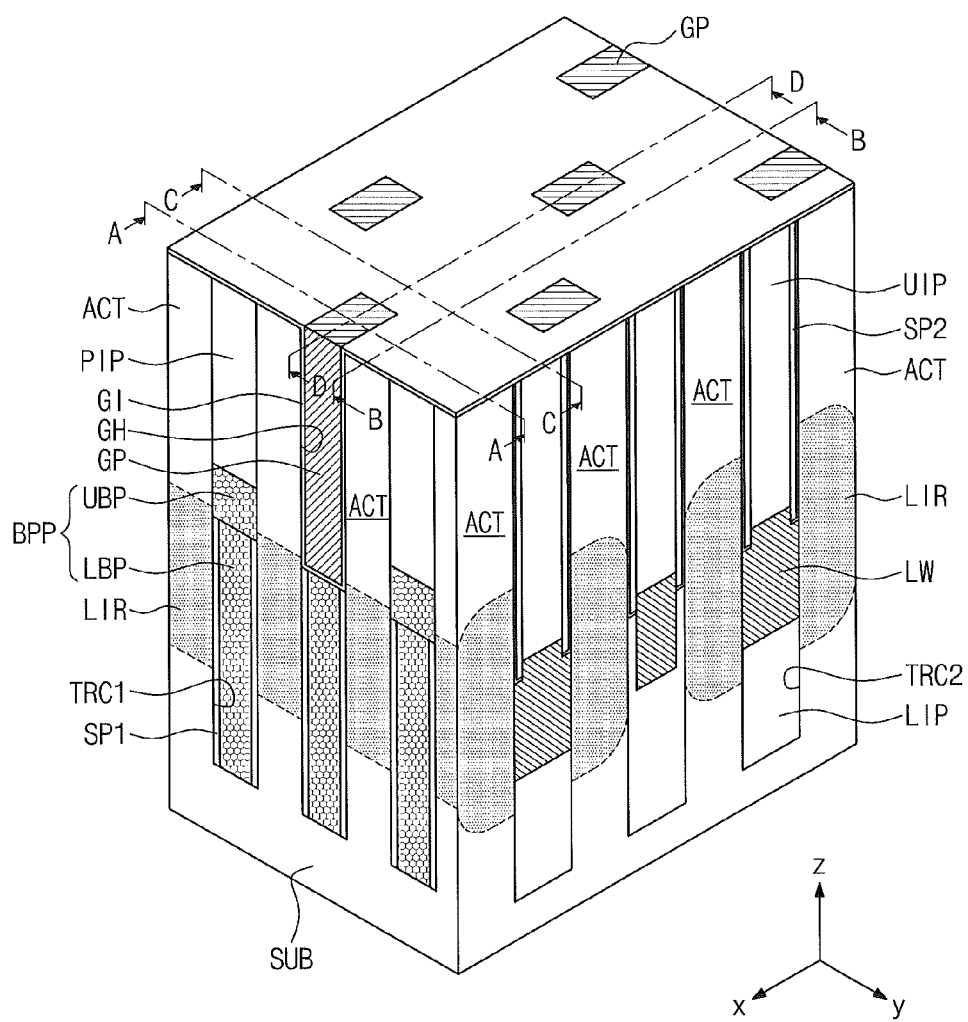
Figure 32A:
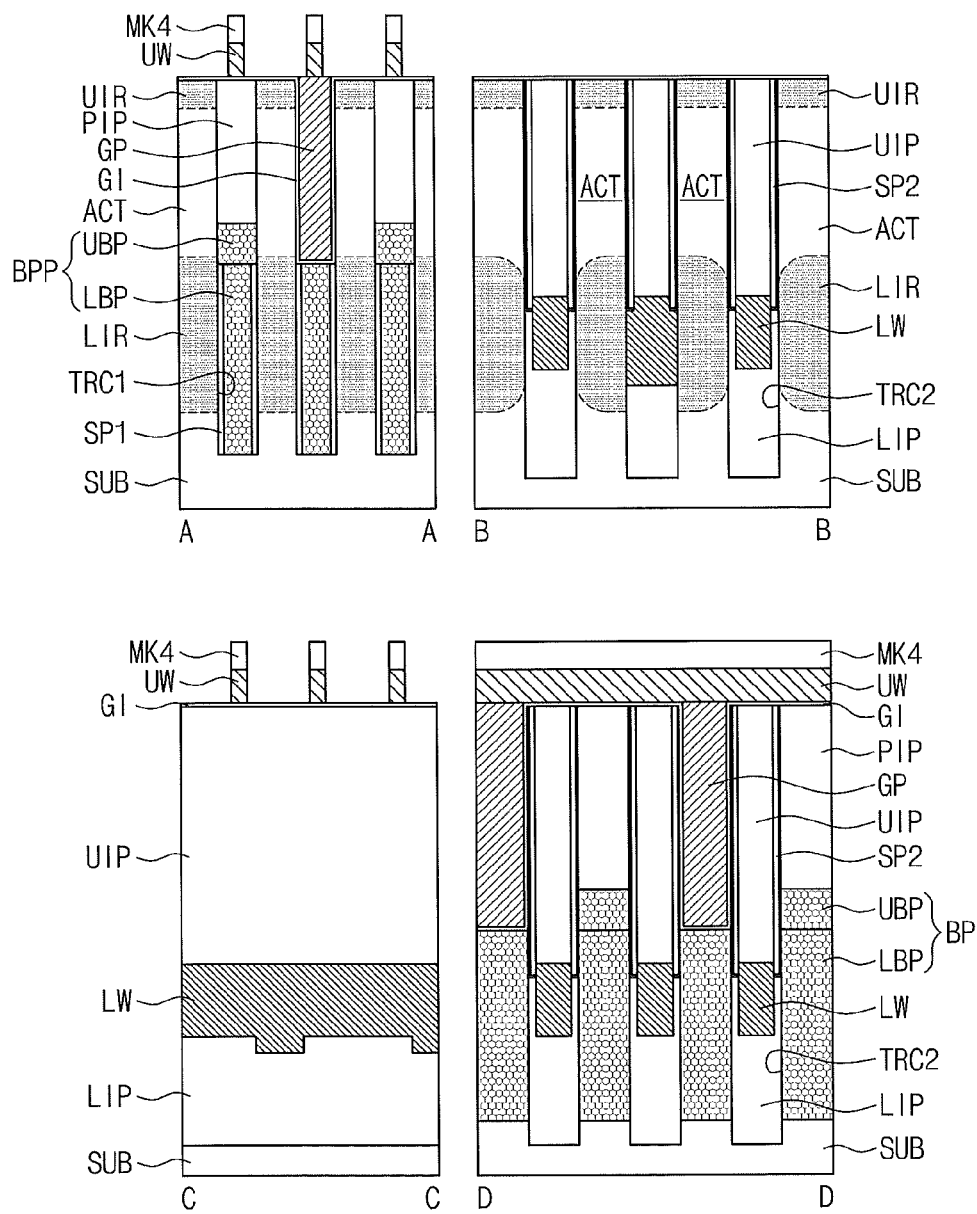
Figure 32B:
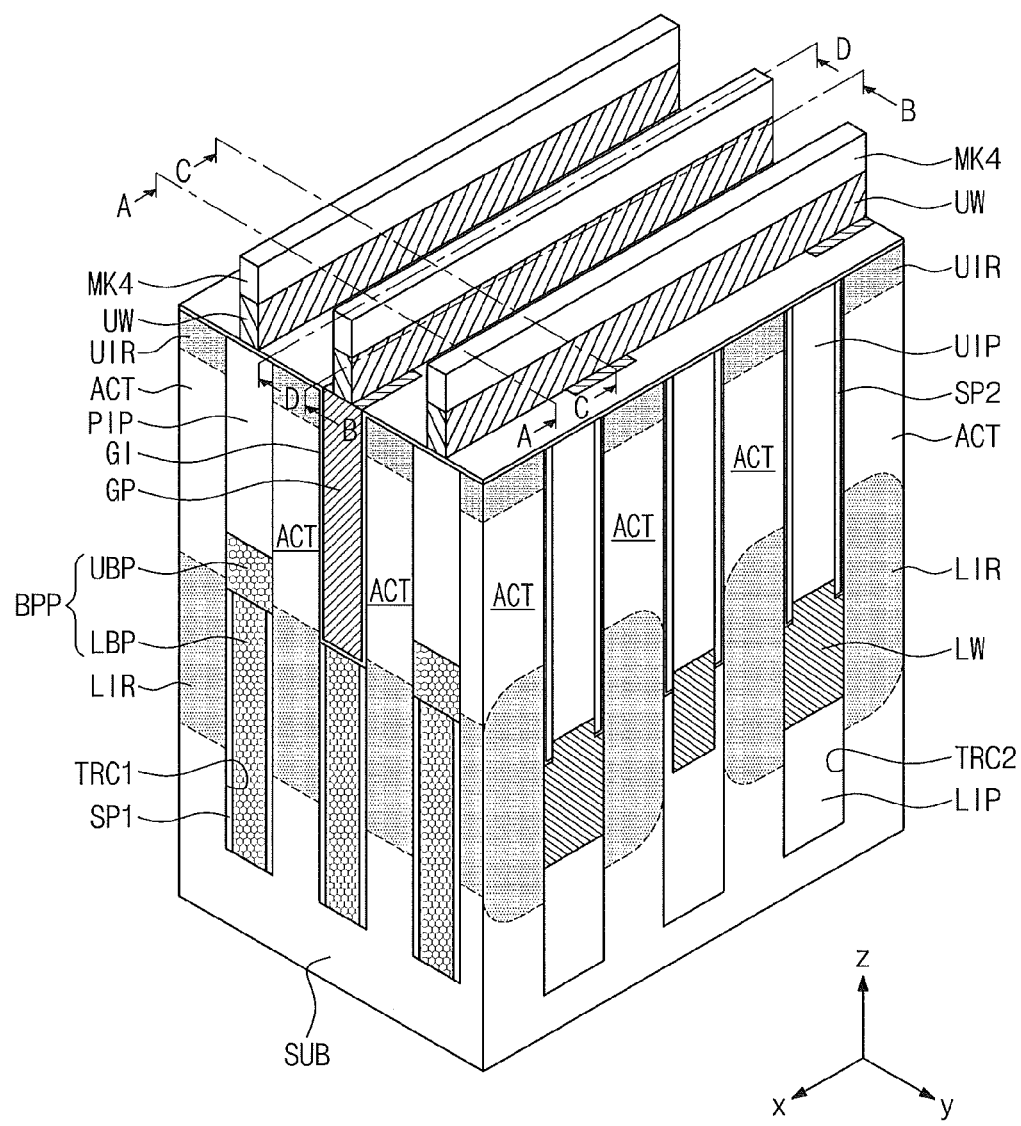

Referring to FIGS. 31A and 31B, the sacrificial patterns SCP are etched to form gate holes GH exposing the sidewalls of the active patterns ACT, and gate patterns GP are thereafter formed in the gate holes GH in operation S27.

According to an embodiment, the forming of the gate holes GH may include selectively removing the sacrificial patterns SCP while restraining the plug insulation patterns PIP and the upper insulation patterns UIP from being etched by using the etch selectivity. For example, if the plug insulation patterns PIP and the upper insulation patterns UIP are formed of a silicon oxide layer and the sacrificial pattern SCP is formed of a silicon nitride layer, the forming of the gate holes GH may be performed using an etchant containing phosphoric acid. Using of the etch selectivity enables the gate holes GH defining positions and shapes of the gate patterns GP to be formed without an additional photolithographic process.

Prior to forming of the gate patterns GP, a gate insulator GI may be further formed, which covers inner walls of the gate holes GH. The gate insulator GI may be an oxide layer formed through thermal oxidation, or an insulation layer deposited by CVD or ALD technique. In the case of using deposition technique, as illustrated in FIG. 31B, the gate insulator GI may cover the top surfaces of the plug insulation patterns PIP and upper insulation patterns UIP as well as the inner wall of the gate hole GH. In the case of using thermal oxidation, the gate insulator GI may be locally formed on an exposed surface of the lower bypass pattern LBP or the active pattern ACT.

According to an embodiment, the sacrificial layer SCP may remain in lower regions of the gate holes GH. That is, the residue of the sacrificial pattern SCP may be interposed between the gate pattern GP and the lower bypass pattern LBP.

The forming of the gate pattern GP may include forming a gate layer filling the gate holes GH, on the resultant structure where the gate insulator GI is formed. According to an embodiment, the gate layer is planarization-etched to thereby complete the gate patterns GP locally formed in the gate holes GH, as illustrated in FIG. 31B. According to an embodiment, the localizing of the gate layer may be achieved by a subsequent gate patterning process of using a fourth mask pattern MK4 as an etch mask.

Since some of the lower bypass patterns LBP disposed under the gate holes GH are spaced apart from the sidewalls of the active patterns ACT, they are not used as an electrical current path for electrical connection between the active pattern ACT and the substrate SUB but used as a template defining the bottom surfaces of the gate holes GH. That is, some of the lower bypass patterns LBP disposed under the gate hole GH provide a function of supporting the gate pattern structurally, and, from this point of view, may thus constitute the gate supporting pattern GSP described with reference to FIG. 1.

Thereafter, as illustrated in FIGS. 32A and 32B, and FIGS. 33A and 33B, upper wirings UW and memory elements ME are sequentially formed in operations S28 and S29. The operations S28 and S29 may be performed using the fabrication method described with reference to FIGS. 18A to 20A.

Figure 34:
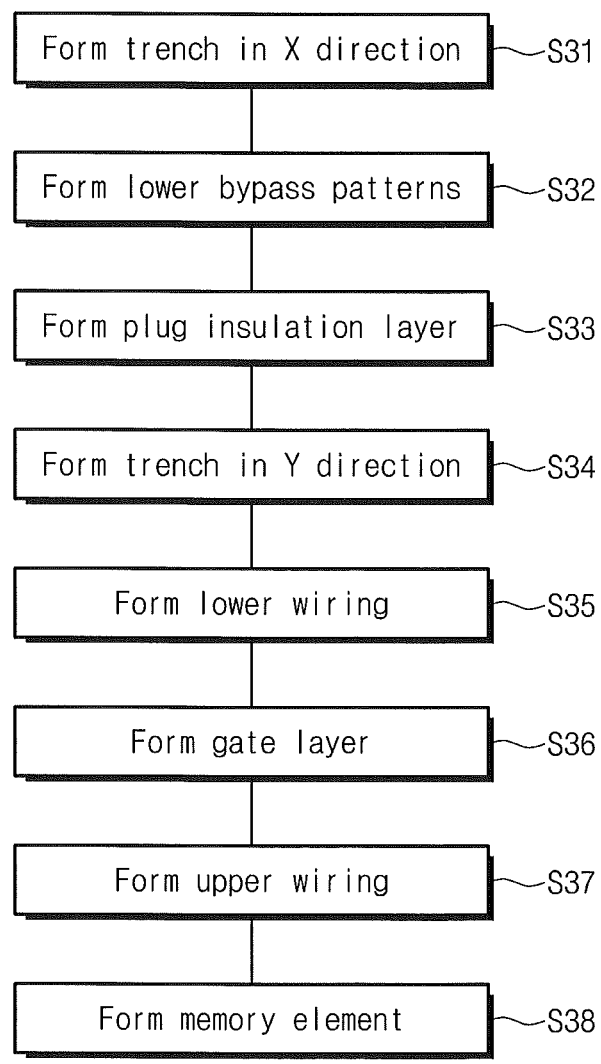
FIG. 34 is a flowchart illustrating a method of fabricating a semiconductor device according to an embodiment of the inventive concept.

FIG. 34 is a flowchart illustrating a method of fabricating a semiconductor device according to an embodiment of the inventive concept. FIGS. 35A to 47A are sectional views illustrating a method of fabricating a semiconductor device according to the embodiment of the inventive concept described with reference to FIG. 34. FIGS. 35B to 47B are perspective views illustrating a method of fabricating a semiconductor device according to the embodiment of the inventive concept described with reference to FIG. 34.

Referring to FIG. 34, lower bypass patterns LBP separated 2-dimensionally are formed prior to forming second trenches TRC2.

Figure 35A:
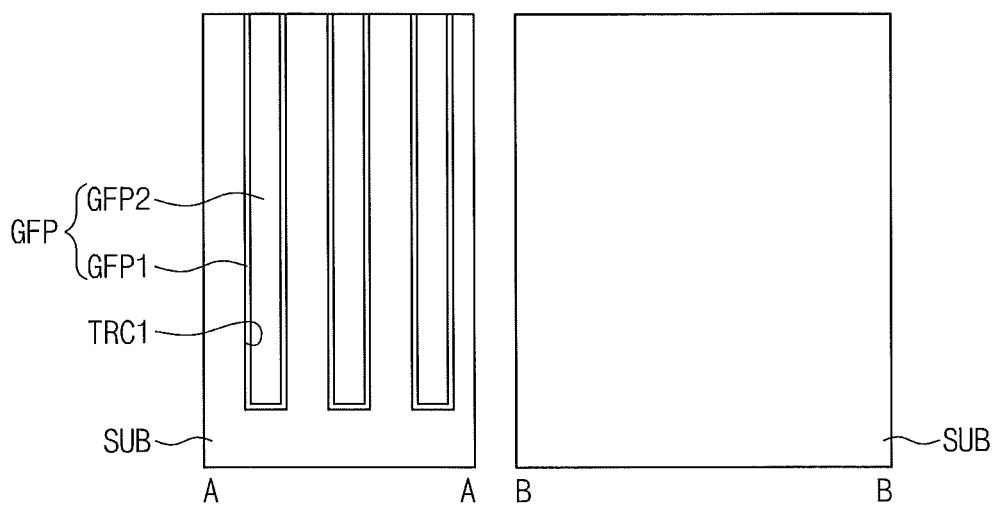
Figure 35A:
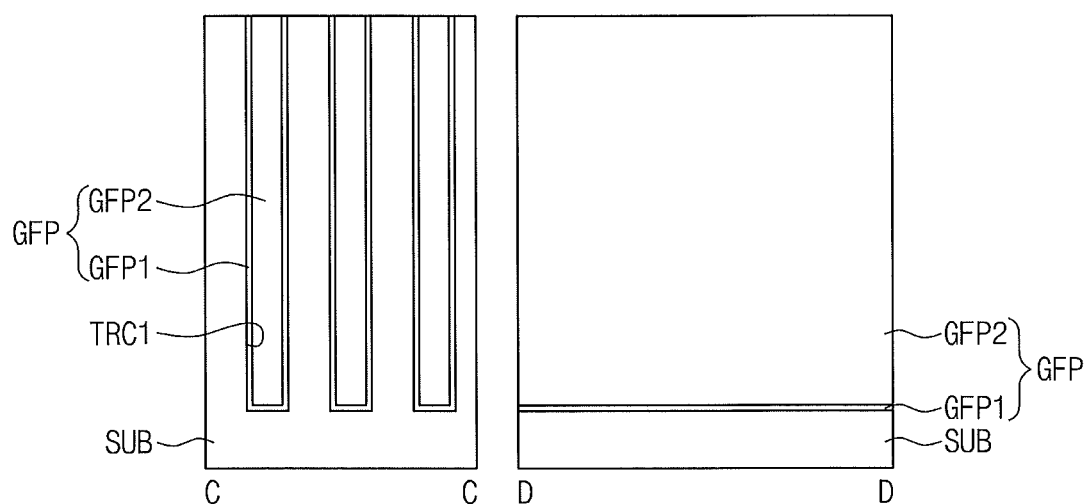
Figure 35B:
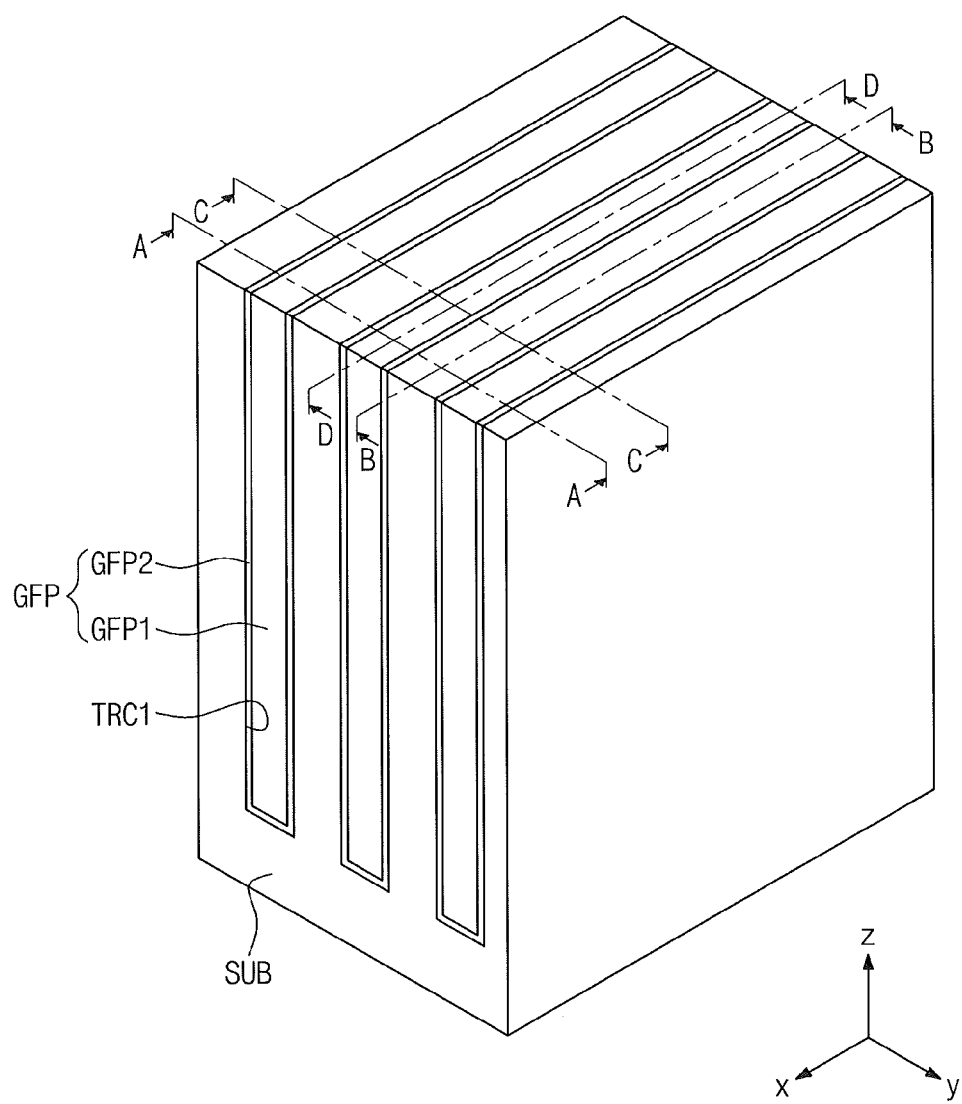

Referring to FIG. 34, first trenches TRC1 are formed by patterning a substrate SUB in operation S31, and thereafter gap-fill patterns GFP filling the first trenches TRC1 are formed. According to an embodiment, as illustrated in FIGS. 35A and 35B, each of the gap-fill patterns GFP may include a first gap-fill pattern GFP1 covering an inner wall of the first trench TRC1 and a second gap-fill pattern filling the first trench TRC1 with the first gap-fill pattern GFP1 formed. The first gap-fill pattern GFP1 may be a thermal oxidation layer formed by thermally oxidizing an inner wall of the first trench TRC1, and the second gap-fill pattern GFP2 may include a material having an etch selectivity with respect to the first gap-fill pattern GFP1.

Figure 36A:
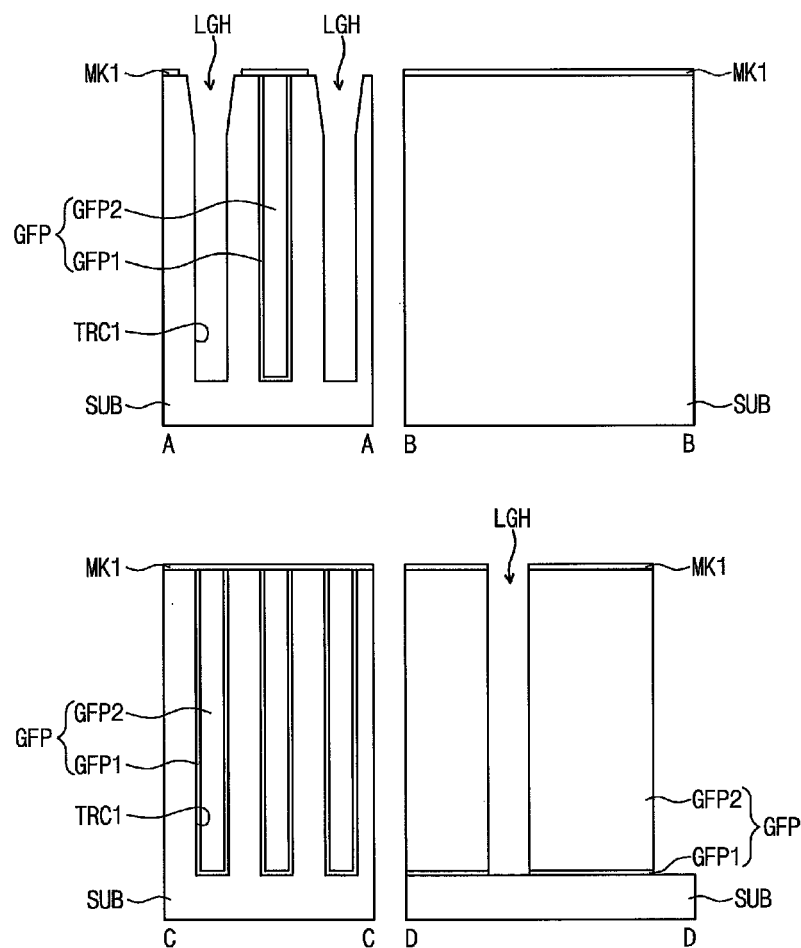
Figure 36B:
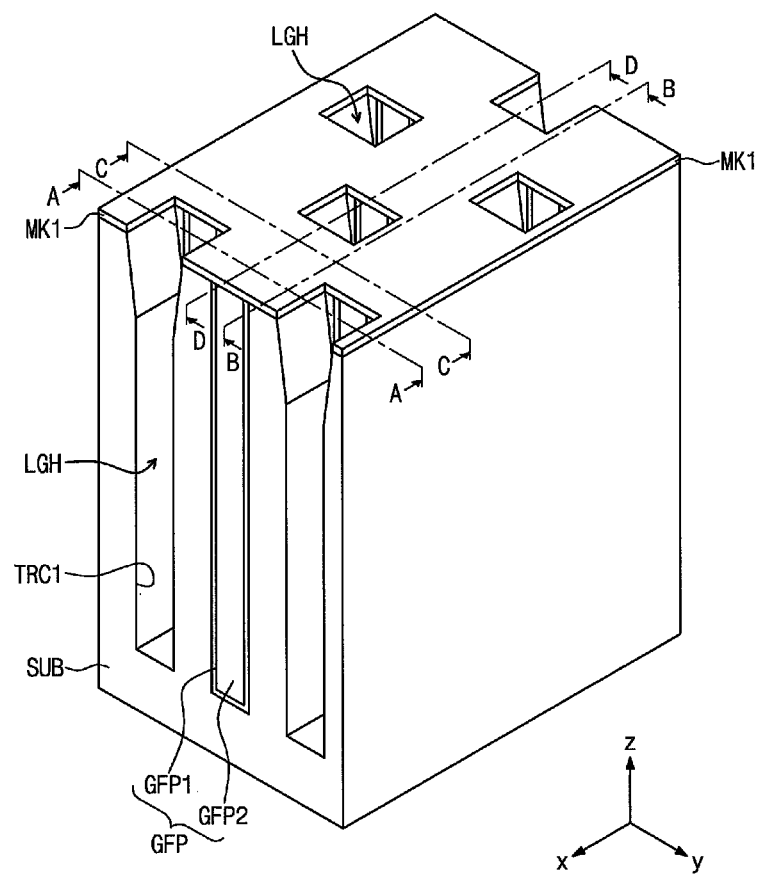
Figure 37A:
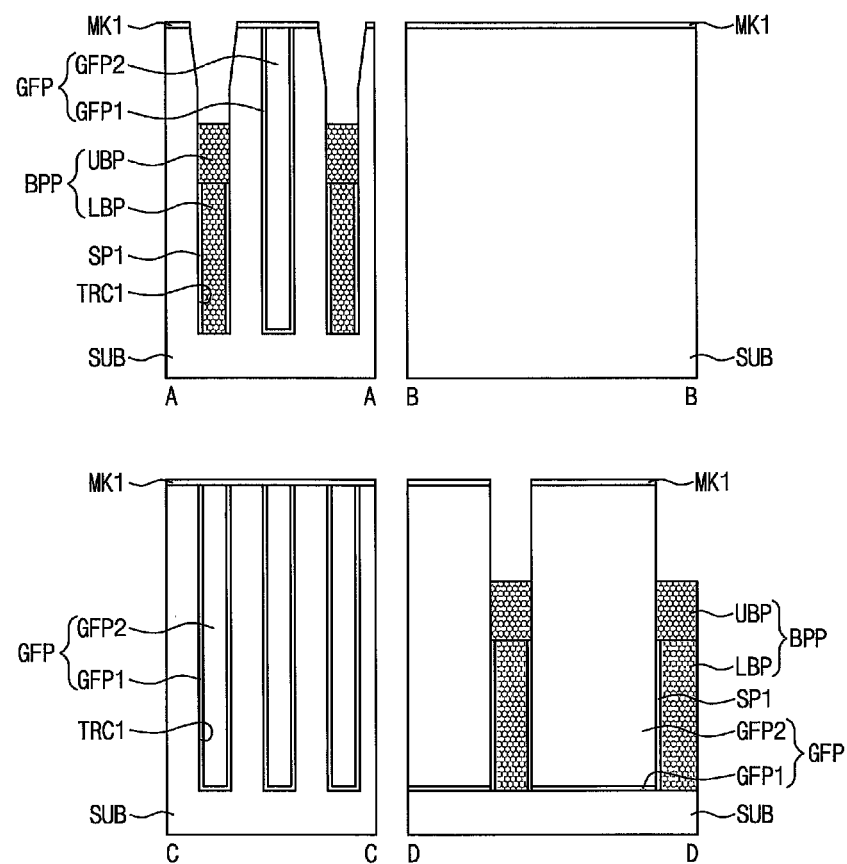
Figure 37B:
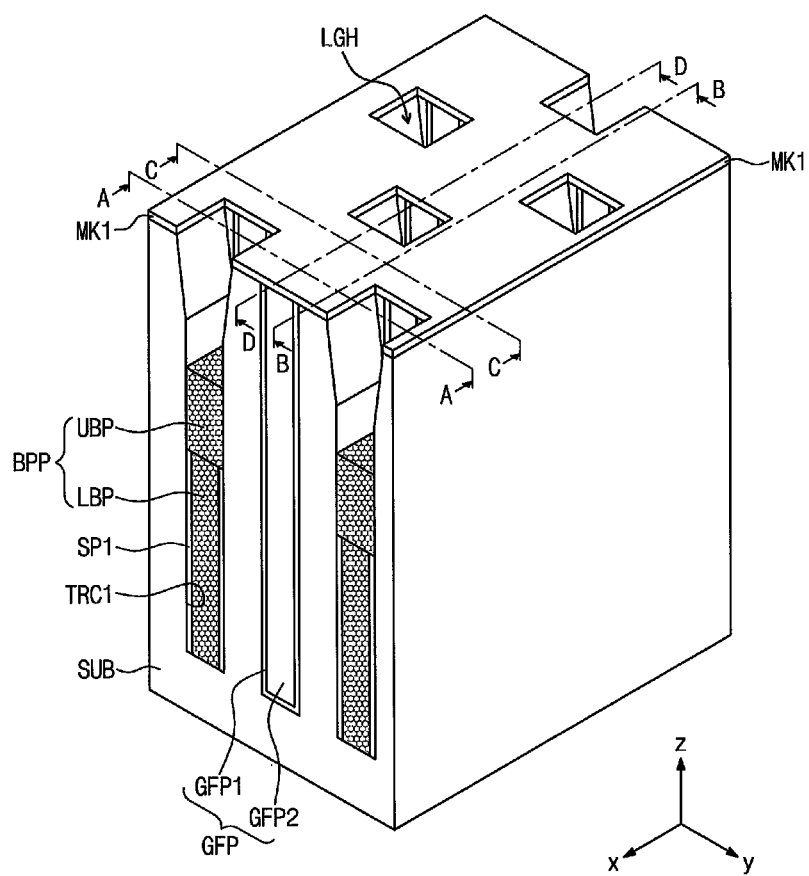

Subsequently, in operation S32, bypass patterns BPP arranged 2-dimensionally are formed on the substrate SUB. The operation S32 may include forming lower gate holes LGH arranged 2-dimensionally on the substrate SUB as illustrated in FIGS. 36A and 36B, and then sequentially forming lower bypass patterns LBP and upper bypass patterns UBP in the lower gate holes LGH as illustrated in FIGS. 37A and 37B. The lower and upper bypass patterns LBP, UBP are stacked in contact with each other in the lower gate holes LGH to constitute the bypass patterns BPP.

The lower gate holes LGH may be formed by forming a predetermined first mask pattern MK1 (where openings defining the positions of the lower gate holes LGH are formed), and then patterning the gap-fill patterns GFP using the first mask pattern MK1 as an etch mask. The positions of the lower gate holes LGH and the openings projected onto a plane parallel to the top surface of the substrate SUB may be substantially identical to those of the plug insulation patterns PIP in the first embodiment described with reference to FIGS. 16A and 16B. The first mask layer ML1 may be at least one of a photoresist layer, a silicon oxide layer, or a silicon nitride layer formed through photolithography.

The forming of the lower bypass pattern LBP may include forming first spacers SP1 exposing the bottom surface of the first trench TRC1, on the inner sidewalls of the lower gate holes LGH; and then forming a lower bypass layer filling the lower gate holes LGH with the first spacers SP1 formed. Subsequently, the top surface of the lower bypass layer is recessed down to the surface of the substrate SUB by blanket-etching the lower bypass layer. Accordingly, as illustrated in FIGS. 37A and 37B, the lower bypass layer is divided into the lower bypass patterns LBP locally disposed in each of the lower gate holes LGH. According to an embodiment, since the first spacer SP1 covers the inner sidewall of the lower gate hole LGH, the side surfaces of the lower bypass patterns LBP are surrounded by first spacer SP1. That is, the first spacer SP1 may be an open cylinder shape, disposed between the sidewalls of the first trenches TRC1 and the sidewall of the gap-fill pattern GFP.

The forming of the upper bypass patterns UBP may include etching the first spacers SP1 on the upper portion of the lower bypass patterns LBP to expose the sidewalls of the lower gate holes LGH again; and then sequentially forming an upper bypass layer filling the lower gate holes LGH on the resultant structure. Subsequently, the upper bypass layer is blanket-etched to expose the upper sidewalls of the lower gate holes LGH. Accordingly, the upper bypass patterns UBP to contact the sidewall of the substrate SUB and the upper surface of the lower bypass pattern LBP are locally formed in the lower gate holes LGH.

Figure 38A:
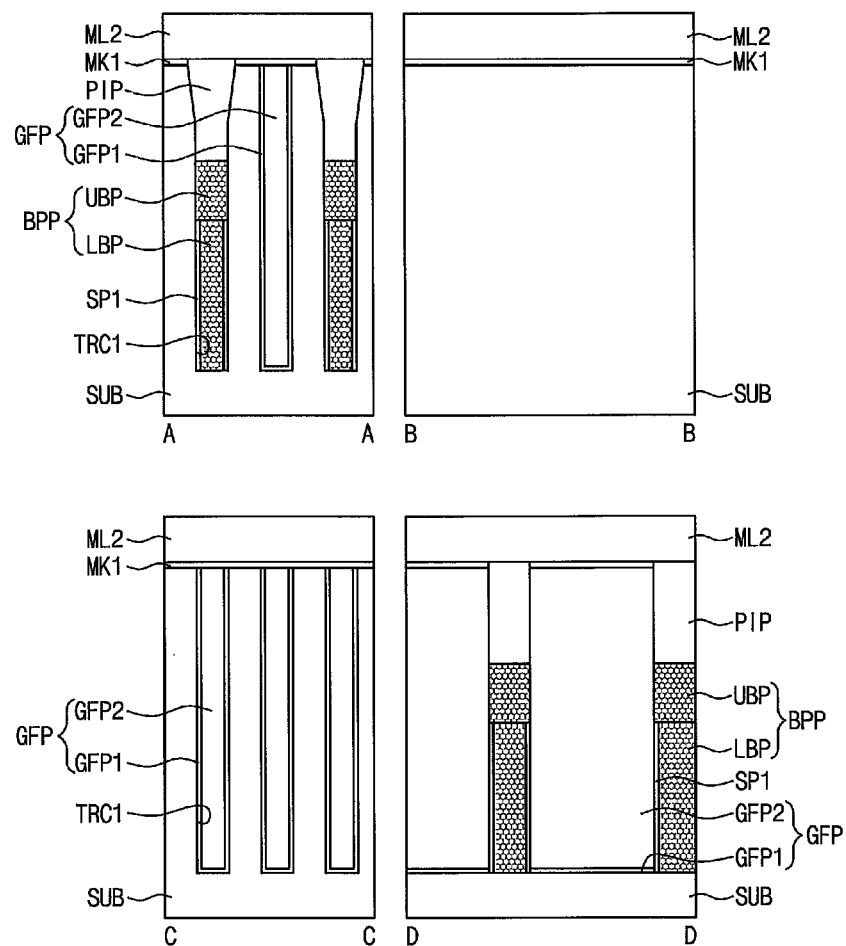
Figure 38B:
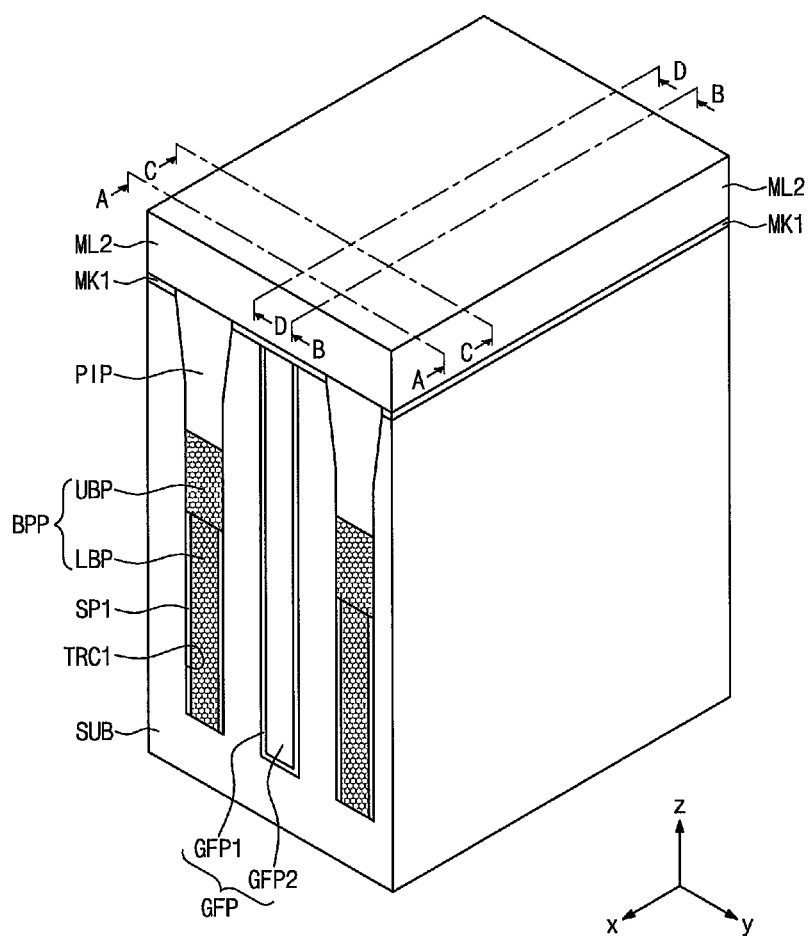

Afterwards, in operation S33, plug insulation patterns PIP locally formed in the lower gate holes LGH illustrated in FIGS. 38A and 38B, and a second mask layer ML2 covering the resultant structure with the plug insulation patterns PIP formed are sequentially formed. The plug insulation patterns PIP may be formed of a silicon oxide layer, and may be formed to cover the upper surfaces of the bypass patterns BPP.

Figure 39A:
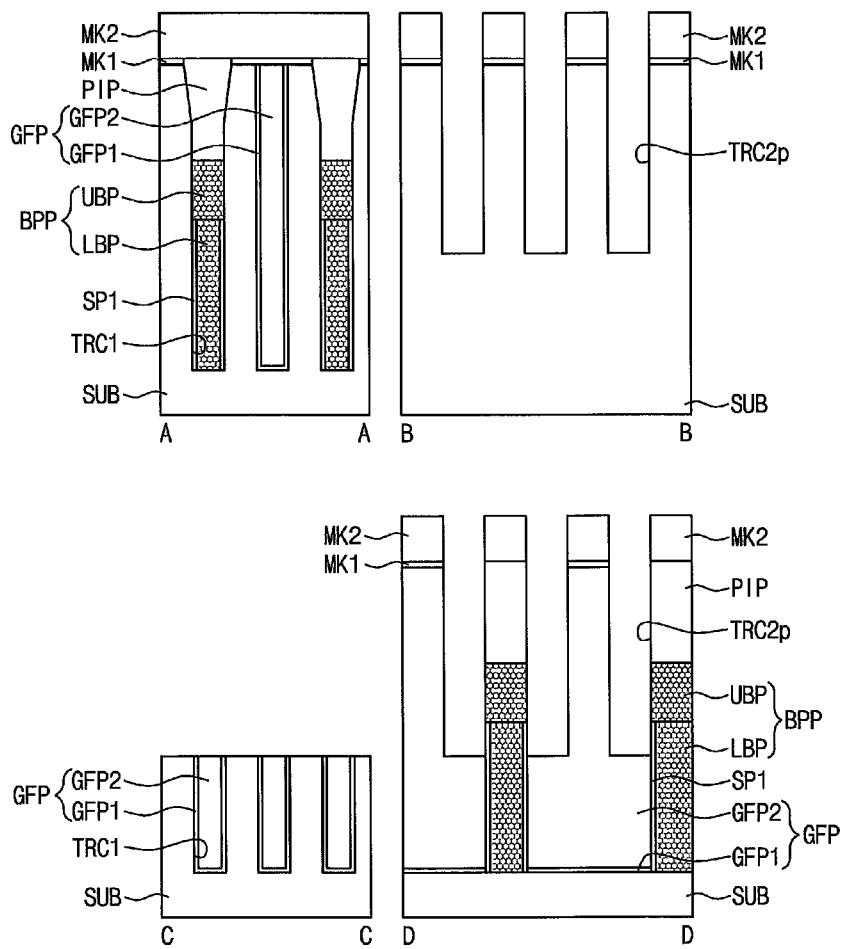
Figure 39B:
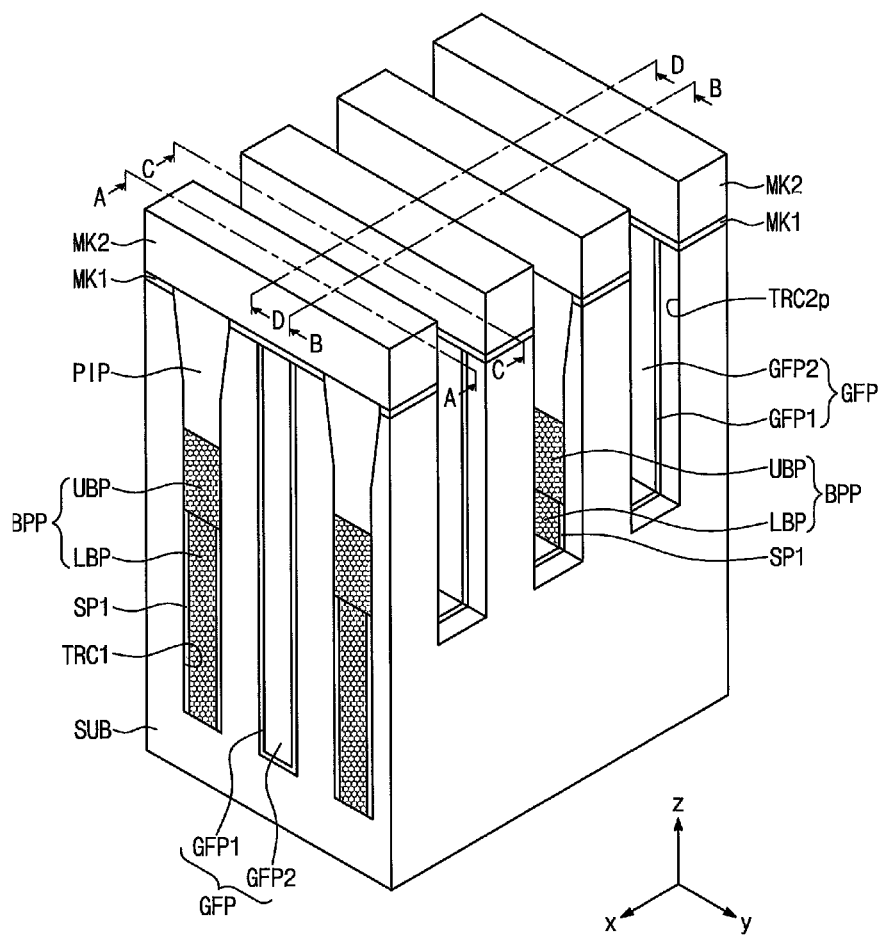
Figure 40A:
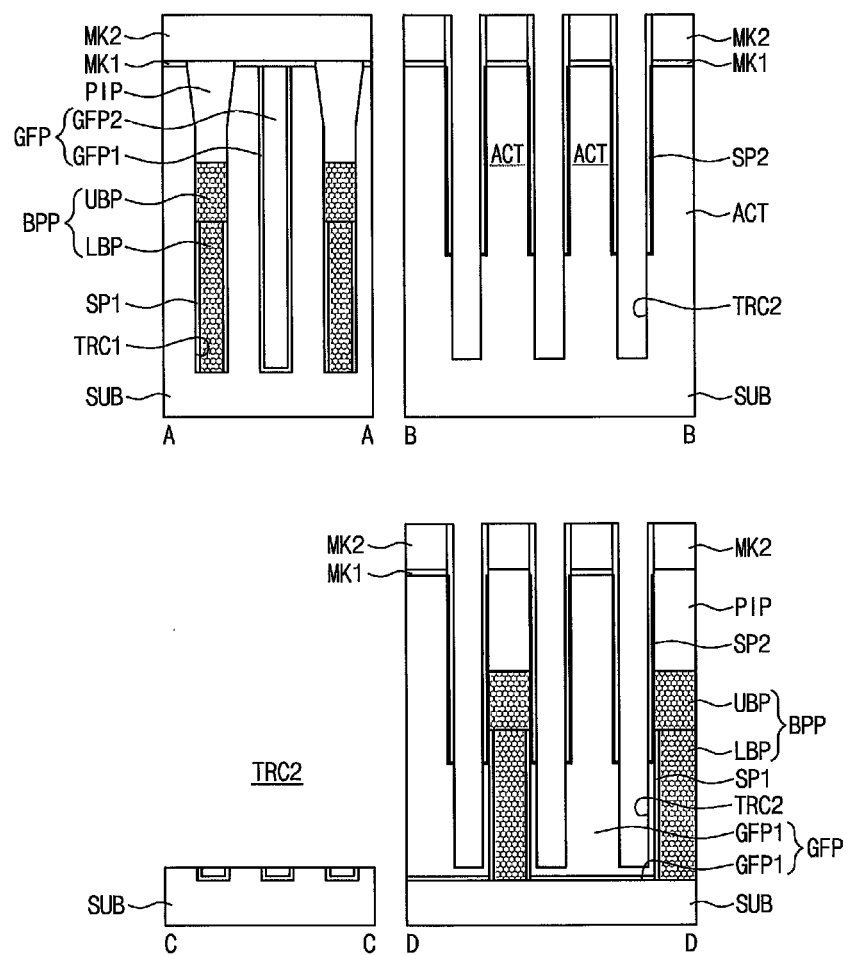
Figure 40B:
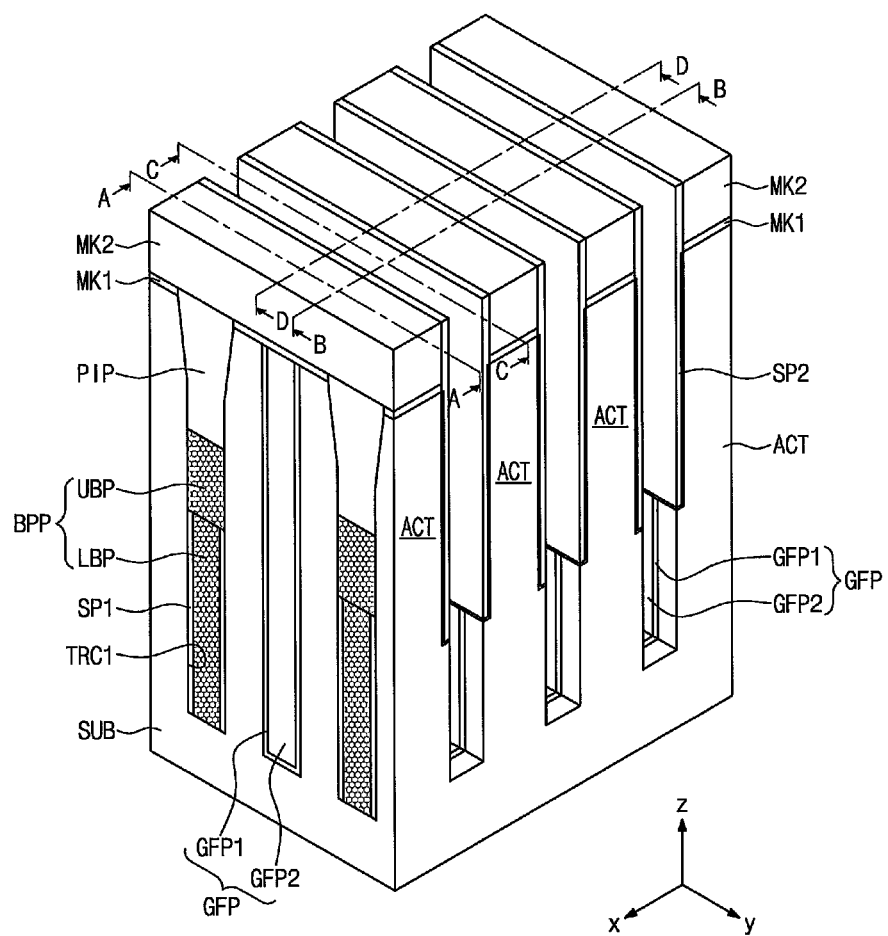

Thereafter, as illustrated in FIGS. 39A and 39B, preliminary trenches TRC2p crossing the first trenches TRC1 are formed, and then second trenches TRC2 defining active patterns ACT are formed as illustrated in FIGS. 40A and 40B in operation S34.

The forming of the preliminary trenches TRC2p may include patterning the second mask layer ML2 to form second mask patterns MK2 having a major axis crossing the first trenches TRC1, and then etching the substrate SUB and the gap-fill patterns GFP using these as an etch mask again. A series of operations of forming the second trenches TRC2 may be performed based on or by modifying the fabrication method described with reference to FIGS. 9A and 10A.

Figure 41A:
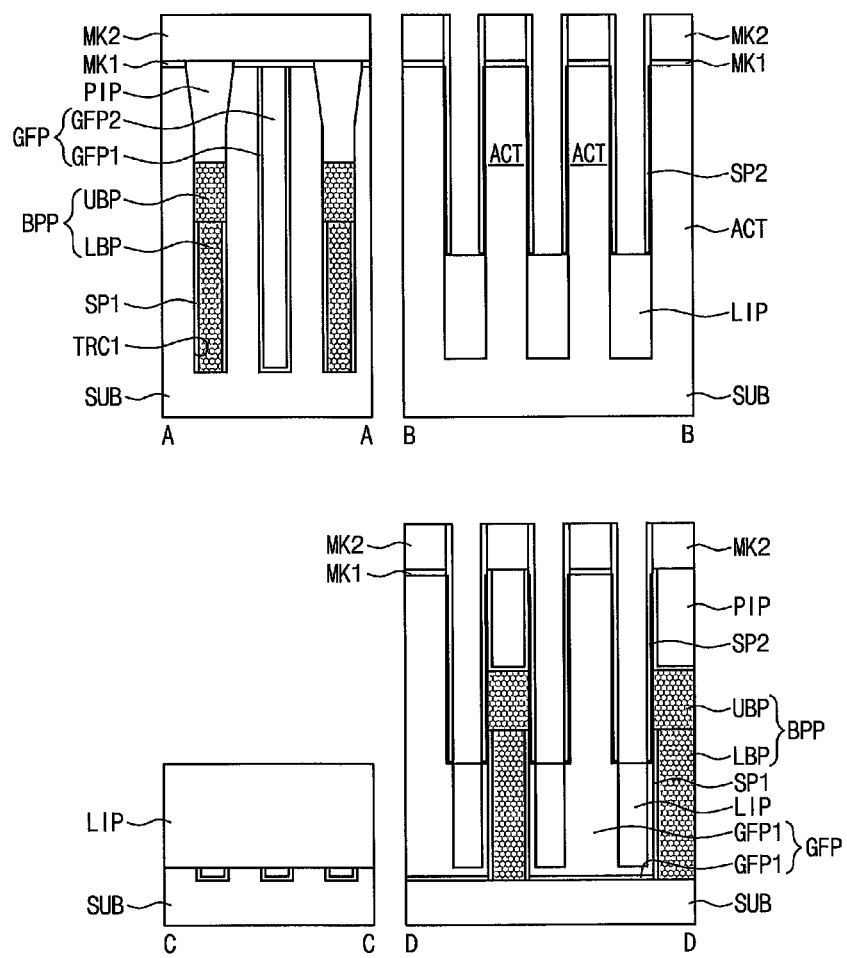
Figure 41B:
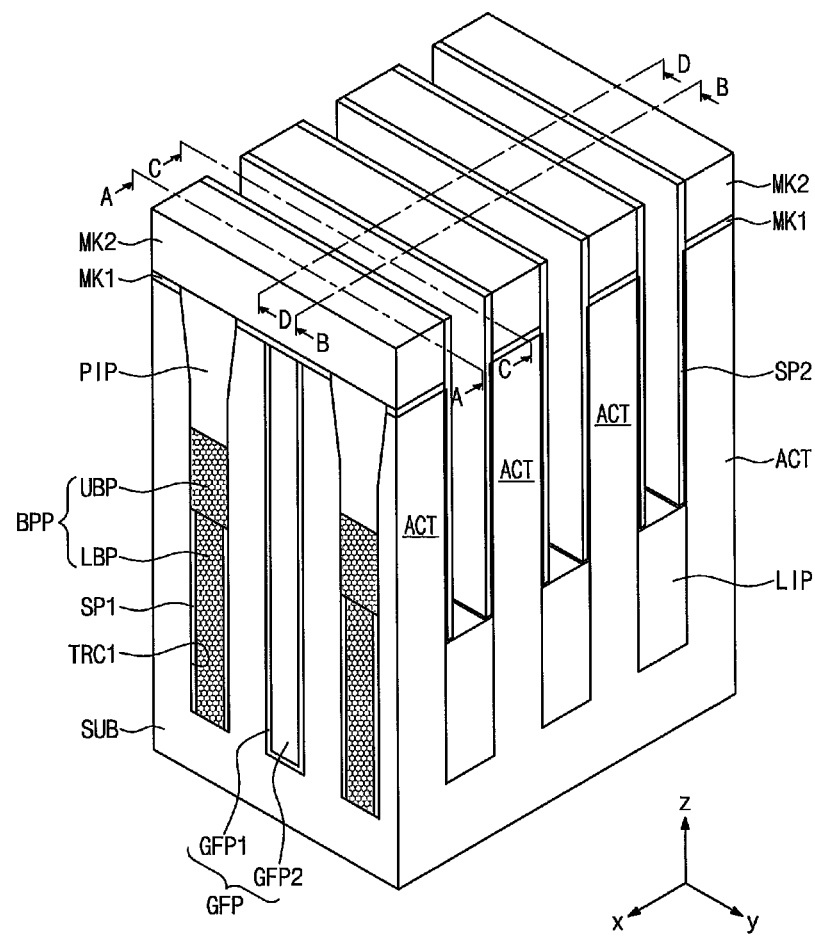
Figure 42A:
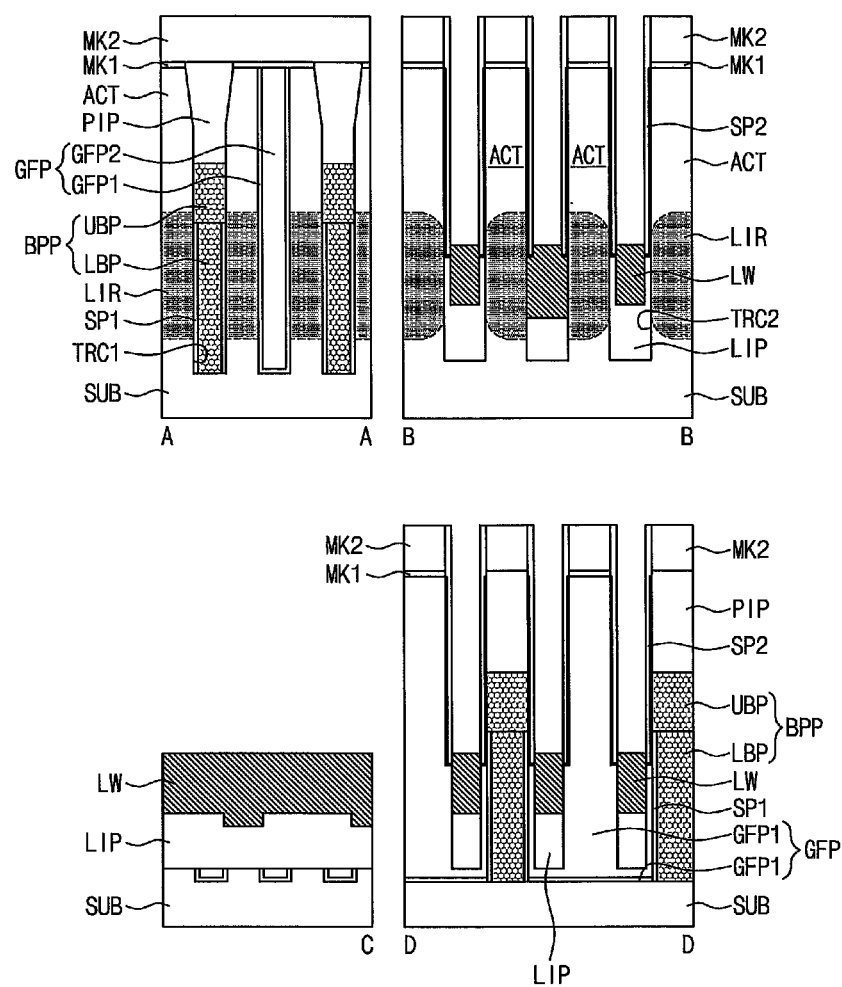
Figure 42B:
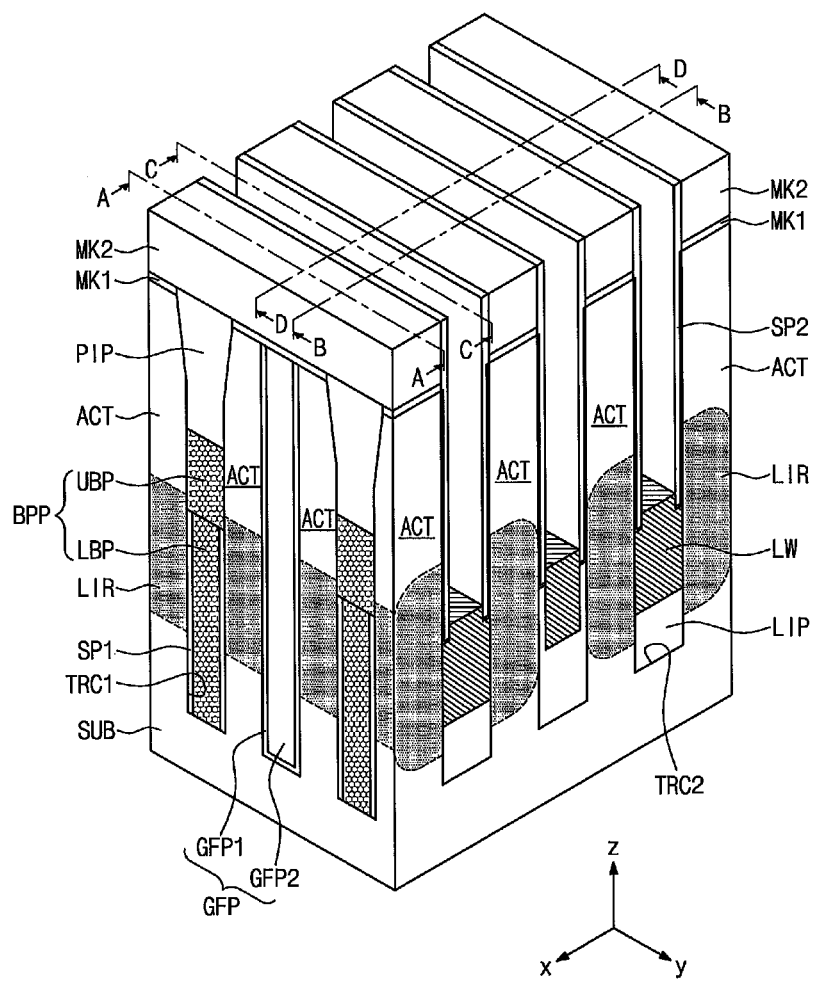

Subsequently, in operation S35, lower wirings LW are formed in the second trench TRC2. The operation S35 may be performed substantially in the same manner as the fabrication method described with reference to FIGS. 11A to 15A. Accordingly, as illustrated in FIGS. 41A and 41B, lower insulation patterns LIP to be used as a template for forming the lower wiring LW on the bottom of the second trench TRC2 may be formed. In an embodiment, as illustrated in FIGS. 42A and 42B, lower impurity regions LIR connected by the lower wirings LW may be formed in the lower regions of the active patterns ACT.

Figure 43A:
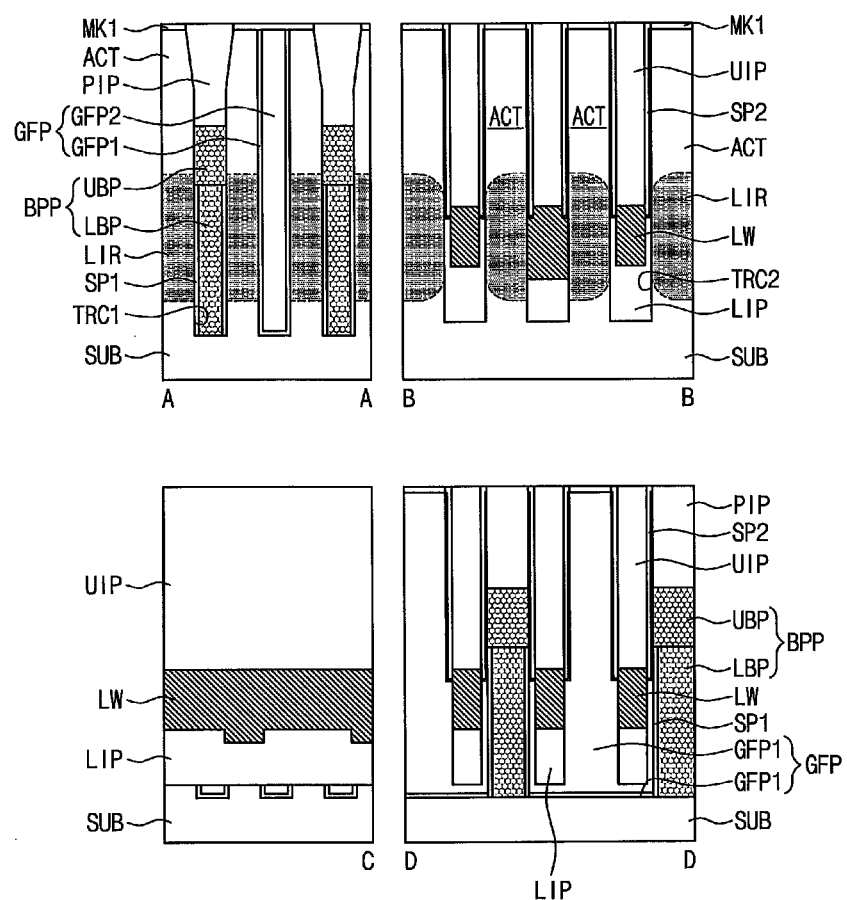
Figure 43B:
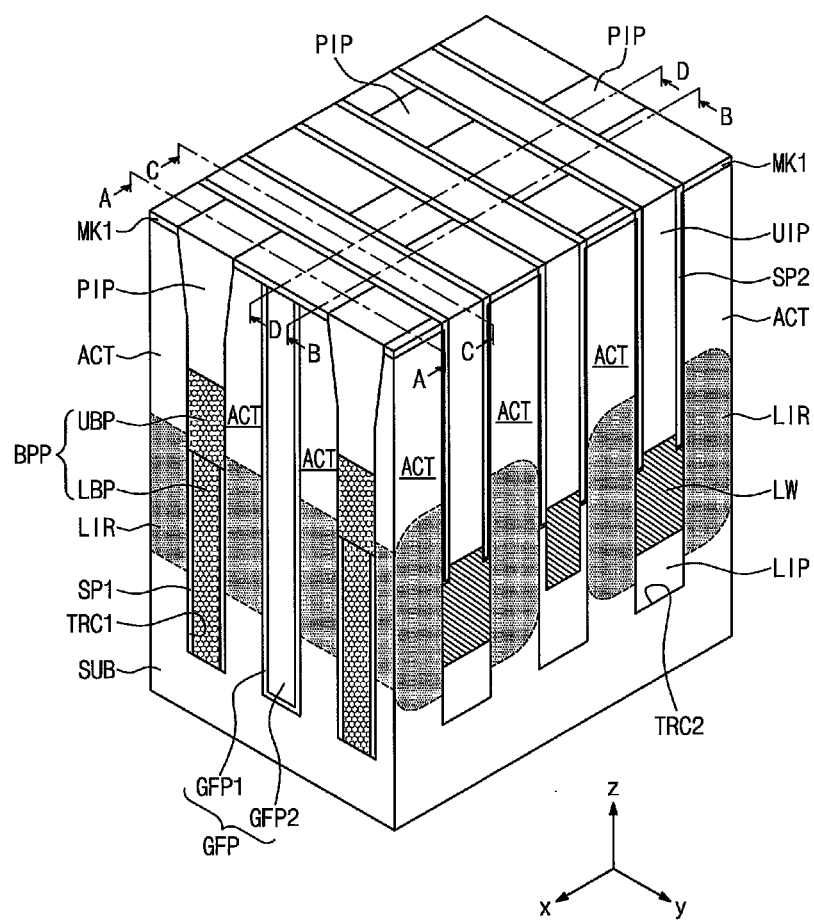

Next, as illustrated in FIGS. 43A and 43B, an upper insulation pattern UIP filling the second trenches TRC2 with the lower wirings LW formed is formed, and then the resultant structure is planarization-etched. According to an embodiment, the planarization-etching may be performed such that the plug insulation patterns PIP may be exposed, as illustrated in FIGS. 43A and 43B.

Figure 44A:
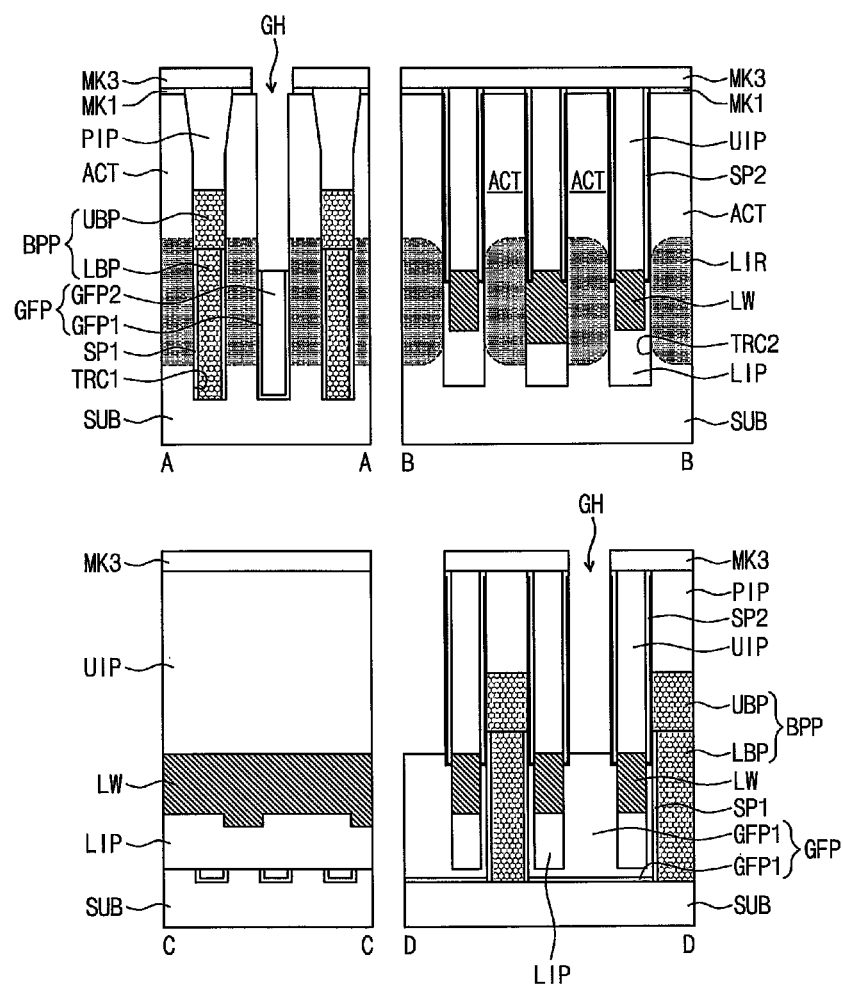
Figure 44B:
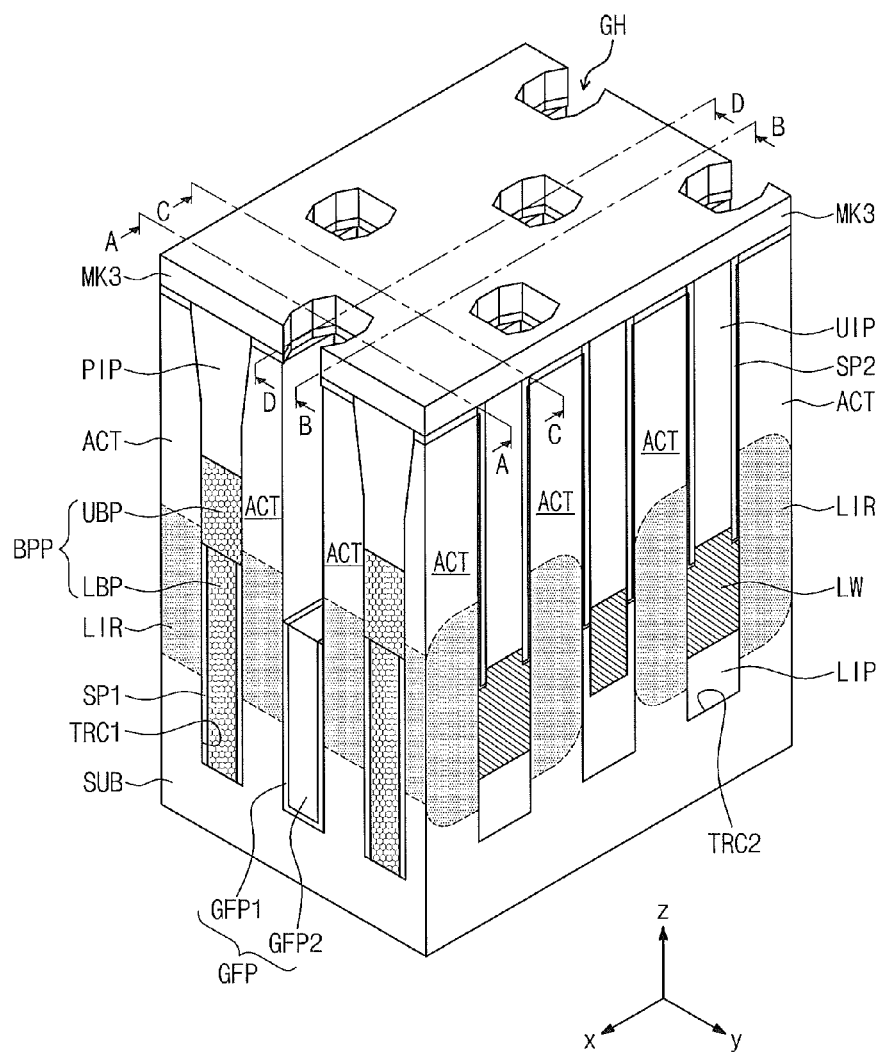

Thereafter, the gap-fill patterns GFP are selectively recessed using a third mask pattern MK3 as an etch mask. Accordingly, as illustrated in FIGS. 44A and 44B, gate holes GH exposing the sidewalls of the active patterns ACT and the upper surfaces of the recessed gap-fill patterns GFP are formed. The gate holes GH may be formed such that their bottom surface may be lower than the lower surface of the plug insulation pattern PIP, and may be formed at positions substantially identical to those in the second embodiment described above in planar configuration. In an embodiment, the gate holes GH and the gate layer GL may be performed based on or by modifying the fabrication method in the second embodiment described with reference to FIG. 31A.

Figure 45A:
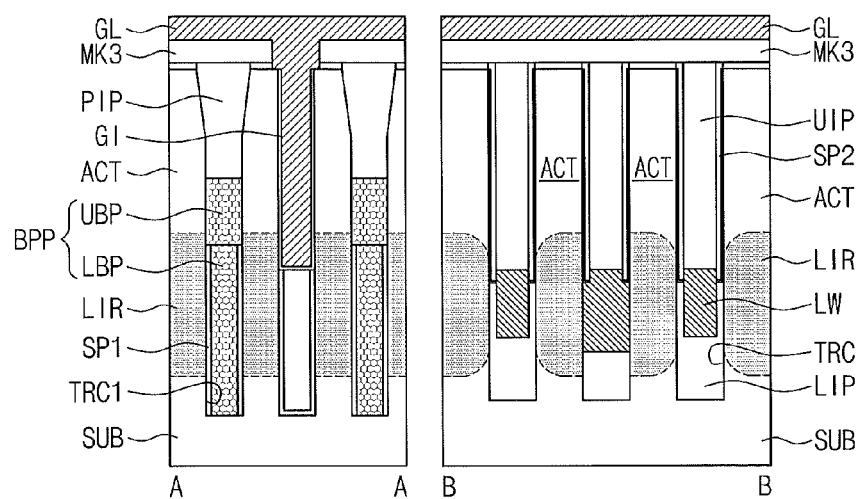
Figure 45A:
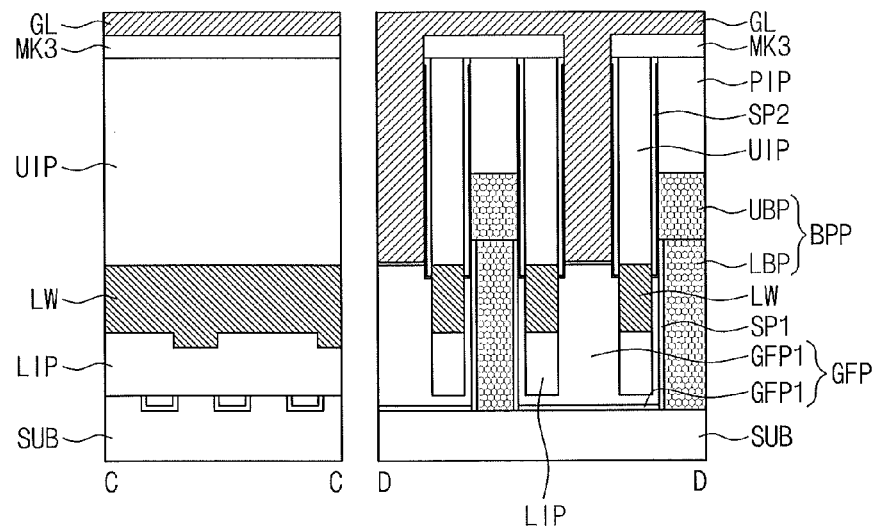
Figure 45B:
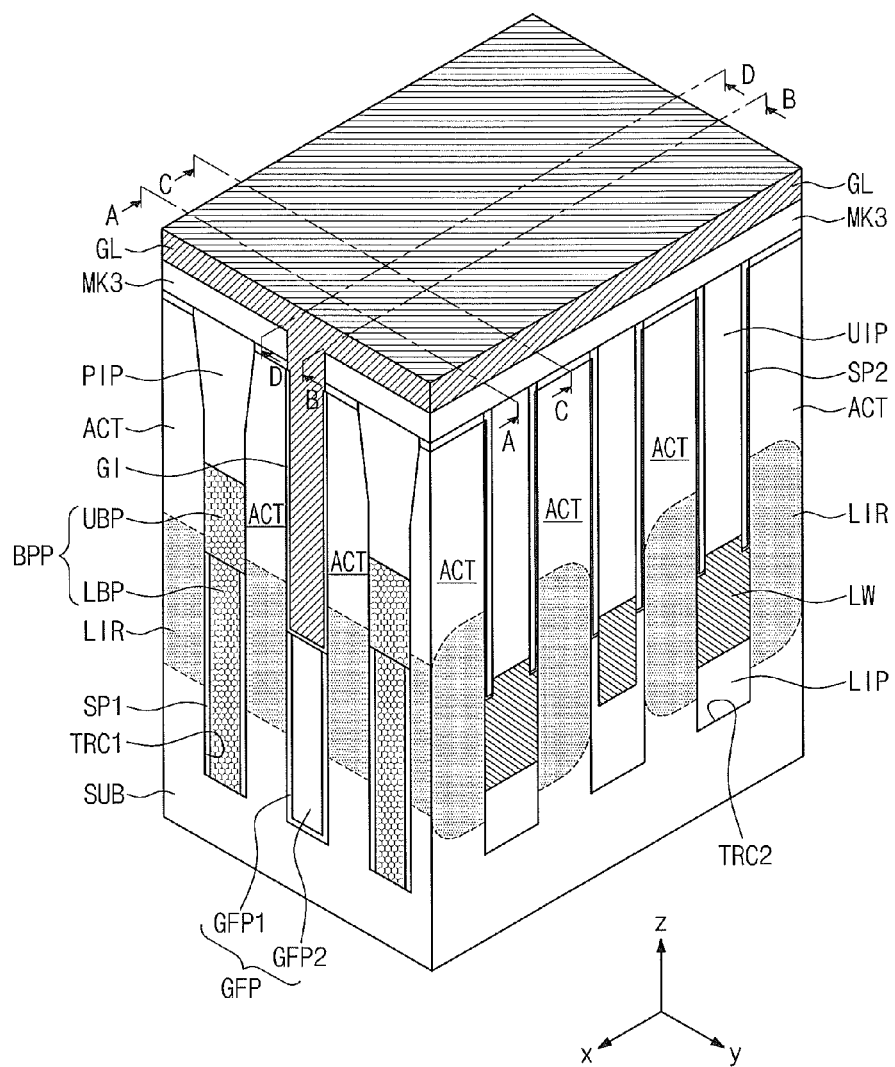
Figure 46A:
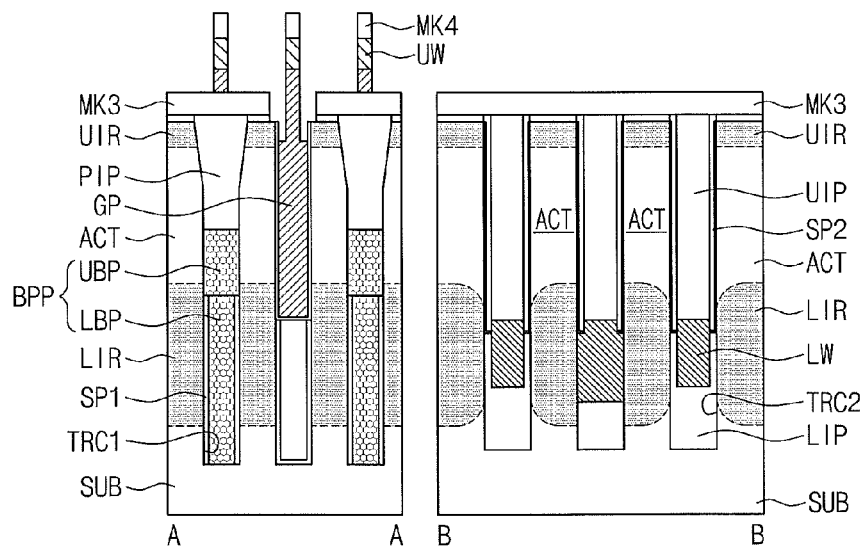
Figure 46A:
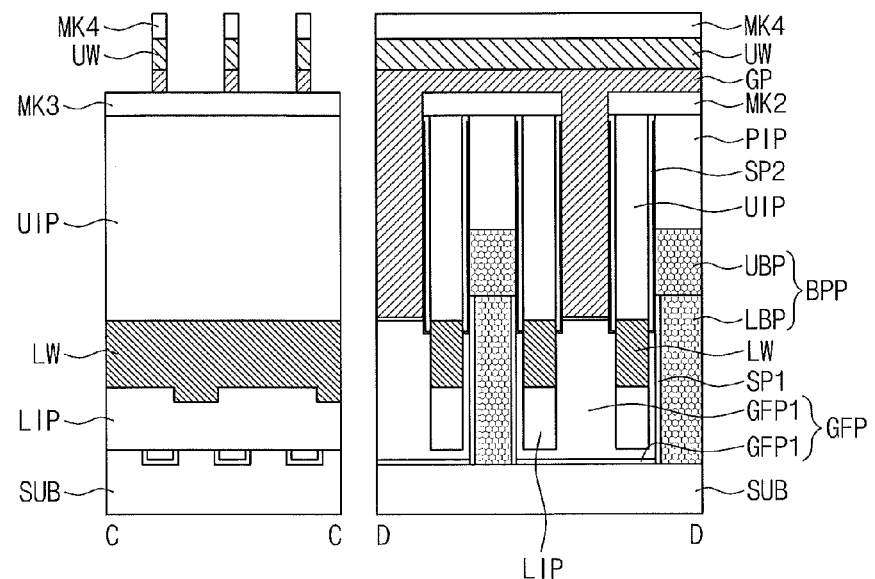
Figure 46B:
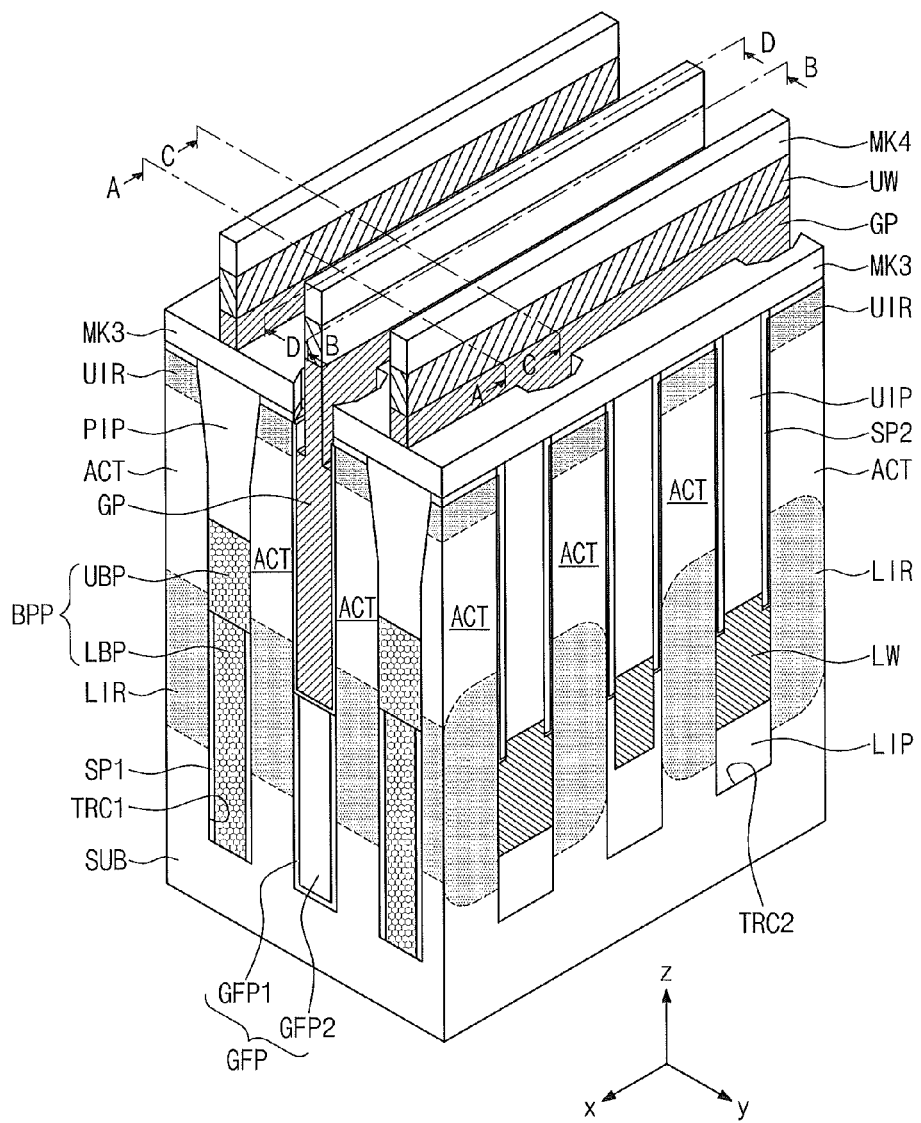
Figure 47A:
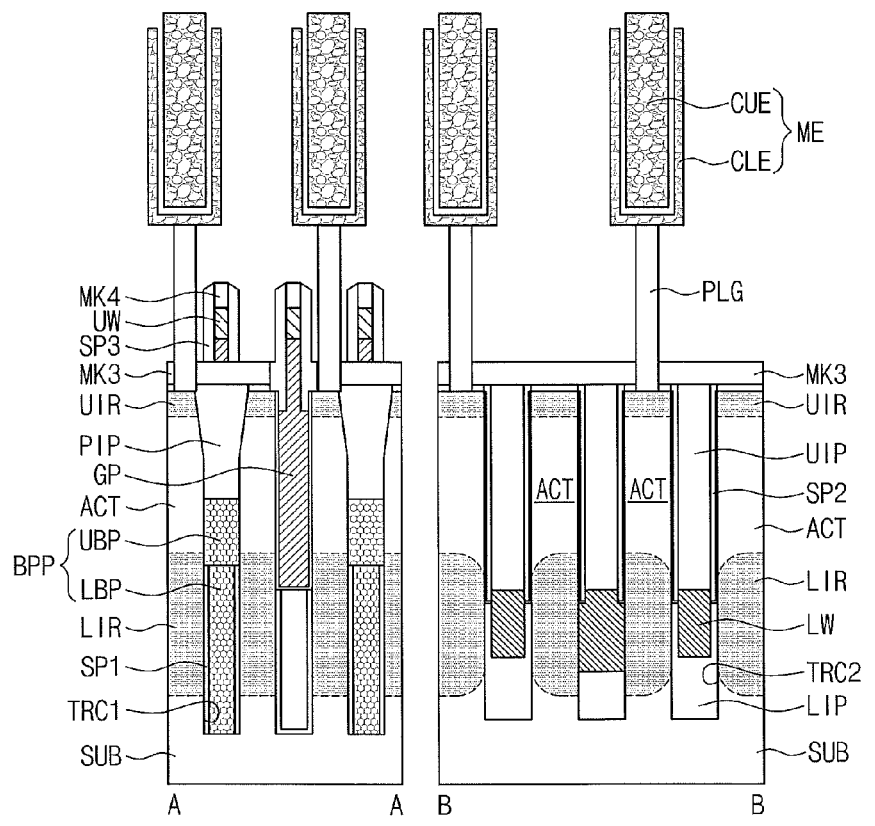
Figure 47A:
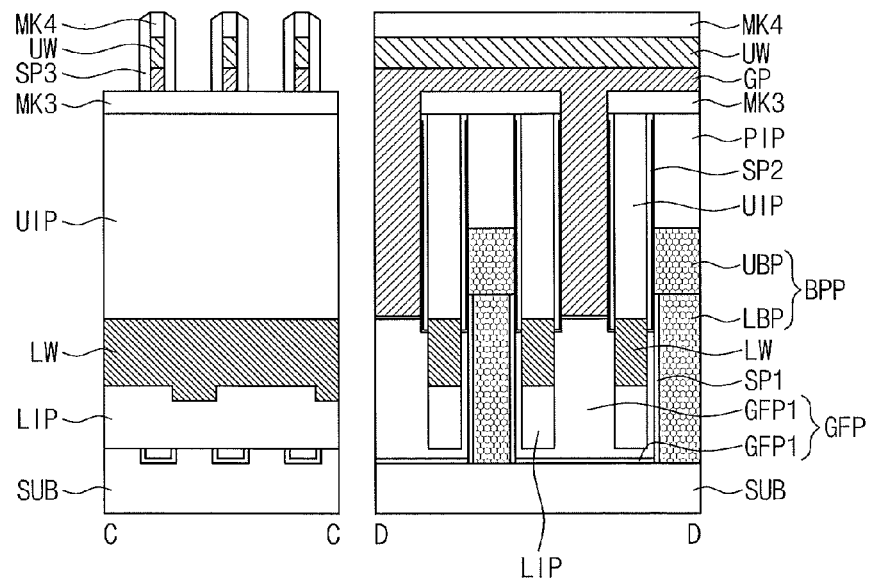
Figure 47B:
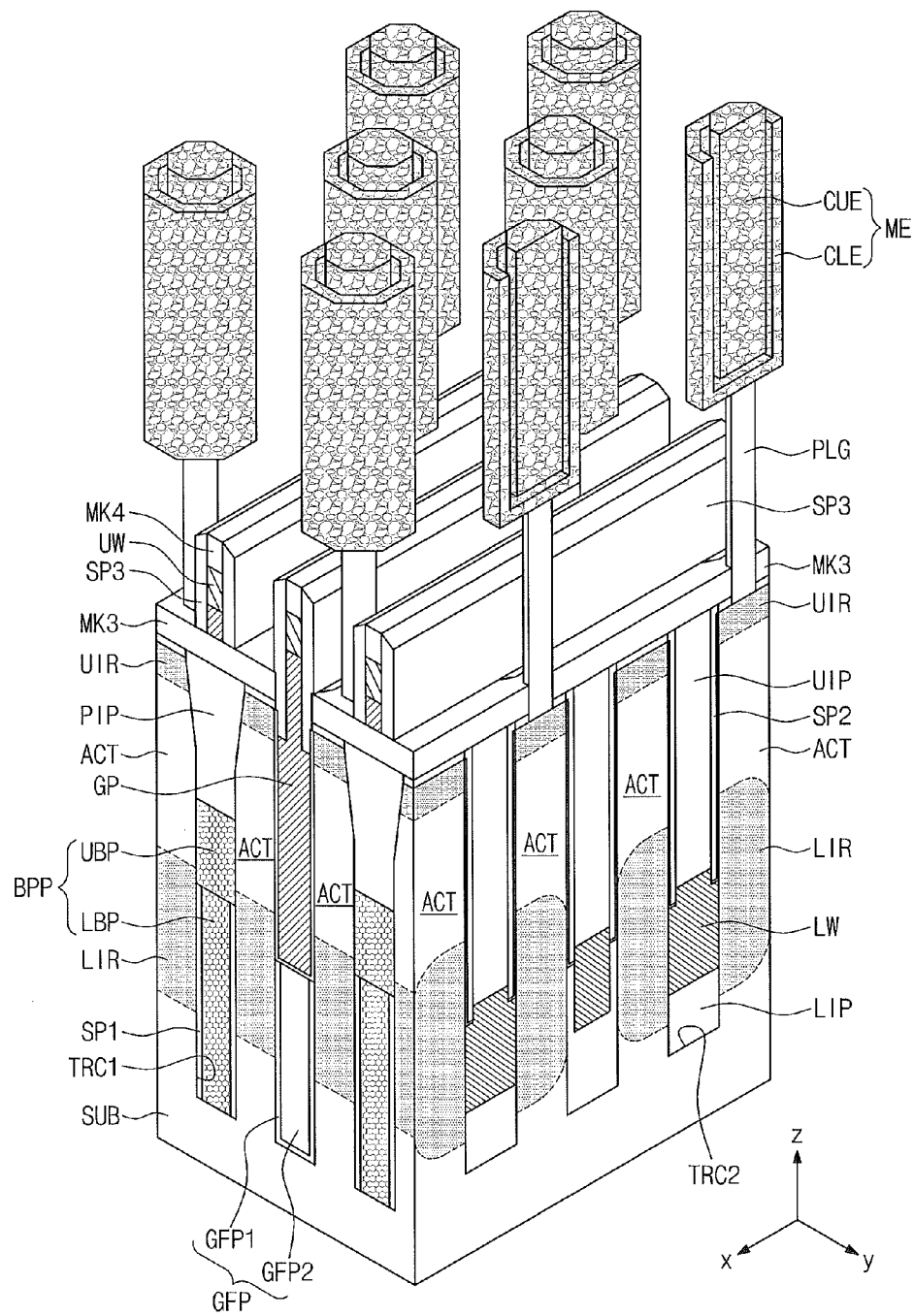
Figure 48:
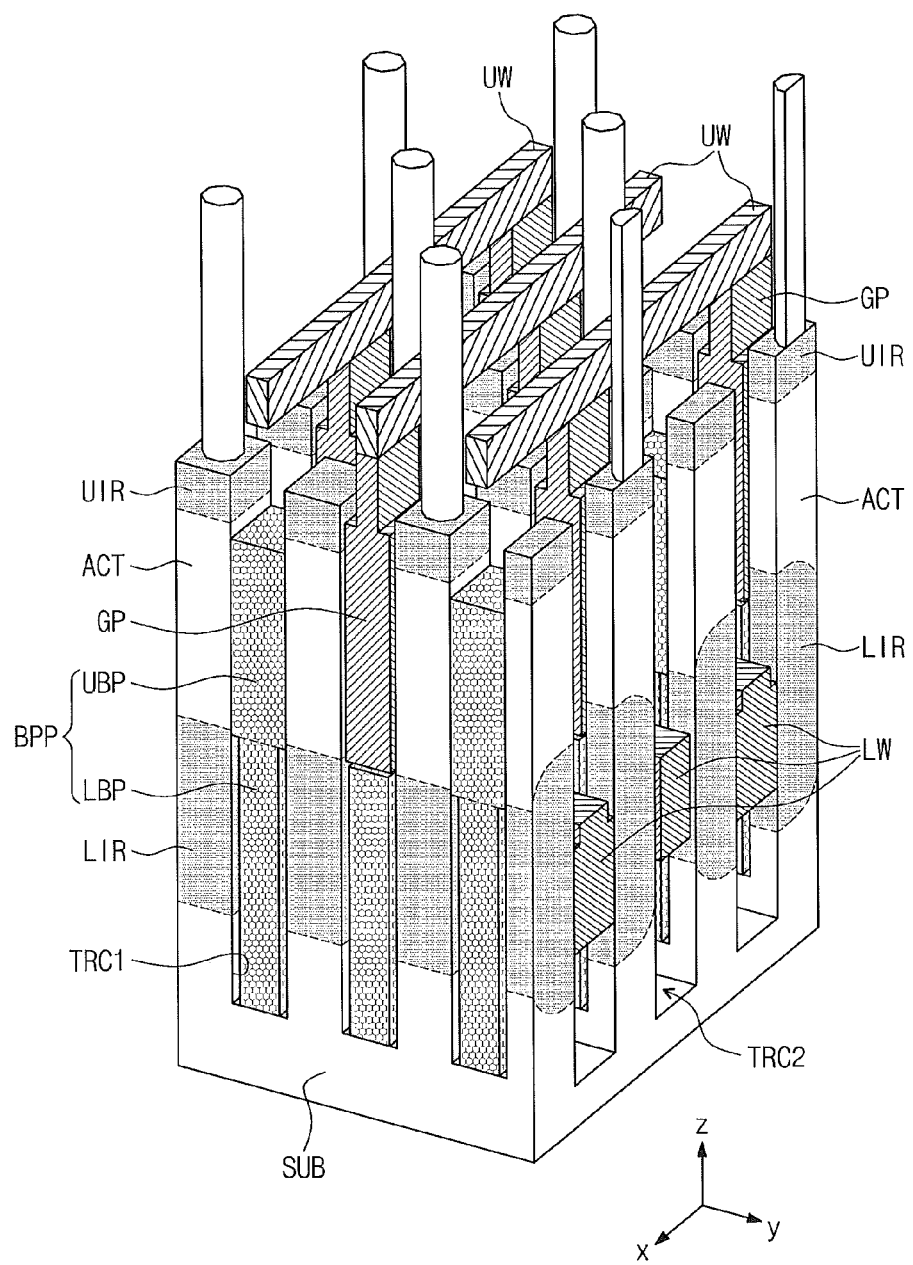
FIGS. 48 to 55 are perspective views illustrating semiconductor devices fabricated according to embodiments of the inventive concept.
Figure 49:
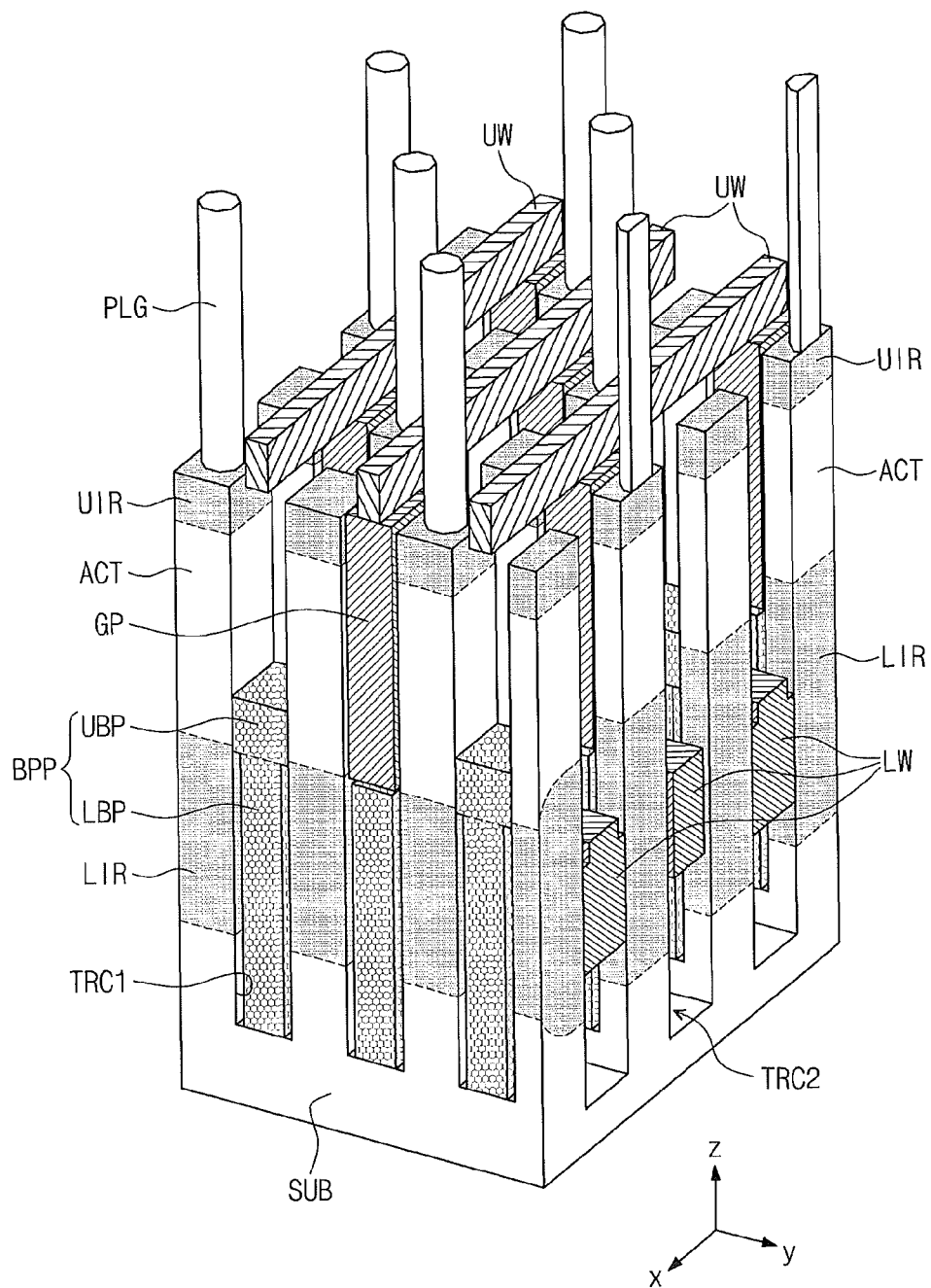

Afterwards, as illustrated in FIGS. 45A and 45B, a gate insulator GI covering the inner sidewalls of the gate holes GH is formed, and a gate layer GL filling the gate holes GH with the gate insulator GI formed in operation S36. Subsequently, an upper wiring UW and upper impurity regions UIR are formed, as illustrated in FIGS. 46A and 46B in operation S37, and then plugs PLG connected to the upper impurity regions UIR and memory elements ME connected to the plugs PLG are formed, as illustrated in FIGS. 47A and 47B in operation S38. These operations may be formed using the fabrication method described with reference to FIGS. 18A and 20A.

Figure 53:
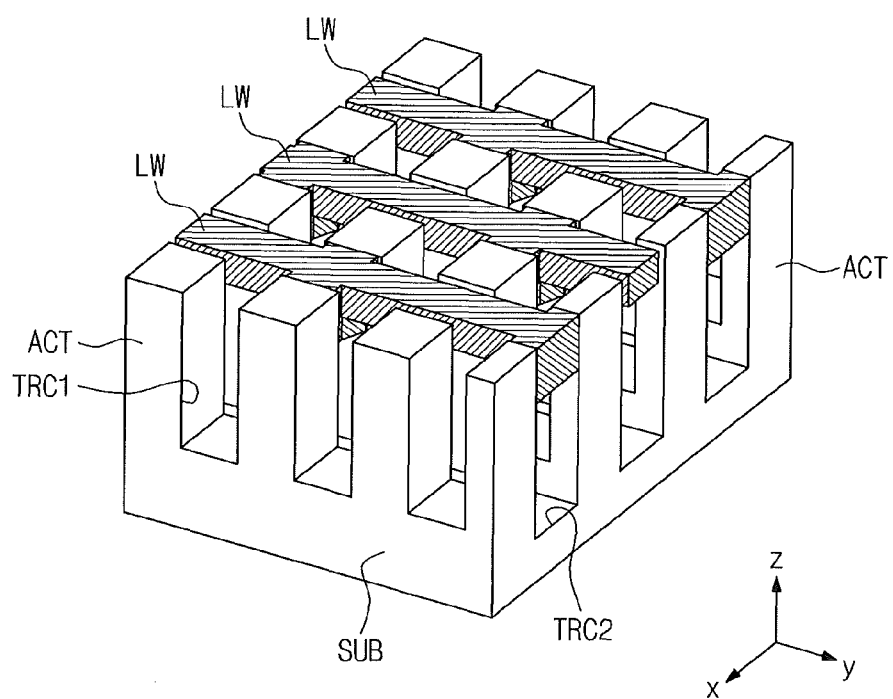
Figure 54:
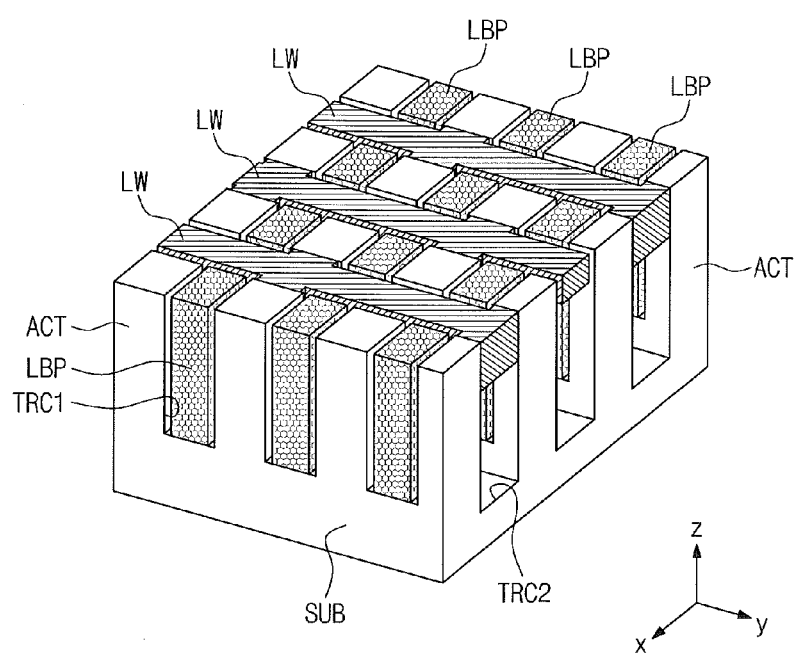
Figure 55:
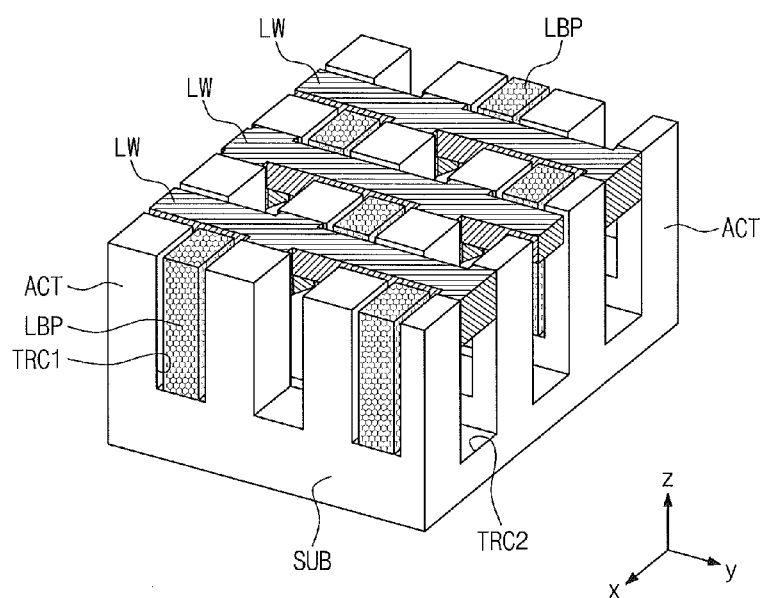

FIGS. 48 to 55 are perspective views illustrating semiconductor devices that may be fabricated through various embodiments according to the technical spirit of the inventive concept. Referring to FIGS. 48 to 52, insulation materials which are not used as a pathway for transmission of electrical signals are omitted. Referring to FIGS. 53 to 55, elements other than active patterns and lower wirings were omitted.

Referring to FIGS. 48 to 52, active patterns ACT are arranged 2-dimensionally on a substrate SUB. According to an embodiment of inventive concept, each of the active patterns ACT may have sidewalls defined by first trenches TRC1 parallel to the x-direction and second trenches TRC2 crossing the first trenches TRC1. That is, the active patterns ACT are disposed in regions between the first and second trenches TRC1 and TRC2.

The active patterns ACT may be a semiconductor material extended from the substrate SUB, and each of the active patterns ACT includes an upper impurity region UIR and a lower impurity region LIR which are vertically spaced apart from each other inside the active pattern ACT. According to an embodiment of the inventive concept, the upper impurity region UIR and the lower impurity region LIR are used as a first region R1 and a third region R3, respectively, described with reference to FIG. 1, and a region between the first and third regions R1 and R3 is used as a second region R2. That is, the upper and lower impurity regions UIR and LIR may be a different conductive type from the substrate SUB, and the region between the upper and lower impurity regions UIR and LIR (that is, the second region R2) may have the same conductive type as the substrate SUB or may be an intrinsic semiconductor.

According to an embodiment of the inventive concept, each of the active patterns ACT may be formed in a pillar shape. Accordingly, the center points of the first to the third regions R1, R2 and R3 may have the same x- and y-coordinates. In other words, the center points may be positioned on a line vertical to the upper surface of the substrate SUB.

Bypass patterns BPP and gate patterns GP are disposed in regions which are included in the first trenches TRC1 but not included in the second trenches TRC2. That is, in the positions of center points, the bypass patterns BPP and the gate patterns GP may have the same x-coordinate as the active patterns ACT, but different y-coordinates from the active patterns ACT. In other words, the bypass patterns BPP and the gate patterns GP may be disposed in a space between the second trenches TRC2 or between the lower wirings LW and between the active patterns ACT.

According to an embodiment, as illustrated in FIGS. 48 to 52, each of the bypass patterns BPP may include a lower bypass pattern LBP and an upper bypass pattern UBP. The lower bypass pattern LBP contacts the substrate SUB through the bottom surface of the first trench TRC1, and the upper bypass pattern UBP directly contacts a sidewall of the active pattern ACT (more specifically, the second region R2) defined by the upper surface of the lower bypass pattern LBP and the first trench TRC1. In an embodiment, the lower bypass pattern LBP may be formed of a material that may be ohmically connected to the substrate SUB, and the upper bypass pattern UBP may be formed of a material that may be ohmically connected to the lower bypass pattern LBP and the active pattern ACT. Accordingly, the second region of the active pattern ACT is connected through the lower bypass pattern and the upper bypass pattern to the substrate SUB.

According to an embodiment, the lower bypass pattern LBP and the upper bypass pattern UBP may be formed of a semiconductor material (for example, single crystalline or polycrystalline silicon) having the same conductive type as some regions of the substrate SUB. According to an embodiment, at least one of the lower bypass pattern LBP or the upper bypass pattern UBP may include a metallic material and have a structure that may be ohmically connected to the substrate SUB. For example, at least one of the lower bypass pattern LBP or the upper bypass pattern UBP may include a barrier metal layer contacting the substrate SUB or the active pattern ACT and a conductive layer having lower resistivity than the barrier metal layer. According to an embodiment, the barrier metal layer may be a metal nitride, and the conductive layer may be at least one of metallic materials or silicides.

According to an embodiment of the inventive concept, the gate patterns GP are spaced apart from the active pattern ACT and formed to face a sidewall of the second region R2 of the active pattern ACT. Like the upper bypass pattern UBP, the gate patterns GP are formed to face a sidewall of the active pattern ACT defined by the first trench TRC1. That is, as illustrated in FIGS. 48 to 52, one of both sidewalls of the active pattern ACT defined by the first trenches TRC1 is directly connected to the upper bypass pattern UBP, and the other sidewall faces a sidewall of the gate pattern GP. The gate patterns GP are connected to an upper wiring UW, which are disposed over the gate patterns GP to cross the lower wiring LW.

Figure 33A:
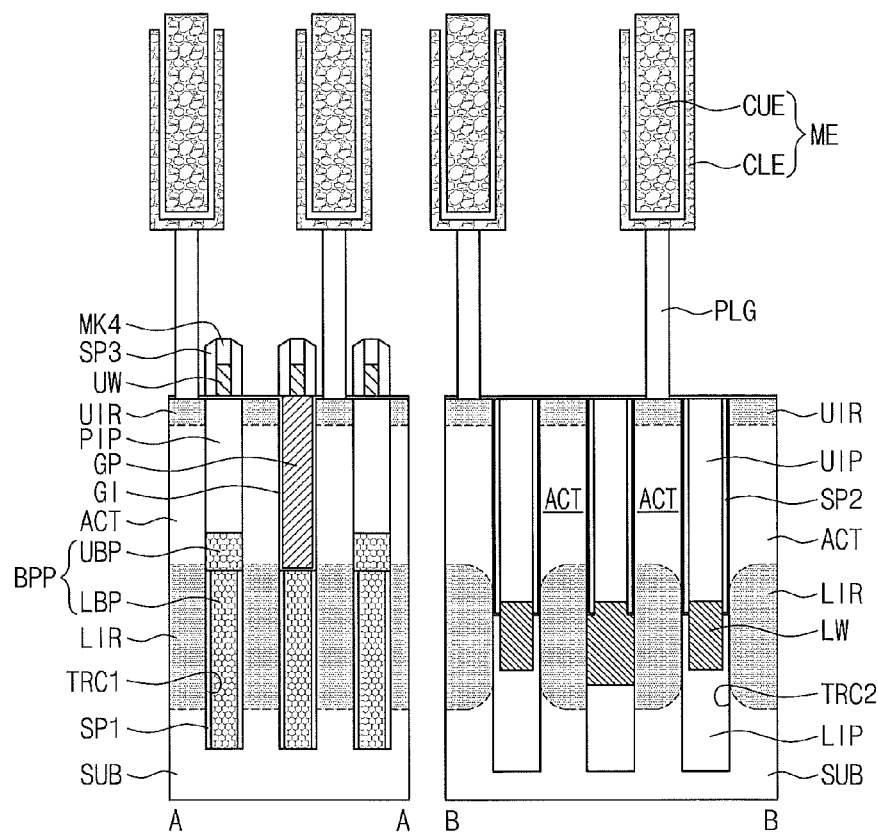
Figure 33A:
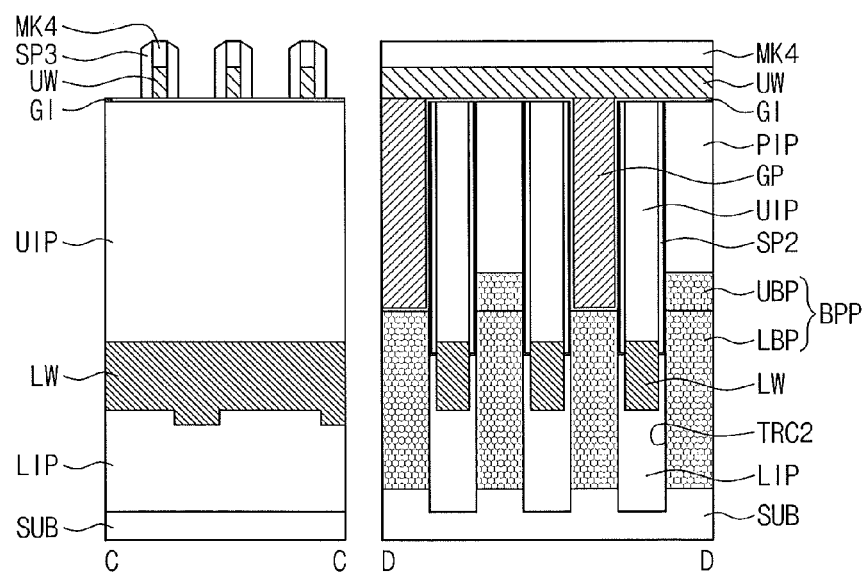
Figure 33B:
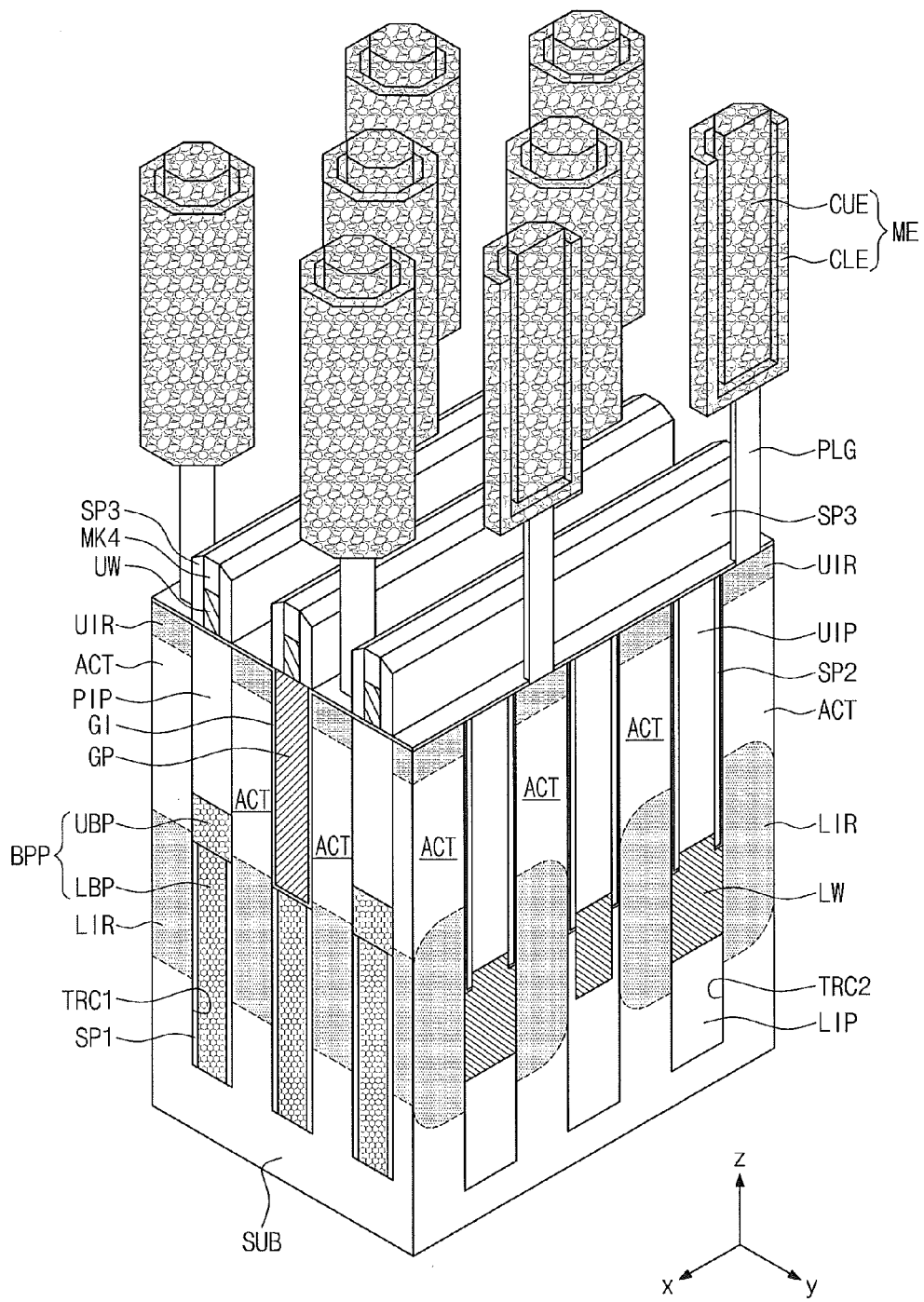

The lower bypass patterns LBP and the gate patterns GP may be formed to be spaced apart from the sidewalls of the active patterns ACT. That is, as illustrated in FIGS. 20, 33B and 47B, a gate insulator GI may be interposed between the gate pattern GP and the active pattern ACT, and a first spacer SP1 may be interposed between the lower bypass pattern LBP and the active pattern ACT.

The first trenches TRC1 which are not included in the second trenches TRC2 are separated by the active patterns ACT. That is, the first trenches TRC1 which are not included in the second trenches TRC2 are arranged 2-dimensionally. In such a planar configuration, the gate patterns GP are formed in some regions of the first trenches TRC1, which are not included in the second trenches TRC2. Likewise, the upper bypass patterns UBP are formed in some of other regions of the first trenches TRC1, which are not included in the second trenches TRC2. In an embodiment, as described with reference to FIGS. 16A and 16B, the upper bypass patterns UBP and the gate patterns GP are disposed in a checkerboard form, and the upper bypass patterns UBP and the gate patterns GP do not overlap each other.

According to an embodiment, as illustrated in FIGS. 48, 49, 51, and 52, the lower bypass patterns LBP may be formed in all of the regions, which are included in the first trenches TRC1, but not included in the second trenches TRC2. In this case, since the lower bypass patterns LBP which are positioned under the gate patterns GP are spaced apart from a sidewall of the active pattern ACT, the lower bypass patterns LBP fail to function as the bypass pattern BPP which connects the second region R2 to the substrate SUB, but function as the gate supporting pattern GSP supporting the gate pattern GP.

Figure 50:
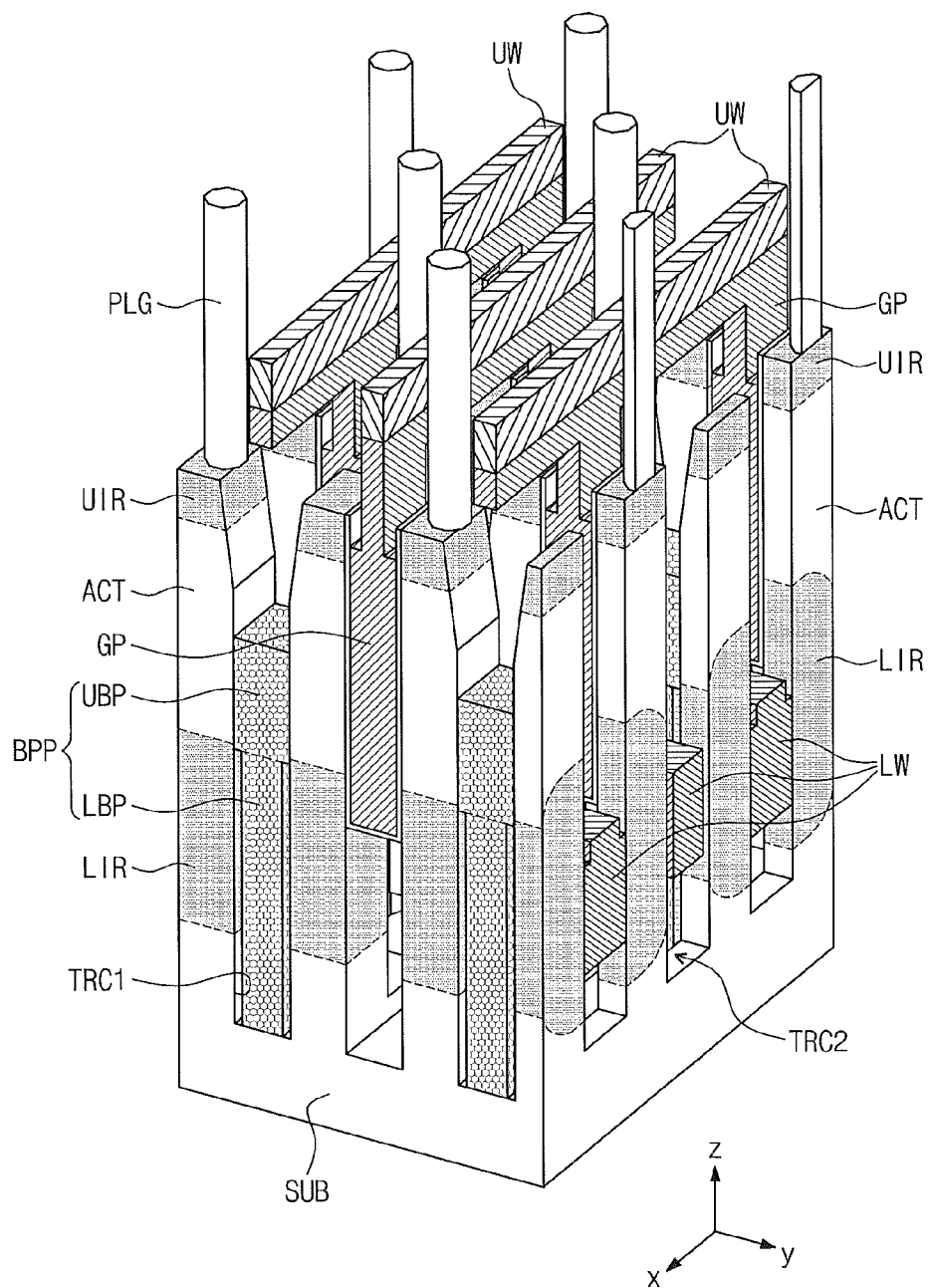
Figure 51:
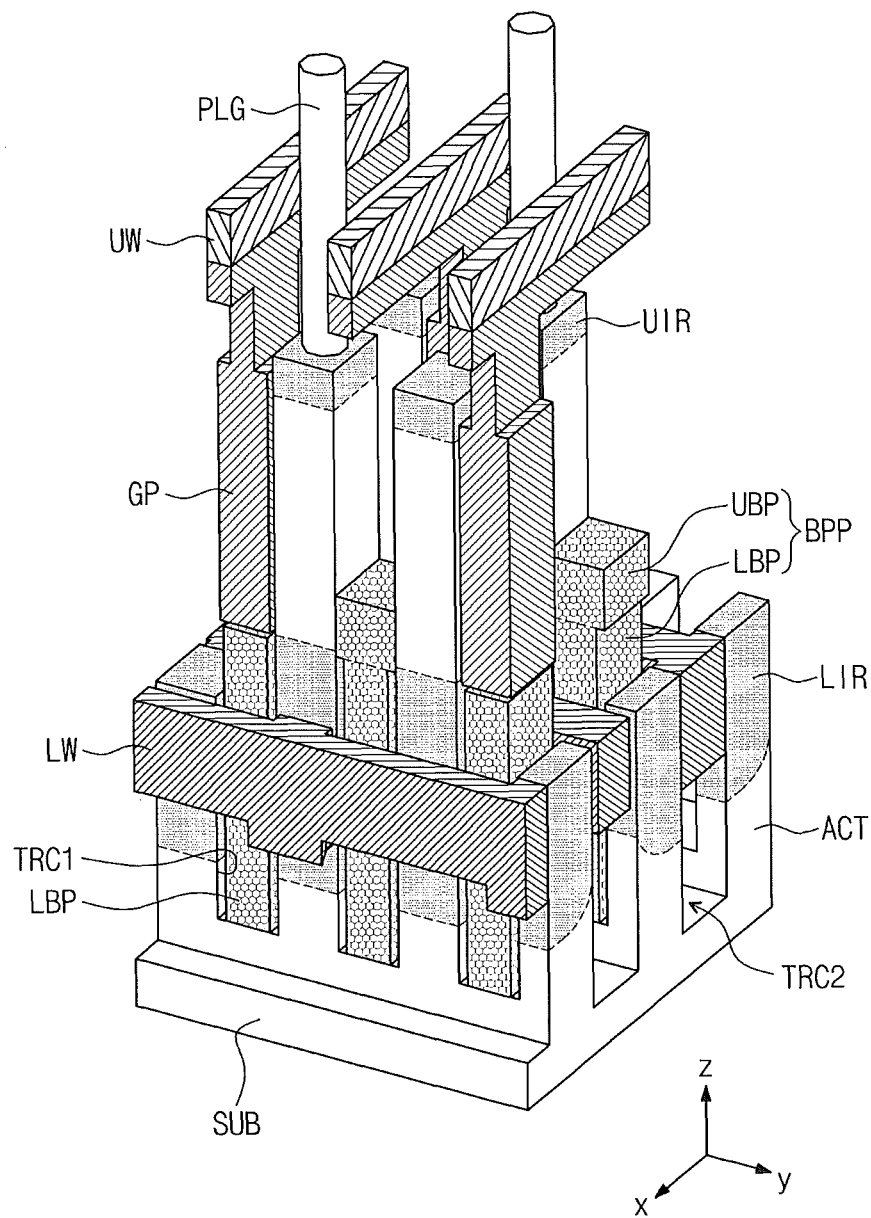
Figure 52:
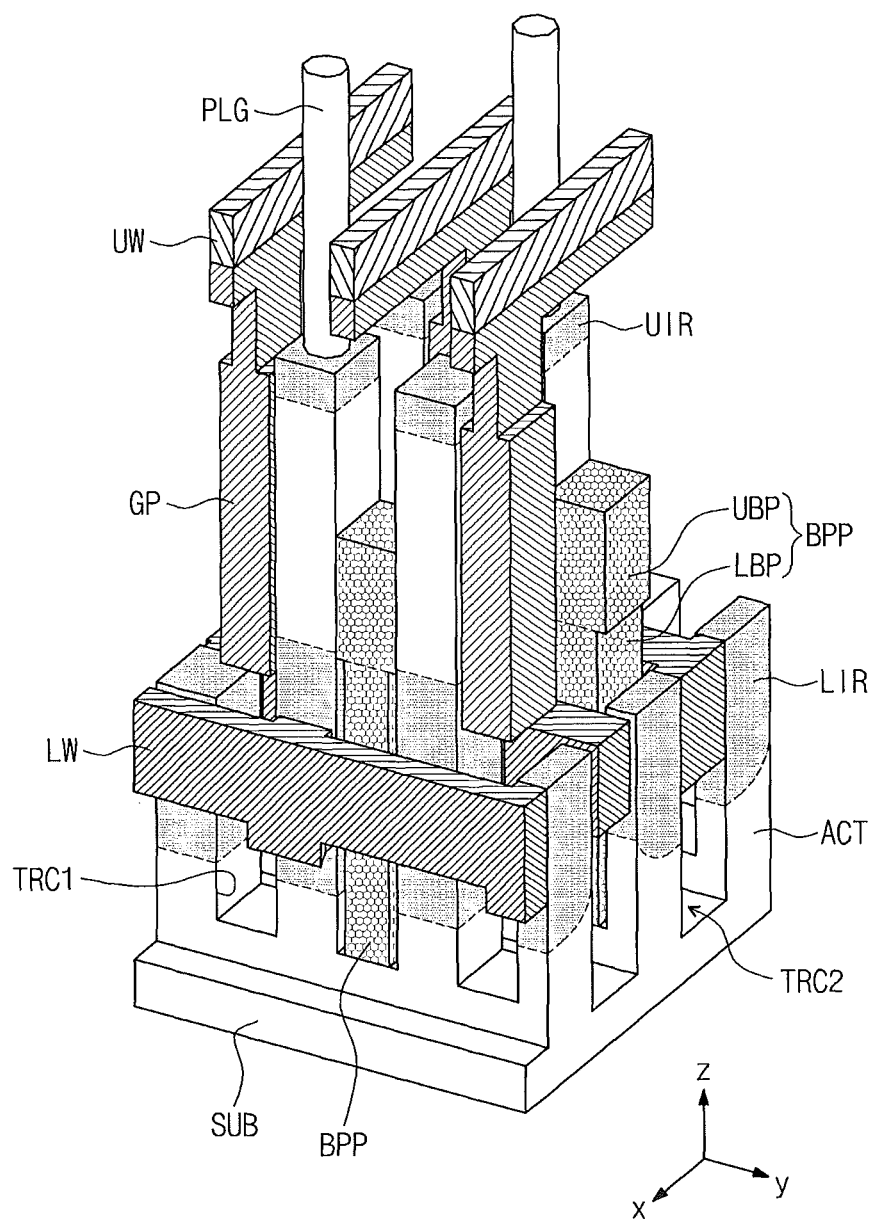

According to an embodiment, the lower bypass patterns LBP may be formed in some of regions which are included in the first trenches TRC1, but not included in the second trenches TRC2. For example, as illustrated in FIG. 50, the lower bypass patterns LBP may be disposed in some regions of the first trenches TRC1, which are not included in the second trenches TRC2 and, in which the gate patterns GP are not disposed.

The lower impurity regions LIR are disposed in the second trench TRC2 to be electrically connected to lower wirings LW crossing the active patterns ACT. As illustrated in FIGS. 53 to 55, the respective active patterns ACT are not all connected to the two lower wirings LW disposed on both sides thereof, but connected to one of them. The electrical connection between the active patterns ACT and the lower wirings LW is determined by positions of the junction defining regions JDR and the undercut regions UCR. FIG. 54 illustrates a connection structure between the active patterns ACT and the lower wirings LW according to the embodiments described above with reference to FIGS. 4 and 24, and FIG. 55 illustrates a connection structure according the embodiment described above with reference to FIG. 34.

Figure 56:
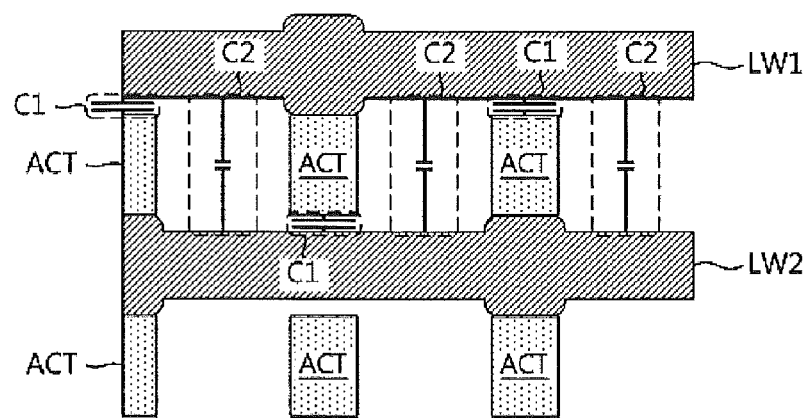
FIGS. 56 and 57 are plan views illustrating electronic devices including a vertical channel transistor according to embodiments of the inventive concept.
Figure 57:
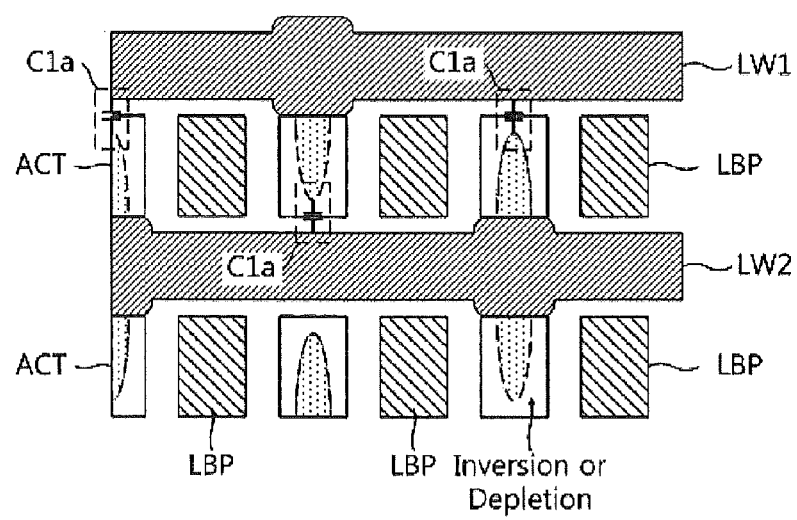

FIGS. 56 and 57 are plan views illustrating electronic devices including a vertical channel transistor according to an embodiment of the inventive concept. FIG. 56 illustrates an embodiment where lower gate patterns are not formed, and FIG. 57 illustrates an embodiment where lower gate patterns are formed between active patterns and between lower wirings. According to the above-described embodiments, since the lower wirings are formed between the active patterns, the two lower wirings LW1 and LW2 adjacent to each other are capacitively coupled and thus parasitic capacitors, which cause data to be disturbed and an operating speed to be decreased, may be formed between the lower wirings LW1 and LW2. For example, as illustrated in FIG. 56, the parasitic capacitors C1 and C2 may be mainly divided into a first parasitic capacitor C1 which is formed between the active pattern ACT and one of the lower wirings LW1 and LW2, and a second parasitic capacitor C2 which is formed between the lower wirings LW1 and LW2. Particularly, the first parasitic capacitors C1 has a short distance between the lower wiring LW and the active pattern ACT is small, and may thus serve as a capacitor having high capacitance.

As illustrated in FIG. 57, when the lower bypass patterns LBP are formed between the active patterns and between the lower wirings, it is possible to relieve data disturbance or decrease in operating speed caused by the parasitic capacitors C1 and C2.

In an embodiment, the lower bypass patterns LBP formed of a material with low resistivity is connected to the substrate SUB, and therefore an electric field between the lower wirings LW may be shielded. Accordingly, the generation of the second parasitic capacitors C2 described with reference to FIG. 56 can be suppressed by the lower bypass patterns LBP serving as a shielding element.

Further, since the lower bypass patterns LBP has the substantially same potential as the substrate SUB, portions of the active pattern ACT adjacent to the lower bypass pattern LBP may be in an inversion or depletion state.

This inversion or depletion state leads to a decrease in a facing area between electrodes of the first parasitic capacitor C1a and an increase in distance between the electrodes. Therefore, the first parasitic capacitor C1a in FIG. 57 may be significantly lower in capacitance than the first parasitic capacitor C1 in FIG. 56.

FIGS. 58 to 62 are perspective views illustrating a method of fabricating a semiconductor device according to an embodiment of the inventive concept.

Figure 58:
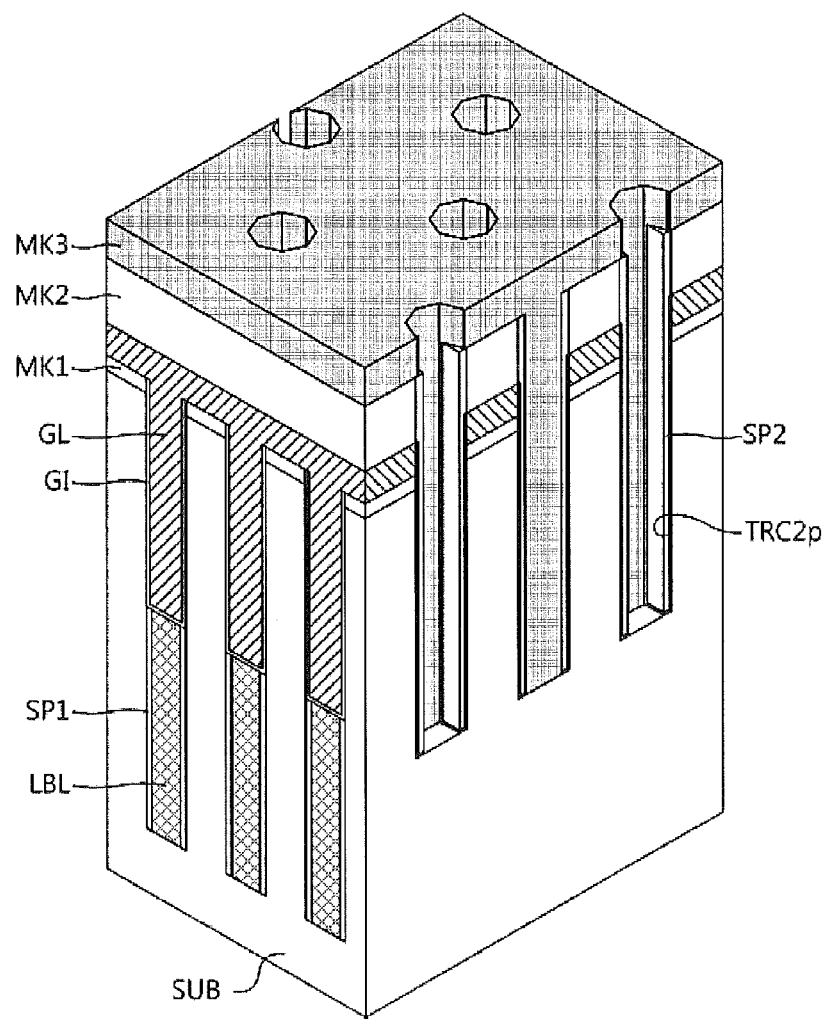
FIGS. 58 to 62 are perspective views illustrating a method of fabricating a semiconductor device according to an embodiment of the inventive concept.
Figure 59:
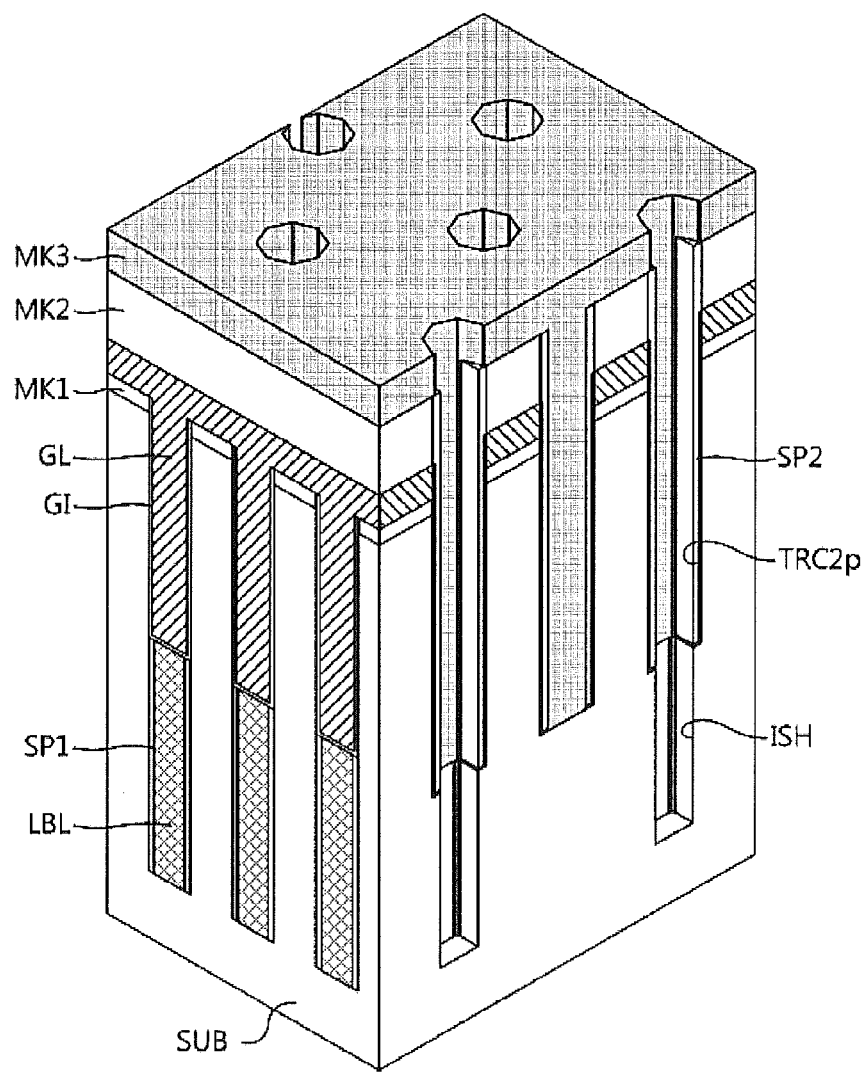

As illustrated in FIG. 58, a third mask pattern MK3 having 2-dimensionally arranged holes is formed on the resultant structure descried with reference to FIGS. 9A and 9B, and the substrate SUB is then etched using the third mask pattern MK3 as an etch mask to thereby form isolation holes ISH under the holes, as illustrated in FIG. 59.

Figure 60:
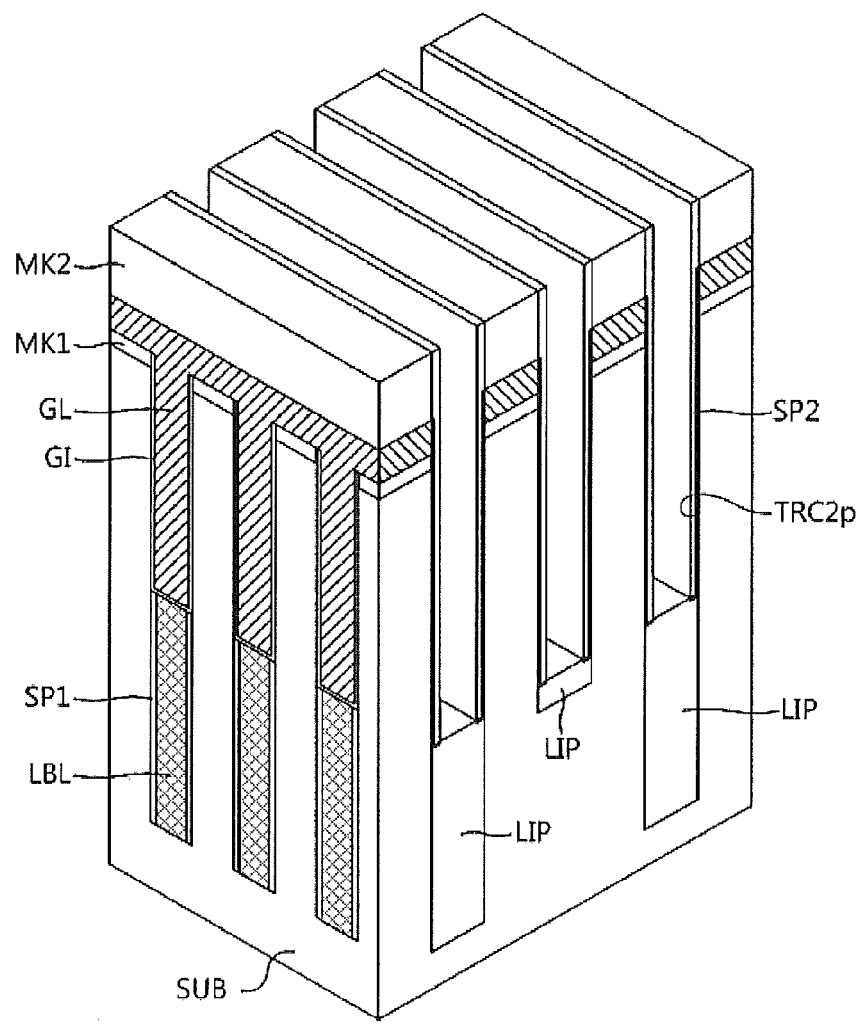

Thereafter, as illustrated in FIG. 60, the third mask pattern MK3 is removed, and a lower insulation pattern LIP is then formed to cover the exposed surface of the substrate SUB. The forming of the lower insulation pattern LIP may be performed using the method described with reference to FIGS. 11A and 11B, and resultantly the lower insulation pattern LIP may be formed to fill the isolation holes ISH.

Figure 61:
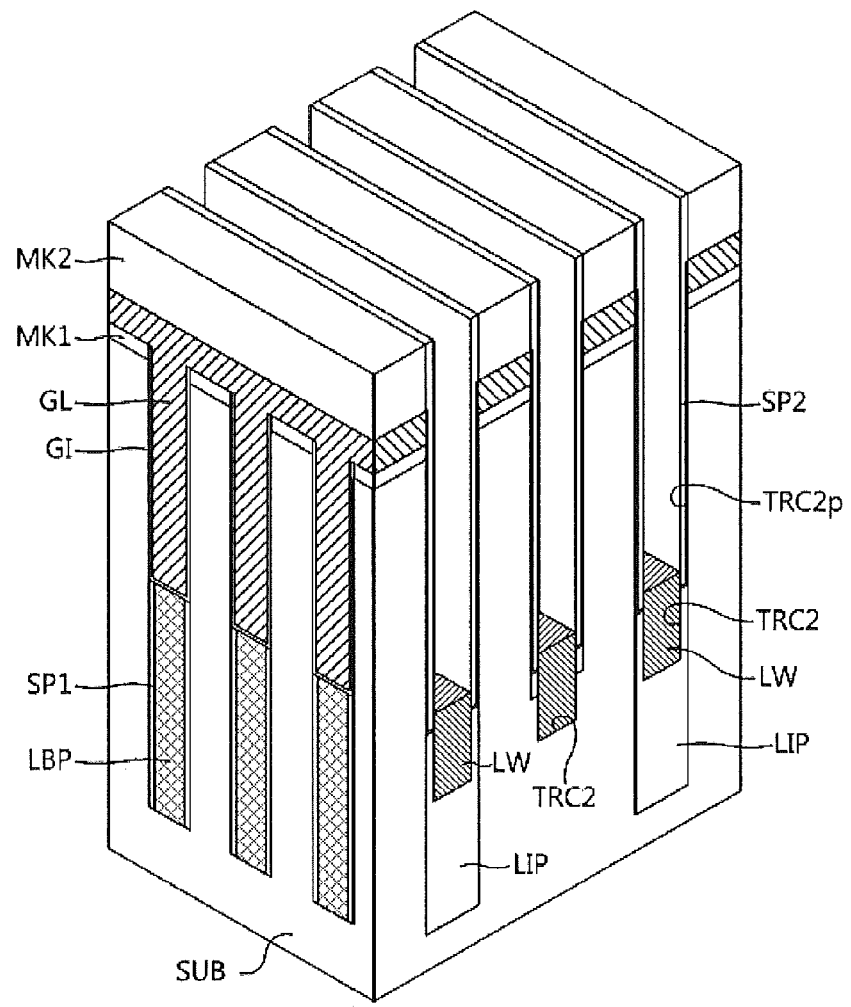

Afterwards, bottom surfaces of the preliminary trenches TRC2p are recessed using the second mask pattern MK2 and the second spacer SP2 as an etch mask. Accordingly, as illustrated in FIG. 61, a second trench TRC2 crossing the active patterns ACT is formed. Lower impurity regions LIR and lower wirings LW are formed using the fabrication method described with reference to FIGS. 15A and 15B. Subsequently, the fabrication processes described with reference to FIGS. 16A to 20A are performed. FIG. 62 exemplarily illustrates a semiconductor device on which theses processes are completely performed.

Figure 63:
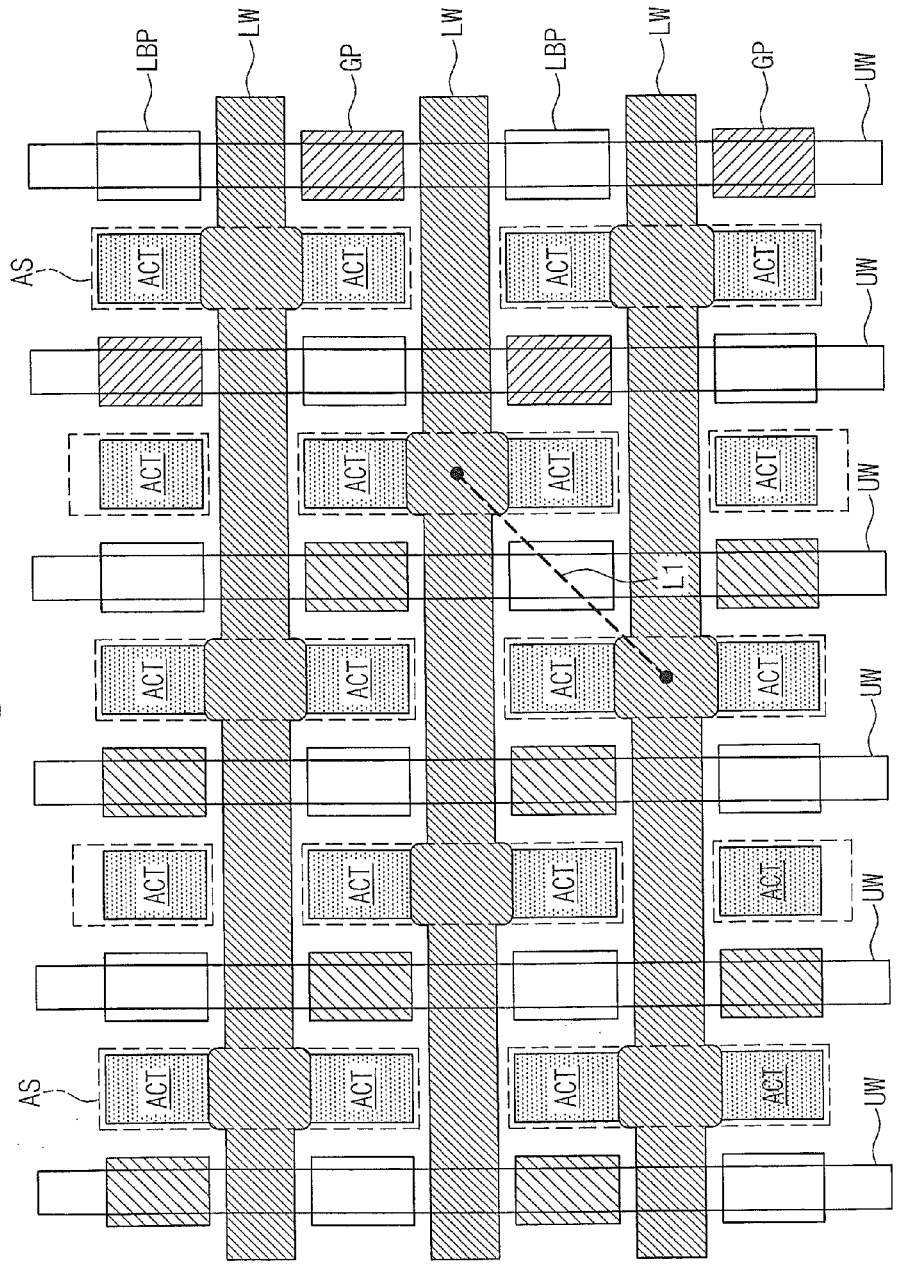
FIGS. 63 and 64 are respectively plan view and perspective view of a semiconductor device fabricated according to the embodiment described with reference to FIGS. 58 to 62.
Figure 64:
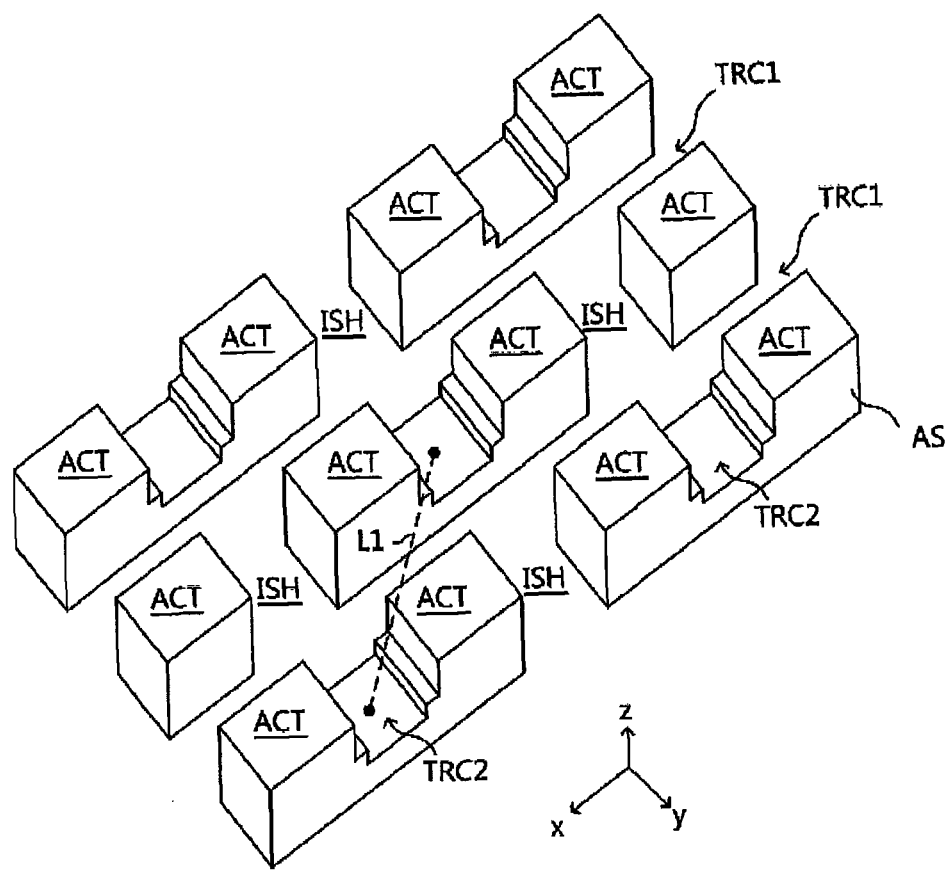

FIGS. 63 and 64 are plan view and perspective view of the semiconductor device according to the embodiment described with reference to FIGS. 58 to 62.

As illustrated in FIGS. 63 and 64, the active patterns may constitute a plurality of active structures AS of which each may include a pair of active patterns ACT formed at both sides of the second trench TRC2. The active structure AS is provided with one pair of sidewalls defined by the first trenches TRC1 and the other pair of sidewalls defined by the isolation holes ISH. The isolation holes ISH are formed in a shape shown in FIG. 59, and thus the active structures AS has an offset arrangement. That is, line L1 connecting the center points of two active structures AS which are adjacent to each other and have different y-coordinates may not be parallel to both of y-axis and x-axis (in other words, both of the upper and lower wirings UW and LW).

Figure 65:
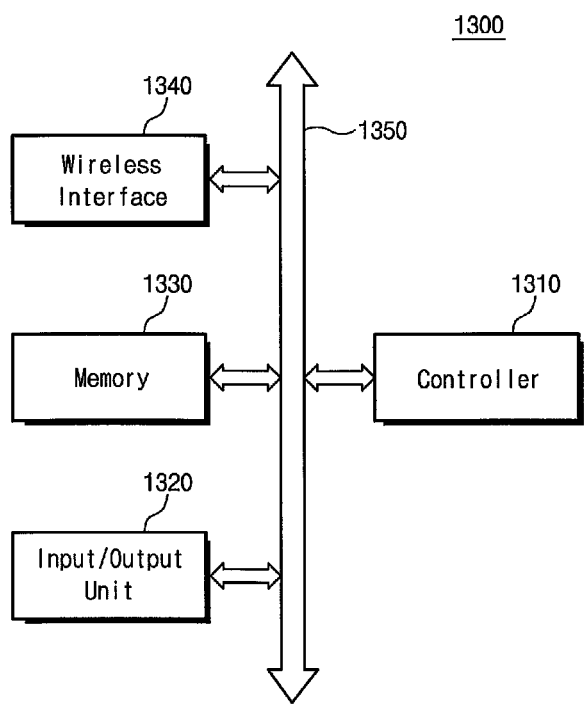
FIGS. 65 and 66 are block diagrams schematically illustrating electronic devices including a vertical channel transistor according to embodiments of the inventive concept.
Figure 66:
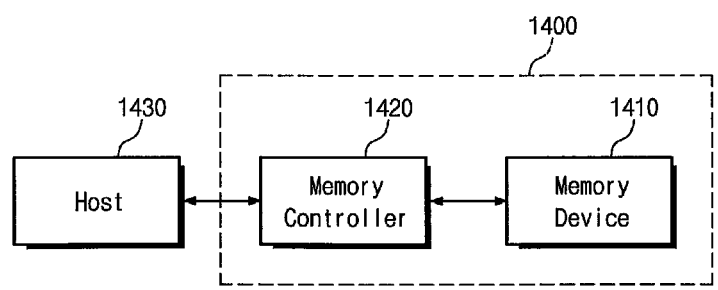

FIGS. 65 and 66 are block diagrams schematically illustrating electronic devices including a vertical channel transistor according to embodiments of the inventive concept.

Referring to FIG. 65, an electronic device 1300 including a vertical channel transistor according to embodiments of the inventive concept may be one of a personal digital assistant (PDA), a laptop computer, a portable computer, a web tablet, a wireless phone, a mobile phone, a digital music player, a wire/wireless electronic device, and a complex electronic device having at least two thereof. The electronic device 1300 may include a controller 1310, an input/output (I/O) unit 1320 such as a keypad, keyboard and a display, a memory 1330, and a wireless interface 1340, which are connected to each other through a bus 1350. The controller 1310 may include, for example, one or more microprocessors, a digital signal processor, a micro-controller, or others similar thereto. The memory 1330, for example, may be used to store a command executed by the controller 1310. The memory 1330 may be used to store user data. The memory 1330 includes a vertical channel transistor according to embodiments of the inventive concept. The electronic device 1300 may use a wireless interface 1340 in order to transmit data to a wireless communication network performing communication using an RF signal or receive data from a network. For example, the wireless interface 1340 may include an antenna, a wireless transceiver, or the like. The electronic device 1300 may be used in a communication interface protocol such as third generation communication system (e.g., CDMA, GSM, NADC, E-TDMA, WCDMA, CDMA2000).

Referring to FIG. 66, semiconductor memory devices according to embodiments of the inventive concept may be used to realize a memory system. The memory system 1400 may include a memory device for storing massive data, and a memory controller 1420. The memory controller 1420 controls stored data to be read from the memory device 1410 or data to be written to the memory device 1410 in response to a read or write request of a host 1430. The memory controller 1420 may constitute an address mapping table for mapping an address provided from the host 1430 such as a mobile apparatus or a computer system onto a physical address. The memory device 1410 may include a vertical channel transistor according to embodiments of the inventive concept.

According to embodiments of the inventive concept, a channel region of a vertical channel transistor is electrically connected to a substrate of the same conductive type as the channel region through a bypass pattern formed between active patterns. The bypass pattern is formed of a conductive material that may be ohmically connected to the channel region or the substrate. Accordingly, the floating body phenomenon can be prevented in the channel region.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method of forming a semiconductor memory device, the method comprising:

forming a first trench and a second trench having substantially a same configuration in a semiconductor substrate, the first and second trenches disposed next to each other and extending in a first direction;

forming a first gate pattern in the first trench and a second gate pattern in the second trench;

forming a third gate pattern on the first gate pattern and in the first trench;

forming a third trench across the first trench in a second direction that is substantially perpendicular to the first direction;

forming a bit line in the third trench;

forming a fourth gate pattern on the second gate pattern;

forming a plug insulation pattern on the fourth gate pattern and in the second trench; and forming a word line on the third gate pattern.

2. The method of claim 1, further comprising forming a memory element on a semiconductor pillar disposed between the first trench and the second trench, the semiconductor pillar having an active region between the third gate pattern and the fourth gate pattern.

3. The method of claim 1, further comprising forming a first insulating layer on a sidewall of the first trench prior to forming the first gate pattern.

4. The method of claim 3, further comprising forming a second insulating layer on a lower sidewall of the second trench prior to forming the second gate pattern.

5. The method of claim 4, further comprising forming a third insulating layer on an upper sidewall of the second trench and on a top surface of the first gate pattern prior to forming the third gate pattern.

6. The method of claim 1, wherein the fourth gate pattern directly contacts the active region of the semiconductor pillar.

7. The method of claim 1, wherein the memory element comprises a capacitor.

8. The method of claim 1, further comprising, prior to forming the bit line, forming a lower insulation pattern in the third trench.

9. The method of claim 8, further comprising, prior to forming the bit line, performing an operation of doping in the semiconductor pillar under the active region.

10. The method of claim 9, wherein the operation of doping is performed using impurities having a conductivity type different from a conductivity type of the semiconductor substrate.

* * * * *